United States Patent
Gupta et al.

(10) Patent No.: US 10,809,847 B2
(45) Date of Patent: Oct. 20, 2020

(54) IN-CELL TOUCH FOR LED

(71) Applicant: Apple Inc., Cupertino, CA (US)

(72) Inventors: Vasudha Gupta, Cupertino, CA (US); Shih Chang Chang, Cupertino, CA (US); Young-Bae Park, San Jose, CA (US); Ting-Kuo Chang, Hsinchu (TW)

(73) Assignee: Apple Inc., Cupertino, CA (US)

( * ) Notice: Subject to any disclaimer, the term of this patent is extended or adjusted under 35 U.S.C. 154(b) by 158 days.

(21) Appl. No.: 16/030,654

(22) Filed: Jul. 9, 2018

(65) Prior Publication Data

US 2018/0314385 A1 Nov. 1, 2018

Related U.S. Application Data

(63) Continuation of application No. 15/148,798, filed on May 6, 2016, now Pat. No. 10,019,103, which is a continuation of application No. 13/766,376, filed on Feb. 13, 2013, now Pat. No. 9,336,723.

(51) Int. Cl.
*G06F 3/041* (2006.01)
*G06F 3/044* (2006.01)
*G09G 3/3208* (2016.01)
*G09G 3/3233* (2016.01)
(Continued)

(52) U.S. Cl.
CPC ............ *G06F 3/0416* (2013.01); *G06F 3/044* (2013.01); *G06F 3/0412* (2013.01); *G09G 3/3208* (2013.01); *G09G 3/3233* (2013.01); *G09G 3/34* (2013.01); *H01L 27/323* (2013.01);
(Continued)

(58) Field of Classification Search
CPC ...... G06F 3/0416; G06F 3/0412; G06F 3/044; G06F 2203/04103; G09G 3/3208; G09G 3/3233; G09G 3/34; G09G 2300/0861; G09G 2300/0866; H01L 27/323
See application file for complete search history.

(56) References Cited

U.S. PATENT DOCUMENTS

| 4,916,308 A | 4/1990 | Meadows |
| 5,105,186 A | 4/1992 | May |
| 5,483,261 A | 1/1996 | Yasutake |

(Continued)

FOREIGN PATENT DOCUMENTS

| CN | 1202254 A | 12/1998 |
| CN | 1739083 A | 2/2006 |

(Continued)

OTHER PUBLICATIONS

Chinese Search Report dated Mar. 23, 2011, for CN Application No. 2009201531939, with English Translation, 10 pages.
(Continued)

*Primary Examiner* — Temesghen Ghebretinsae
*Assistant Examiner* — Ivelisse Martinez Quiles
(74) *Attorney, Agent, or Firm* — Kubota & Basol LLP

(57) ABSTRACT

A touch screen having touch circuitry integrated into a display pixel stackup. The touch screen can include a transistor layer, an LED layer and a first layer. The first layer can operate as an LED cathode during a display phase and as touch circuitry during a touch sensing phase. The transistor layer can be at least partially utilized for transitioning between the display phase and the touch sensing phase. The touch screen can be fabricated to reduce or eliminate damage to the LED layer.

14 Claims, 42 Drawing Sheets

(51) Int. Cl.
   *G09G 3/34* (2006.01)
   *H01L 27/32* (2006.01)
(52) U.S. Cl.
   CPC .............. *G06F 2203/04103* (2013.01); *G09G 2300/0861* (2013.01); *G09G 2300/0866* (2013.01)

(56) References Cited

U.S. PATENT DOCUMENTS

| | | |
|---|---|---|
| 5,488,204 A | 1/1996 | Mead et al. |
| 5,589,856 A | 12/1996 | Stein et al. |
| 5,606,346 A | 2/1997 | Kai et al. |
| 5,825,352 A | 10/1998 | Bisset et al. |
| 5,835,079 A | 11/1998 | Shieh |
| 5,838,308 A | 11/1998 | Knapp et al. |
| 5,841,427 A | 11/1998 | Teterwak |
| 5,847,690 A | 12/1998 | Boie et al. |
| 5,880,411 A | 3/1999 | Gillespie et al. |
| 5,889,236 A | 3/1999 | Gillespie et al. |
| 5,914,465 A | 6/1999 | Allen et al. |
| 5,923,997 A | 7/1999 | Miyanaga et al. |
| 6,025,647 A | 2/2000 | Shenoy et al. |
| 6,057,903 A | 5/2000 | Colgan et al. |
| 6,177,918 B1 | 1/2001 | Colgan et al. |
| 6,188,391 B1 | 2/2001 | Seely et al. |
| 6,204,897 B1 | 3/2001 | Colgan et al. |
| 6,310,610 B1 | 10/2001 | Beaton et al. |
| 6,323,846 B1 | 11/2001 | Westerman et al. |
| 6,380,931 B1 | 4/2002 | Gillespie et al. |
| 6,483,498 B1 | 11/2002 | Colgan et al. |
| 6,501,529 B1 | 12/2002 | Kurihara et al. |
| 6,586,101 B2 | 7/2003 | Chu |
| 6,587,358 B1 | 7/2003 | Yasumura |
| 6,680,448 B2 | 1/2004 | Kawashima et al. |
| 6,690,387 B2 | 2/2004 | Zimmerman et al. |
| 6,778,163 B2 | 8/2004 | Ozawa |
| 6,844,673 B1 * | 1/2005 | Bernkopf ............. H01L 27/3253 313/498 |
| 6,847,354 B2 | 1/2005 | Vranish |
| 6,914,640 B2 | 7/2005 | Yu |
| 7,015,894 B2 | 3/2006 | Morohoshi |
| 7,042,444 B2 | 5/2006 | Cok |
| 7,133,032 B2 | 11/2006 | Cok |
| 7,184,026 B2 | 2/2007 | Gordon et al. |
| 7,184,064 B2 | 2/2007 | Zimmerman et al. |
| 7,202,856 B2 | 4/2007 | Cok |
| 7,230,608 B2 | 6/2007 | Cok |
| 7,280,167 B2 | 10/2007 | Choi et al. |
| 7,379,054 B2 | 5/2008 | Lee |
| 7,482,187 B2 | 1/2009 | Shibusawa |
| 7,605,864 B2 | 10/2009 | Takahashi et al. |
| 7,663,607 B2 | 2/2010 | Hotelling et al. |
| 7,701,539 B2 | 4/2010 | Shih et al. |
| 7,705,834 B2 | 4/2010 | Swedin |
| 7,859,521 B2 | 12/2010 | Hotelling et al. |
| 7,880,703 B2 | 2/2011 | Park et al. |
| 7,898,122 B2 | 3/2011 | Andrieux et al. |
| 7,995,041 B2 | 8/2011 | Chang |
| 8,149,002 B2 | 4/2012 | Ossart et al. |
| 8,217,913 B2 | 7/2012 | Hotelling et al. |
| 8,264,428 B2 | 9/2012 | Nam |
| 8,355,887 B1 | 1/2013 | Harding et al. |
| 8,363,027 B2 | 1/2013 | Hotelling et al. |
| 8,390,582 B2 | 3/2013 | Hotelling et al. |
| 8,479,122 B2 | 7/2013 | Hotelling et al. |
| 8,502,799 B2 | 8/2013 | Hotelling et al. |
| 8,508,495 B2 | 8/2013 | Hotelling et al. |
| 8,525,756 B2 | 9/2013 | Kwon |
| 8,552,994 B2 | 10/2013 | Simmons |
| 8,576,161 B2 | 11/2013 | Chang et al. |
| 8,654,083 B2 | 2/2014 | Hotelling et al. |
| 8,665,237 B2 | 3/2014 | Koshiyama et al. |
| 8,743,087 B2 | 6/2014 | Hotelling et al. |
| 8,760,412 B2 | 6/2014 | Hotelling et al. |
| 8,766,950 B1 | 7/2014 | Morein et al. |
| 8,773,351 B2 | 7/2014 | Rekimoto |
| 8,773,397 B2 | 7/2014 | Hotelling et al. |
| 8,890,850 B2 | 11/2014 | Chung et al. |
| 8,917,256 B2 | 12/2014 | Roziere |
| 8,922,521 B2 | 12/2014 | Hotelling et al. |
| 9,000,782 B2 | 4/2015 | Roziere |
| 9,024,913 B1 | 5/2015 | Jung et al. |
| 9,075,490 B2 | 7/2015 | Hotelling et al. |
| 9,117,679 B2 | 8/2015 | Ma |
| 9,134,560 B2 | 9/2015 | Hotelling et al. |
| 9,151,791 B2 | 10/2015 | Roziere |
| 9,250,757 B2 | 2/2016 | Roziere |
| 9,268,427 B2 | 2/2016 | Yousefpor et al. |
| 9,336,723 B2 | 5/2016 | Gupta et al. |
| 9,354,761 B2 | 5/2016 | Hotelling et al. |
| 9,423,897 B2 | 8/2016 | Bae |
| 9,442,330 B2 | 9/2016 | Huo |
| 9,448,675 B2 | 9/2016 | Morein et al. |
| 9,535,547 B2 | 1/2017 | Roziere |
| 9,640,991 B2 | 5/2017 | Blondin et al. |
| 9,690,397 B2 | 6/2017 | Shepelev et al. |
| 9,760,200 B2 | 9/2017 | Hotelling et al. |
| 9,857,925 B2 | 1/2018 | Morein et al. |
| 9,996,175 B2 | 6/2018 | Hotelling et al. |
| 10,007,388 B2 | 6/2018 | Roziere |
| 10,120,520 B2 | 11/2018 | Krah et al. |
| 10,133,382 B2 | 11/2018 | Yang et al. |
| 10,209,813 B2 | 2/2019 | Yao |
| 10,386,962 B1 | 8/2019 | Jin et al. |
| 10,459,587 B2 | 10/2019 | Krah et al. |
| 2001/0040665 A1 | 11/2001 | Ahn |
| 2002/0015024 A1 | 2/2002 | Westerman et al. |
| 2002/0084992 A1 | 7/2002 | Agnew |
| 2003/0075427 A1 | 4/2003 | Caldwell |
| 2003/0234769 A1 | 12/2003 | Cross et al. |
| 2004/0140993 A1 | 7/2004 | Geaghan et al. |
| 2004/0141096 A1 | 7/2004 | Mai |
| 2004/0189587 A1 | 9/2004 | Jung et al. |
| 2004/0239650 A1 | 12/2004 | Mackey |
| 2004/0241920 A1 | 12/2004 | Hsiao et al. |
| 2004/0243747 A1 | 12/2004 | Rekimoto |
| 2005/0052582 A1 | 3/2005 | Mai |
| 2005/0179668 A1 | 8/2005 | Edwards |
| 2005/0219228 A1 | 10/2005 | Alameh et al. |
| 2005/0231487 A1 | 10/2005 | Ming |
| 2005/0243023 A1 | 11/2005 | Reddy et al. |
| 2006/0007165 A1 | 1/2006 | Yang et al. |
| 2006/0026521 A1 | 2/2006 | Hotelling et al. |
| 2006/0097991 A1 | 5/2006 | Hotelling et al. |
| 2006/0097992 A1 | 5/2006 | Gitzinger et al. |
| 2006/0109222 A1 | 5/2006 | Lee et al. |
| 2006/0145365 A1 | 7/2006 | Halls et al. |
| 2006/0146033 A1 | 7/2006 | Chen et al. |
| 2006/0146034 A1 | 7/2006 | Chen et al. |
| 2006/0161871 A1 | 7/2006 | Hotelling et al. |
| 2006/0197753 A1 | 9/2006 | Hotelling |
| 2006/0220033 A1 | 10/2006 | Yamasaki |
| 2006/0244736 A1 | 11/2006 | Tseng |
| 2006/0262100 A1 | 11/2006 | Van Berkel |
| 2006/0284639 A1 | 12/2006 | Reynolds |
| 2007/0018969 A1 | 1/2007 | Chen et al. |
| 2007/0040814 A1 | 2/2007 | Lee et al. |
| 2007/0075977 A1 | 4/2007 | Chen et al. |
| 2007/0165009 A1 | 7/2007 | Sakurai et al. |
| 2007/0176905 A1 | 8/2007 | Shih et al. |
| 2007/0216657 A1 | 9/2007 | Konicek |
| 2007/0222762 A1 | 9/2007 | Van Delden et al. |
| 2007/0240914 A1 | 10/2007 | Lai et al. |
| 2007/0252801 A1 | 11/2007 | Park et al. |
| 2007/0262967 A1 | 11/2007 | Rho |
| 2007/0279395 A1 | 12/2007 | Philipp et al. |
| 2008/0007533 A1 | 1/2008 | Hotelling |
| 2008/0012835 A1 | 1/2008 | Rimon et al. |
| 2008/0018581 A1 | 1/2008 | Park et al. |
| 2008/0042985 A1 | 2/2008 | Katsuhito et al. |
| 2008/0048994 A1 | 2/2008 | Lee et al. |
| 2008/0055221 A1 | 3/2008 | Yabuta et al. |
| 2008/0055268 A1 | 3/2008 | Yoo et al. |
| 2008/0061800 A1 | 3/2008 | Reynolds et al. |

(56) References Cited

U.S. PATENT DOCUMENTS

| | | |
|---|---|---|
| 2008/0062139 A1 | 3/2008 | Hotelling et al. |
| 2008/0062140 A1 | 3/2008 | Hotelling et al. |
| 2008/0062147 A1 | 3/2008 | Hotelling et al. |
| 2008/0062148 A1 | 3/2008 | Hotelling et al. |
| 2008/0067528 A1 | 3/2008 | Choi et al. |
| 2008/0074401 A1 | 3/2008 | Chung et al. |
| 2008/0100572 A1 | 5/2008 | Boillot |
| 2008/0122800 A1 | 5/2008 | Meng |
| 2008/0129898 A1 | 6/2008 | Moon |
| 2008/0136980 A1 | 6/2008 | Rho et al. |
| 2008/0142281 A1 | 6/2008 | Geaghan |
| 2008/0150901 A1 | 6/2008 | Lowles et al. |
| 2008/0158118 A1 | 7/2008 | Ono et al. |
| 2008/0174321 A1 | 7/2008 | Kang et al. |
| 2008/0180365 A1 | 7/2008 | Ozaki |
| 2008/0186288 A1 | 8/2008 | Chang |
| 2008/0195180 A1 | 8/2008 | Stevenson et al. |
| 2008/0218488 A1 | 9/2008 | Yang et al. |
| 2008/0224962 A1 | 9/2008 | Kasai et al. |
| 2008/0231292 A1 | 9/2008 | Ossart et al. |
| 2008/0246496 A1 | 10/2008 | Hristov et al. |
| 2008/0273000 A1 | 11/2008 | Park et al. |
| 2008/0278178 A1 | 11/2008 | Philipp |
| 2008/0278458 A1 | 11/2008 | Masuzawa et al. |
| 2008/0303964 A1 | 12/2008 | Lee et al. |
| 2008/0309627 A1 | 12/2008 | Hotelling et al. |
| 2008/0309631 A1 | 12/2008 | Westerman |
| 2009/0002331 A1 | 1/2009 | Kamiya et al. |
| 2009/0009485 A1 | 1/2009 | Bytheway |
| 2009/0009486 A1 | 1/2009 | Sato et al. |
| 2009/0091546 A1 | 4/2009 | Joo et al. |
| 2009/0096760 A1 | 4/2009 | Ma et al. |
| 2009/0109192 A1 | 4/2009 | Liu |
| 2009/0141046 A1 | 6/2009 | Rathnam et al. |
| 2009/0179868 A1 | 7/2009 | Ayres et al. |
| 2009/0194344 A1 | 8/2009 | Harley et al. |
| 2009/0212642 A1 | 8/2009 | Krah |
| 2009/0237369 A1 | 9/2009 | Hur et al. |
| 2009/0238012 A1 | 9/2009 | Tatapudi et al. |
| 2009/0309851 A1 | 12/2009 | Bernstein |
| 2009/0322730 A1 | 12/2009 | Yamamoto et al. |
| 2010/0001973 A1 | 1/2010 | Hotelling et al. |
| 2010/0004029 A1 | 1/2010 | Kim |
| 2010/0007616 A1 | 1/2010 | Jang |
| 2010/0013745 A1 | 1/2010 | Kim et al. |
| 2010/0019779 A1 | 1/2010 | Kato et al. |
| 2010/0031174 A1 | 2/2010 | Kim |
| 2010/0045632 A1 | 2/2010 | Yilmaz et al. |
| 2010/0090964 A1 | 4/2010 | Soo et al. |
| 2010/0097346 A1 | 4/2010 | Sleeman |
| 2010/0123667 A1 | 5/2010 | Kim et al. |
| 2010/0139991 A1 | 6/2010 | Philipp et al. |
| 2010/0149127 A1 | 6/2010 | Fisher et al. |
| 2010/0182018 A1 | 7/2010 | Hazelden |
| 2010/0182278 A1 | 7/2010 | Li et al. |
| 2010/0194697 A1 | 8/2010 | Hotelling et al. |
| 2010/0194699 A1 | 8/2010 | Chang |
| 2010/0194707 A1 | 8/2010 | Hotelling et al. |
| 2010/0201635 A1 | 8/2010 | Klinghult et al. |
| 2010/0253638 A1 | 10/2010 | Yousefpor et al. |
| 2010/0259503 A1 | 10/2010 | Yanase et al. |
| 2010/0265187 A1 | 10/2010 | Chang et al. |
| 2010/0265188 A1* | 10/2010 | Chang .................. G06F 3/044 345/173 |
| 2010/0277418 A1 | 11/2010 | Huang |
| 2010/0321305 A1 | 12/2010 | Chang et al. |
| 2010/0328262 A1 | 12/2010 | Huang et al. |
| 2010/0328263 A1 | 12/2010 | Lin |
| 2011/0001491 A1 | 1/2011 | Huang et al. |
| 2011/0006999 A1 | 1/2011 | Chang et al. |
| 2011/0007021 A1 | 1/2011 | Bernstein et al. |
| 2011/0007030 A1 | 1/2011 | Mo et al. |
| 2011/0025623 A1 | 2/2011 | Lin |
| 2011/0025635 A1 | 2/2011 | Lee |
| 2011/0061949 A1 | 3/2011 | Krah et al. |
| 2011/0074705 A1 | 3/2011 | Yousefpor et al. |
| 2011/0080391 A1 | 4/2011 | Brown et al. |
| 2011/0157093 A1 | 6/2011 | Bita et al. |
| 2011/0169783 A1 | 7/2011 | Wang et al. |
| 2011/0210941 A1 | 9/2011 | Reynolds et al. |
| 2011/0228187 A1 | 9/2011 | Wu et al. |
| 2011/0242027 A1 | 10/2011 | Chang |
| 2011/0254795 A1 | 10/2011 | Chen et al. |
| 2011/0298727 A1 | 12/2011 | Yousefpor et al. |
| 2012/0026132 A1 | 2/2012 | Hotelling et al. |
| 2012/0050216 A1 | 3/2012 | Kremin et al. |
| 2012/0075239 A1 | 3/2012 | Azumi et al. |
| 2012/0098776 A1 | 4/2012 | Chen et al. |
| 2012/0132006 A1 | 5/2012 | Roziere |
| 2012/0146726 A1 | 6/2012 | Huang et al. |
| 2012/0146920 A1 | 6/2012 | Lin et al. |
| 2012/0162121 A1 | 6/2012 | Chang et al. |
| 2012/0162133 A1 | 6/2012 | Chen et al. |
| 2012/0162134 A1 | 6/2012 | Chen et al. |
| 2012/0182251 A1 | 7/2012 | Krah |
| 2012/0187965 A1 | 7/2012 | Roziere |
| 2012/0188200 A1 | 7/2012 | Roziere |
| 2012/0188201 A1 | 7/2012 | Binstead |
| 2012/0242597 A1 | 9/2012 | Hwang et al. |
| 2012/0249401 A1 | 10/2012 | Omoto |
| 2012/0262410 A1 | 10/2012 | Lim |
| 2012/0274603 A1 | 11/2012 | Kim et al. |
| 2012/0287068 A1 | 11/2012 | Colgate |
| 2012/0313881 A1 | 12/2012 | Ge et al. |
| 2013/0076647 A1 | 3/2013 | Yousefpor et al. |
| 2013/0076648 A1 | 3/2013 | Krah et al. |
| 2013/0141343 A1 | 6/2013 | Yu et al. |
| 2013/0170116 A1 | 7/2013 | In et al. |
| 2013/0176276 A1 | 7/2013 | Shepelev |
| 2013/0181943 A1 | 7/2013 | Bulea et al. |
| 2013/0194229 A1 | 8/2013 | Sabo et al. |
| 2013/0215075 A1 | 8/2013 | Lee et al. |
| 2013/0293499 A1 | 11/2013 | Chang et al. |
| 2013/0308031 A1 | 11/2013 | Theuwissen |
| 2013/0314342 A1 | 11/2013 | Kim et al. |
| 2013/0320994 A1 | 12/2013 | Brittain et al. |
| 2013/0328759 A1 | 12/2013 | Al-Dahle et al. |
| 2013/0328800 A1 | 12/2013 | Pu et al. |
| 2013/0335342 A1 | 12/2013 | Kim et al. |
| 2014/0049507 A1 | 2/2014 | Shepelev et al. |
| 2014/0070823 A1 | 3/2014 | Roziere |
| 2014/0078096 A1 | 3/2014 | Tan et al. |
| 2014/0078097 A1 | 3/2014 | Shepelev et al. |
| 2014/0103712 A1 | 4/2014 | Blondin et al. |
| 2014/0111496 A1 | 4/2014 | Gomez et al. |
| 2014/0125357 A1 | 5/2014 | Blondin et al. |
| 2014/0125628 A1 | 5/2014 | Yoshida et al. |
| 2014/0132534 A1 | 5/2014 | Kim |
| 2014/0132560 A1 | 5/2014 | Huang et al. |
| 2014/0152615 A1 | 6/2014 | Chang et al. |
| 2014/0160058 A1 | 6/2014 | Chen et al. |
| 2014/0210779 A1 | 7/2014 | Katsuta et al. |
| 2014/0225838 A1 | 8/2014 | Gupta et al. |
| 2014/0232955 A1 | 8/2014 | Roudbari et al. |
| 2014/0267070 A1 | 9/2014 | Shahparnia et al. |
| 2014/0267165 A1 | 9/2014 | Roziere |
| 2014/0333582 A1 | 11/2014 | Huo |
| 2014/0347321 A1 | 11/2014 | Roziere |
| 2014/0362029 A1 | 12/2014 | Mo et al. |
| 2015/0002752 A1 | 1/2015 | Shepelev et al. |
| 2015/0009421 A1 | 1/2015 | Choi et al. |
| 2015/0035787 A1 | 2/2015 | Shahparnia et al. |
| 2015/0042600 A1 | 2/2015 | Lukanc et al. |
| 2015/0084911 A1 | 3/2015 | Stronks et al. |
| 2015/0091587 A1 | 4/2015 | Shepelev et al. |
| 2015/0091843 A1 | 4/2015 | Ludden |
| 2015/0091849 A1 | 4/2015 | Ludden |
| 2015/0116263 A1 | 4/2015 | Kim |
| 2015/0194470 A1* | 7/2015 | Hwang .................. G06F 3/044 345/173 |
| 2015/0248177 A1 | 9/2015 | Maharyta |
| 2015/0277648 A1 | 10/2015 | Small |
| 2015/0338937 A1 | 11/2015 | Shepelev et al. |
| 2015/0363032 A1 | 12/2015 | Hotelling et al. |

(56) References Cited

U.S. PATENT DOCUMENTS

| | | |
|---|---|---|
| 2016/0034102 A1 | 2/2016 | Roziere et al. |
| 2016/0048234 A1 | 2/2016 | Chandran et al. |
| 2016/0098114 A1 | 4/2016 | Pylvas |
| 2016/0117017 A1 | 4/2016 | Kremin et al. |
| 2016/0170533 A1 | 6/2016 | Roziere |
| 2016/0188040 A1 | 6/2016 | Shin et al. |
| 2016/0211808 A1 | 7/2016 | Lee et al. |
| 2016/0224177 A1 | 8/2016 | Krah |
| 2016/0246403 A1 | 8/2016 | Zhao et al. |
| 2016/0253034 A1 | 9/2016 | Gupta et al. |
| 2016/0320898 A1 | 11/2016 | Tang et al. |
| 2017/0090644 A1 | 3/2017 | Yao |
| 2017/0108968 A1 | 4/2017 | Roziere |
| 2017/0139539 A1 | 5/2017 | Yao et al. |
| 2017/0168619 A1 | 6/2017 | Yang et al. |
| 2017/0220156 A1 | 8/2017 | Blondin |
| 2017/0229502 A1 | 8/2017 | Liu et al. |
| 2017/0262121 A1 | 9/2017 | Kurasawa et al. |
| 2017/0315646 A1 | 11/2017 | Roziere |
| 2017/0351378 A1 | 12/2017 | Wang et al. |
| 2018/0032176 A1 | 2/2018 | Krah et al. |
| 2018/0074633 A1 | 3/2018 | Kida et al. |
| 2018/0107309 A1 | 4/2018 | Endo et al. |
| 2019/0073061 A1 | 3/2019 | Krah et al. |
| 2019/0087051 A1 | 3/2019 | Yao |
| 2020/0019265 A1 | 1/2020 | Krah et al. |

FOREIGN PATENT DOCUMENTS

| | | | |
|---|---|---|---|
| CN | 1800923 A | | 7/2006 |
| CN | 1875312 A | | 12/2006 |
| CN | 1942853 A | | 4/2007 |
| CN | 1959481 A | | 5/2007 |
| CN | 101122838 A | | 2/2008 |
| CN | 10-1140366 A | | 3/2008 |
| CN | 10-1140368 A | | 3/2008 |
| CN | 10-1354625 A | | 1/2009 |
| CN | 101349957 A | | 1/2009 |
| CN | 2012-18943 Y | | 4/2009 |
| CN | 101859215 A | | 10/2010 |
| CN | 10-2483659 A | | 5/2012 |
| CN | 102483673 A | | 5/2012 |
| CN | 10-2760405 A | | 10/2012 |
| CN | 102804114 A | | 11/2012 |
| CN | 10-2881839 A | | 1/2013 |
| CN | 103135815 A | | 6/2013 |
| CN | 103258492 A | | 8/2013 |
| CN | 103577008 A | | 2/2014 |
| CN | 103885627 A | | 6/2014 |
| CN | 104020880 A | | 9/2014 |
| CN | 104252266 A | | 12/2014 |
| DE | 11-2012 004912 T5 | | 8/2014 |
| EP | 1 192 585 B1 | | 4/2002 |
| EP | 1391807 A1 | | 2/2004 |
| EP | 1 422 601 A1 | | 5/2004 |
| EP | 1 455 264 A2 | | 9/2004 |
| EP | 2 144 146 A1 | | 1/2010 |
| EP | 2 148 264 A2 | | 1/2010 |
| EP | 2 224 277 A1 | | 9/2010 |
| EP | 2256606 A2 | | 12/2010 |
| FR | 2 756 048 A1 | | 5/1998 |
| FR | 2 896 595 A1 | | 7/2007 |
| FR | 2949008 A1 | | 2/2011 |
| FR | 3 004 551 A1 | | 10/2014 |
| JP | 03-081735 A | | 4/1991 |
| JP | 7-110742 A | | 4/1995 |
| JP | 2000-163031 A | | 6/2000 |
| JP | 2002-342033 A | | 11/2002 |
| JP | 2004-526265 A | | 8/2004 |
| JP | 2005-523496 A | | 8/2005 |
| JP | 2006-064769 A | | 3/2006 |
| JP | 2006-251927 A | | 9/2006 |
| JP | 2006-344163 A | | 12/2006 |
| JP | 2007-334347 A | | 12/2007 |
| JP | 2008-070983 A | | 3/2008 |
| JP | 2008-117371 A | | 5/2008 |
| JP | 2008-281616 A | | 11/2008 |
| JP | 2009-086240 A | | 4/2009 |
| JP | 2009-157373 A | | 7/2009 |
| JP | 2011-141464 A | | 7/2011 |
| KR | 10-2004-0002983 A | | 1/2004 |
| KR | 10-2006-0073590 A | | 6/2006 |
| KR | 10-2007-0082757 A | | 8/2007 |
| KR | 10-2007-0102414 A | | 10/2007 |
| KR | 10-2008-0047332 A | | 5/2008 |
| KR | 10-2008-0060127 A | | 7/2008 |
| KR | 10-2010-0054899 A | | 5/2010 |
| KR | 10-2011-0044670 A | | 4/2011 |
| TW | 200411266 A | | 7/2004 |
| TW | I234676 | | 6/2005 |
| TW | 2008-26032 A | | 6/2008 |
| TW | I303050 | | 11/2008 |
| TW | 200846990 A | | 12/2008 |
| TW | 201126236 A1 | | 8/2011 |
| WO | WO-95/27334 A1 | | 10/1995 |
| WO | WO-2005/015373 A2 | | 2/2005 |
| WO | WO-2005/015373 A3 | | 2/2005 |
| WO | WO-2005/101178 A2 | | 10/2005 |
| WO | WO-2005/101178 A3 | | 10/2005 |
| WO | WO-2005/114369 A2 | | 12/2005 |
| WO | WO-2005/114369 A3 | | 12/2005 |
| WO | WO-2006/126703 A2 | | 11/2006 |
| WO | WO-2007/003108 A1 | | 1/2007 |
| WO | 2006/126703 A3 | | 8/2007 |
| WO | WO-2007/146779 A2 | | 12/2007 |
| WO | WO-2007/146779 A3 | | 12/2007 |
| WO | WO-2007/146780 A2 | | 12/2007 |
| WO | WO-2007/146780 A3 | | 12/2007 |
| WO | WO-2007/146783 A2 | | 12/2007 |
| WO | WO-2007/146783 A3 | | 12/2007 |
| WO | WO-2008/000964 A1 | | 1/2008 |
| WO | WO-2008/030780 A1 | | 3/2008 |
| WO | WO-2010/002929 A2 | | 1/2010 |
| WO | WO-2010/088666 A1 | | 8/2010 |
| WO | WO-2010/088670 A1 | | 8/2010 |
| WO | WO-2011/015795 A2 | | 2/2011 |
| WO | WO-2011/015795 A3 | | 2/2011 |
| WO | 2011/028451 A1 | | 3/2011 |
| WO | WO-2013/093327 A1 | | 6/2013 |
| WO | WO-2014/126661 A1 | | 8/2014 |
| WO | WO-2015/088629 A1 | | 6/2015 |
| WO | WO-2015/175013 A1 | | 11/2015 |
| WO | WO-2016/066282 A1 | | 5/2016 |

OTHER PUBLICATIONS

Chinese Search Report completed Dec. 16, 2011, for CN Application No. ZL2010201083672, filed Feb. 2, 2010, with English Translation, 15 pages.

Chinese Search Report completed Mar. 27, 2012, for CN Application No. ZL2010201083672, filed Feb. 2, 2010, with English Translation, 16 pages.

Chinese Search Report dated Oct. 27, 2015, for CN Application No. 201310128546.0, filed Feb. 2, 2010, with English Translation, four pages.

Chinese Search Report dated Mar. 30, 2016, for CN Application No. 201410145483.4, filed Jul. 3, 2009, with English Translation, four pages.

European Search Report dated Jul. 6, 2010, for EP Application No. 10151966.8, seven pages.

European Search Report dated Dec. 9, 2010, for EP Application No. 09164196.9, filed Jun. 30, 2009, six pages.

European Search Report dated Oct. 4, 2011, for EP Application No. 09164196.9, filed Jun. 30, 2009, 11 pages.

European Search Report dated Oct. 6, 2017, for EP Application No. 14868756.9, eleven pages.

Final Office Action dated May 15, 2012, for U.S. Appl. No. 12/240,964, filed Sep. 29, 2008, 39 pages.

Final Office Action dated Nov. 13, 2014, for U.S. Appl. No. 14/275,527, filed May 12, 2014, ten pages.

(56) References Cited

OTHER PUBLICATIONS

International Search Report dated Mar. 17, 2010, for PCT Application No. PCT/US10/22883, filed Feb. 2, 2010, one page.
International Search Report dated Jun. 25, 2010, for PCT Application No. PCT/US10/22888, filed Feb. 2, 2010, two pages.
International Search Report dated Mar. 15, 2011, for PCT Application No. PCT/US2009/049313, filed Jun. 30, 2009, seven pages.
International Search Report dated Jun. 17, 2014 for PCT Application No. PCT/US2014/010901, five pages.
International Search Report dated Dec. 31, 2014, for PCT Application No. PCT/US14/58367, filed Sep. 30, 2014, two pages.
International Search Report dated Dec. 31, 2014, for PCT Application No. PCT/US14/58773, three pages.
Kanda, E. et al. (2008). "55.2: Integrated Active Matrix Capacitive Sensors for Touch Panel LTPS-TFT LCDs," *SID 08 Digest*, pp. 834-837.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25. (core citation)
Non-Final Office Action dated Sep. 15, 2011, for U.S. Appl. No. 12/545,649, filed Aug. 21, 2009, 1449 nine pages.
Non-Final Office Action dated Nov. 9, 2011, for U.S. Appl. No. 12/240,964, filed Sep. 29, 2008, 27 pages.
Non-Final Office Action dated Jul. 9, 2014, for U.S. Appl. No. 14/275,527, filed May 12, 2014, eight pages.
Non-Final Office Action dated Dec. 12, 2014, for U.S. Appl. No. 13/943,669, filed Jul. 16, 2013, twelve pages.
Non-Final Office Action dated Feb. 3, 2015, for U.S. Appl. No. 14/275,527, filed May 12, 2014, 8 pages.
Non-Final Office Action dated Jul. 31, 2015 for U.S. Appl. No. 13/766,376 filed Feb. 13, 2013, 28 pages.
Non-Final Office Action dated Oct. 30, 2017, for U.S. Appl. No. 15/148,798, filed May 6, 2016, eleven pages.
Non-Final Office Action dated Nov. 24, 2017, for U.S. Appl. No. 15/039,400, filed May 25, 2016, sixteen pages.
Non-Final Office Action dated Dec. 15, 2017, for U.S. Appl. No. 15/311,836, filed Nov. 16, 2016, 14 pages.
Notice of Allowance dated Jun. 10, 2010, for U.S. Appl. No. 12/756,834, filed Apr. 8, 2010, six pages.
Notice of Allowance dated Jul. 7, 2010, for U.S. Appl. No. 12/558,488, filed Sep. 11, 2009, six pages.
Notice of Allowance dated Mar. 12, 2012, for U.S. Appl. No. 12/545,649, filed Aug. 21, 2009, seven pages.
Notice of Allowance dated Nov. 6, 2012, for U.S. Appl. No. 13/527,470, filed Jun. 19, 2012, 11 pages.
Notice of Allowance dated Apr. 17, 2013, for U.S. Appl. No. 12/240,964, filed Sep. 29, 2008, 13 pages.
Notice of Allowance dated Apr. 17, 2013 for U.S. Appl. No. 13/717,593, filed Dec. 17, 2012, 9 pages.
Notice of Allowance dated Nov. 13, 2013, for U.S. Appl. No. 13/936,980, filed Jul. 8, 2013, 20 pages.
Notice of Allowance dated Apr. 1, 2014, for U.S. Appl. No. 14/155,063, filed Jan. 14, 2014, 12 pages.
Notice of Allowance dated May 7, 2015, for U.S. Appl. No. 13/943,669, filed Jul. 16, 2013, five pages.
Notice of Allowance dated May 12, 2015, for U.S. Appl. No. 14/275,527, filed May 12, 2014, seven pages.
Notice of Allowance dated Jan. 11, 2016 for U.S. Appl. No. 13/766,376, filed Feb. 13, 2013, ten pages.
Notice of Allowance dated Jan. 22, 2016, for U.S. Appl. No. 14/738,648, filed Jun. 12, 2015, nine pages.
Notice of Allowance dated May 2, 2017, for U.S. Appl. No. 14/835,515, filed Aug. 25, 2015, twelve pages.
Notice of Allowance dated Mar. 14, 2018, for U.S. Appl. No. 15/148,798, filed May 6, 2016, ten pages.
Notice of Allowance dated Jul. 5, 2018, for U.S. Appl. No. 15/311,836, filed Nov. 16, 2016, eight pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combing Gestures and Direct Mapulation," CHI '92, pp. 659-660.
Supplemental Notice of Allowability dated May 19, 2011, for U.S. Appl. No. 12/558,488, filed Sep. 11, 2009, 10 pages. (includes Notice of Allowance dated May 6, 2011.)
Supplemental Notice of Allowance dated Jan. 30, 2014, for U.S. Appl. No. 13/936,980, filed Jul. 8, 2013, 2 pages.
TW Search Report/Office Action dated Jan. 29, 2014, for TW Patent Application No. 099103062, with English Translation, two pages.
TW Search Report/Office Action dated Dec. 1, 2015, for TW Patent Application No. 103124315, with English Translation, three pages.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Notice of Allowability dated Nov. 14, 2018, for U.S. Appl. No. 15/039,400, filed May 25, 2016, two pages.
Notice of Allowance dated Oct. 18, 2018, for U.S. Appl. No. 15/039,400, filed May 25, 2016, eight pages.
Chinese Search Report dated Jun. 21, 2018, for CN Application No. 201480065352.3, four pages.
Extended European Search Report received for European Patent Application No. 18197785.1, dated Apr. 5, 2019, 8 pages.
Final Office Action received for U.S. Appl. No. 15/009,774, dated Feb. 6, 2019, 16 pages.
Final Office Action received for U.S. Appl. No. 15/226,628, dated Mar. 28, 2018, 17 pages.
Final Office Action received for U.S. Appl. No. 15/313,549, dated Dec. 18, 2019, 24 pages.
Final Office Action received for U.S. Appl. No. 16/192,664, dated Apr. 16, 2020, 10 pages.
Non-Final Office Action received for U.S. Appl. No. 15/009,774, dated Jun. 20, 2018, 19 pages.
Non-Final Office Action received for U.S. Appl. No. 15/009,774, dated Sep. 4, 2019, 18 pages.
Non-Final Office Action received for U.S. Appl. No. 15/089,432, dated Jan. 24, 2018, 28 pages.
Non-Final Office Action received for U.S. Appl. No. 15/226,628, dated Aug. 11, 2017, 11 pages.
Non-Final Office Action received for U.S. Appl. No. 15/226,628, dated Aug. 27, 2018, 17 pages.
Non-Final Office Action received for U.S. Appl. No. 15/311,836, dated Dec. 15, 2017, 15 pages.
Non-Final Office Action received for U.S. Appl. No. 15/313,549, dated Apr. 23, 2020, 33 pages.
Non-Final Office Action received for U.S. Appl. No. 15/313,549, dated Dec. 21, 2018, 14 pages.
Non-Final Office Action received for U.S. Appl. No. 15/313,549, dated Jul. 10, 2019, 25 pages.
Non-Final Office Action received for U.S. Appl. No. 15/687,354, dated May 23, 2019, 18 pages.
Non-Final Office Action received for U.S. Appl. No. 16/179,565, dated Dec. 13, 2018, 9 pages.
Non-Final Office Action received for U.S. Appl. No. 16/192,664, dated Nov. 26, 2019, 9 pages.
Non-Final Office Action received for U.S. Appl. No. 16/581,721, dated Oct. 30, 2019, 10 pages.
Notice of Allowance received for U.S. Appl. No. 15/009,774, dated Mar. 20, 2020, 16 pages.
Notice of Allowance received for U.S. Appl. No. 15/039,400, dated Oct. 12, 2018, 9 pages.
Notice of Allowance received for U.S. Appl. No. 15/089,432, dated Jul. 30, 2018, 10 pages.
Notice of Allowance received for U.S. Appl. No. 15/226,628, dated Apr. 3, 2019, 6 pages.
Notice of Allowance received for U.S. Appl. No. 15/311,836, dated Jul. 5, 2018, 9 pages.
Notice of Allowance received for U.S. Appl. No. 15/663,271, dated Jul. 5, 2018, 10 pages.

(56) References Cited

OTHER PUBLICATIONS

Notice of Allowance received for U.S. Appl. No. 15/687,354, dated Sep. 6, 2019, 12 pages.
Notice of Allowance received for U.S. Appl. No. 16/179,565, dated Jun. 6, 2019, 7 pages.
Notice of Allowance received for U.S. Appl. No. 16/581,721, dated Apr. 22, 2020, 5 pages.
Restriction Requirement received for U.S. Appl. No. 13/766,376, dated Mar. 16, 2015, 6 pages.
Restriction Requirement received for U.S. Appl. No. 15/089,432, dated Jul. 17, 2017, 5 pages.
Search Report received for Chinese Patent Application No. 201680008313.9, dated Jul. 5, 2019, 4 pages (2 pages English Translation and 2 pages of Official copy).
Gibilisco Stan, "The Illustrated Dictionary of Electronics", Eighth Edition, 2001, p. 173.
Lowe, Doug, "Electronics Components: How to Use an Op Amp as a Voltage Comparator", Dummies, Available online at: <https://www.dummies.com/programming/electronics/components/electronics-components-how-to-use-an-op-amp-as-a-voltage-comparator/>, 2012, 9 pages.
O'Connor Todd, "mTouch Projected Capacitive Touch Screen Sensing Theory of Operation", Microchip TB3064, Microchip Technology Inc., 2010, pp. 1-16.

* cited by examiner

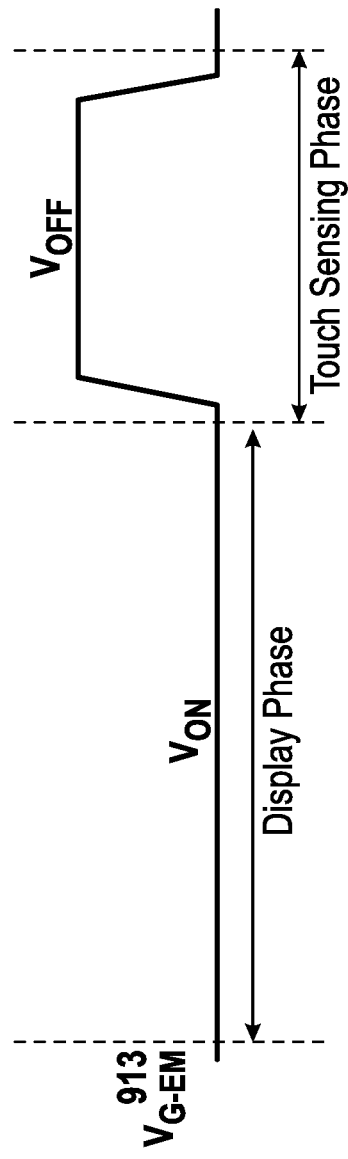

AMOLED
Pixel Circuit

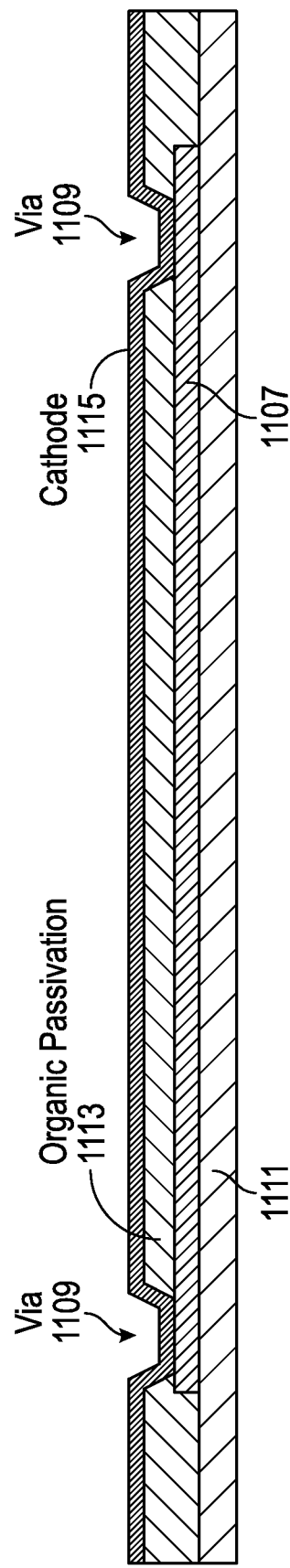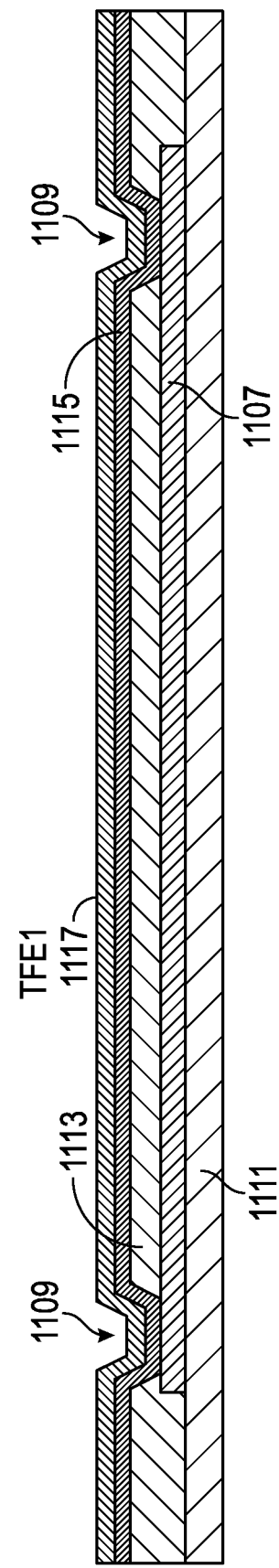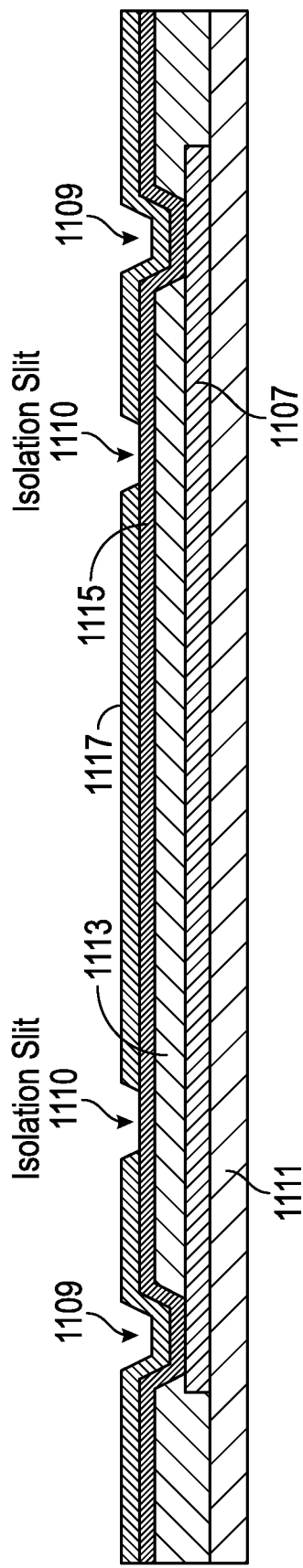

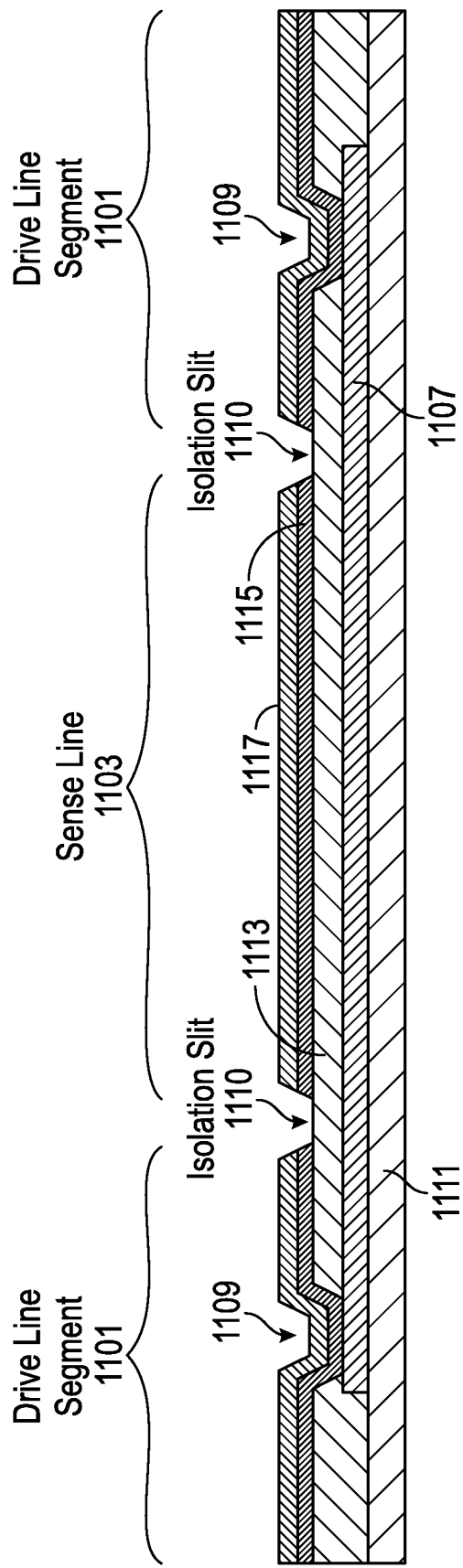
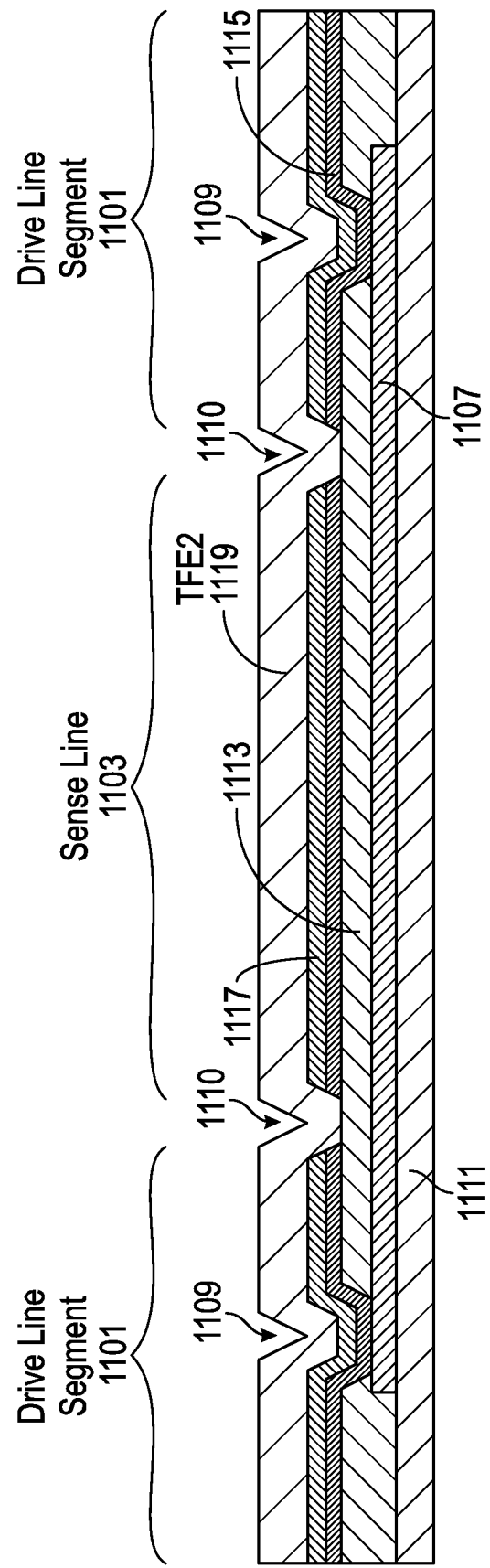
FIG. 11B-4
FIG. 11B-5

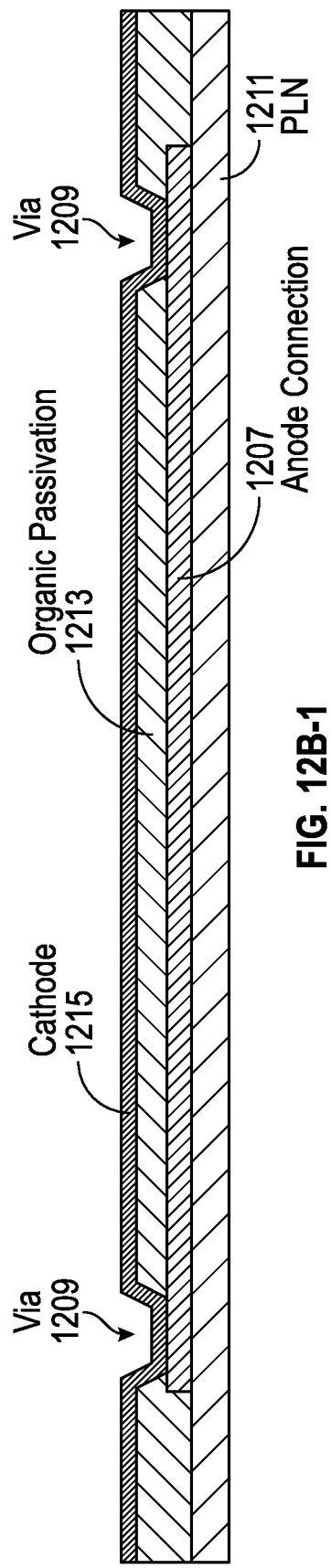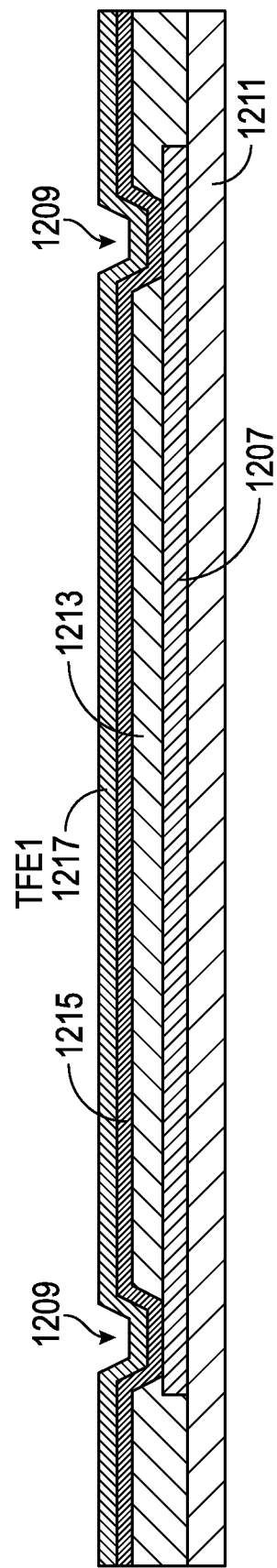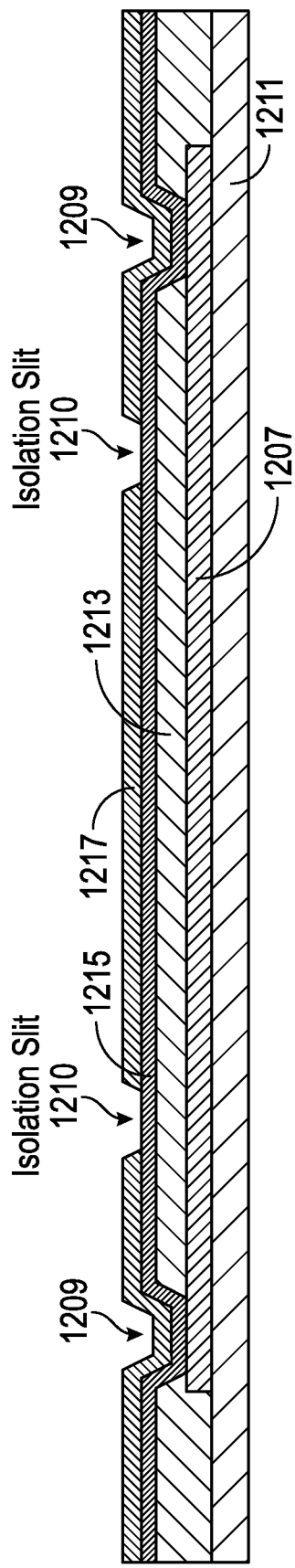
FIG. 12B-1  FIG. 12B-2  FIG. 12B-3

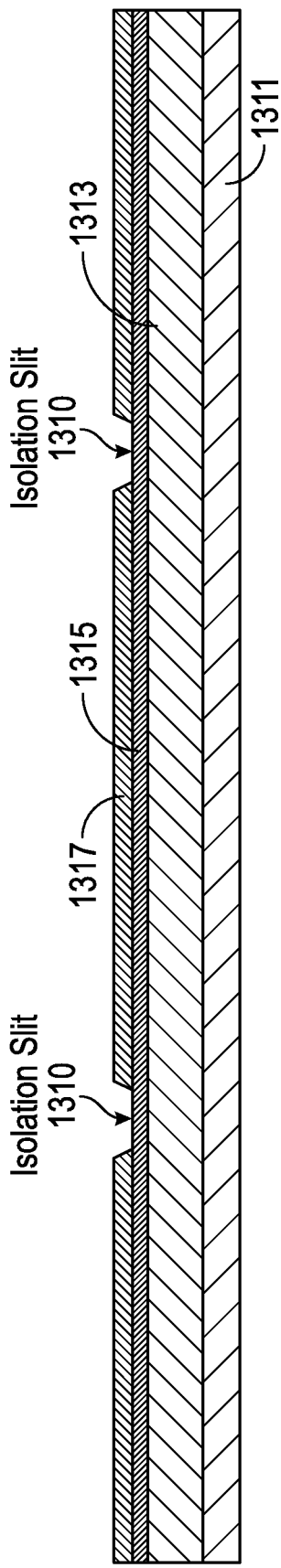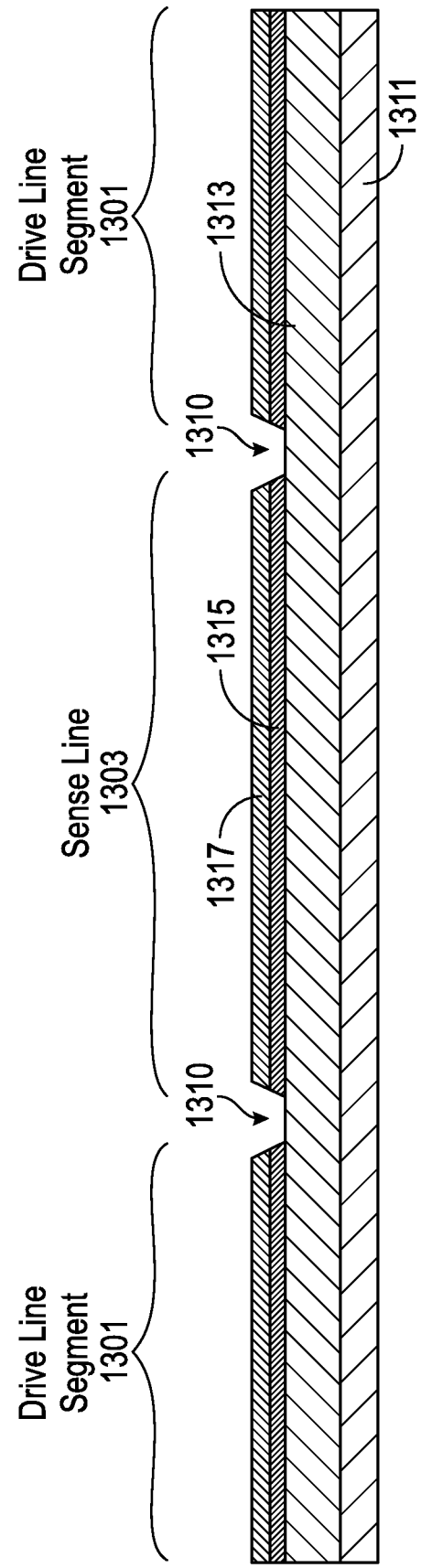
FIG. 13B-3
FIG. 13B-4

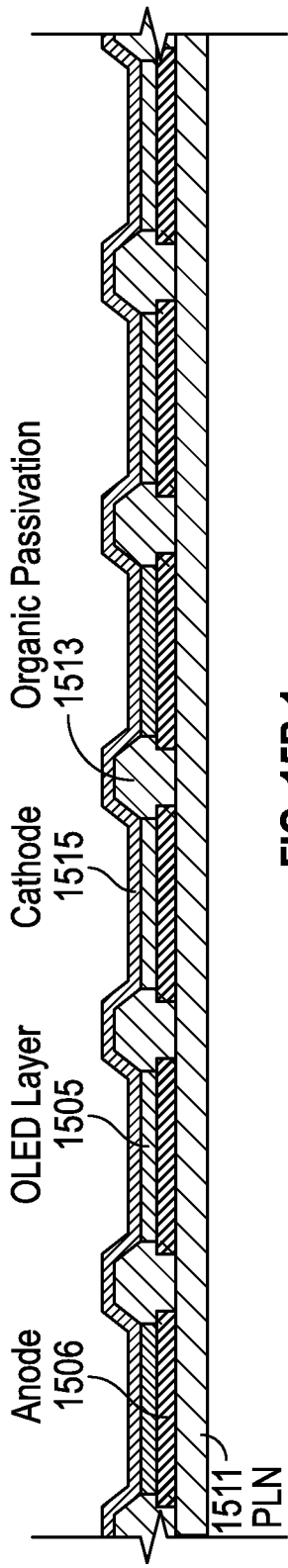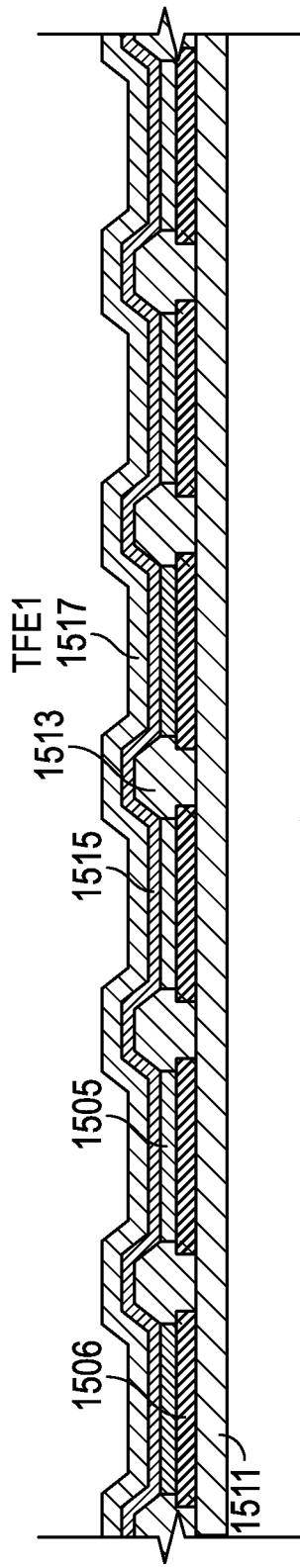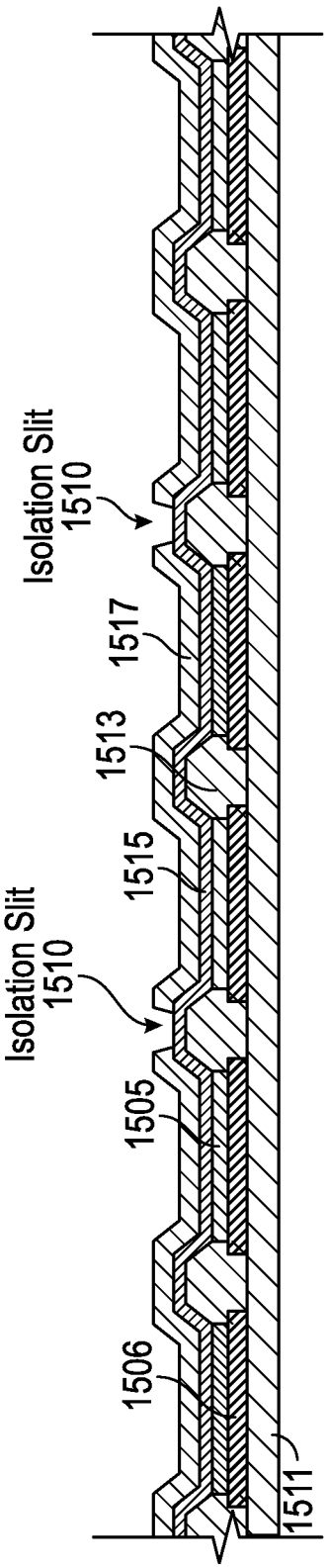
FIG. 15B-1
FIG. 15B-2
FIG. 15B-3

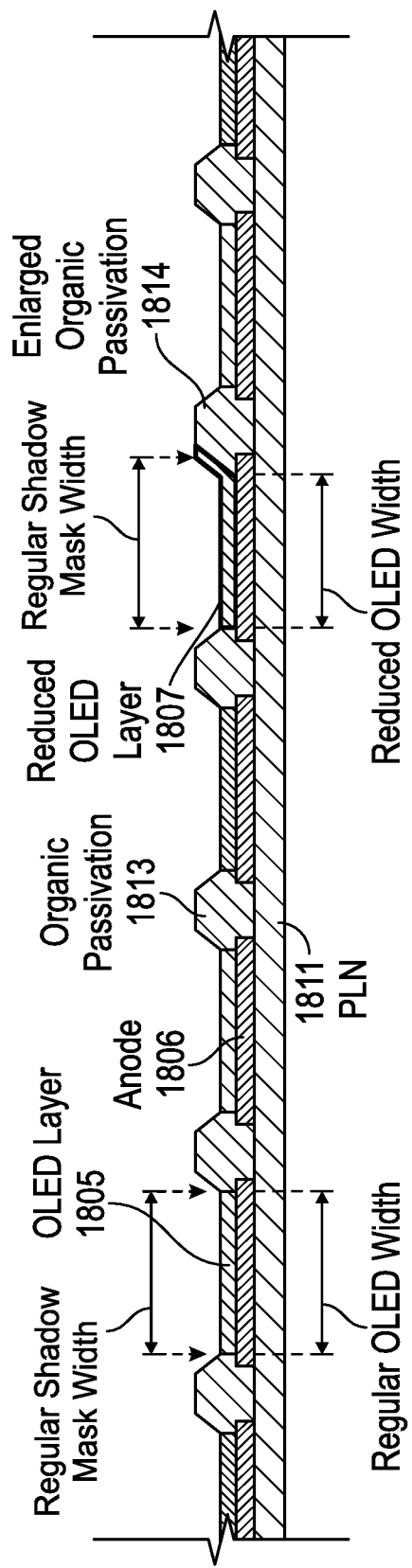
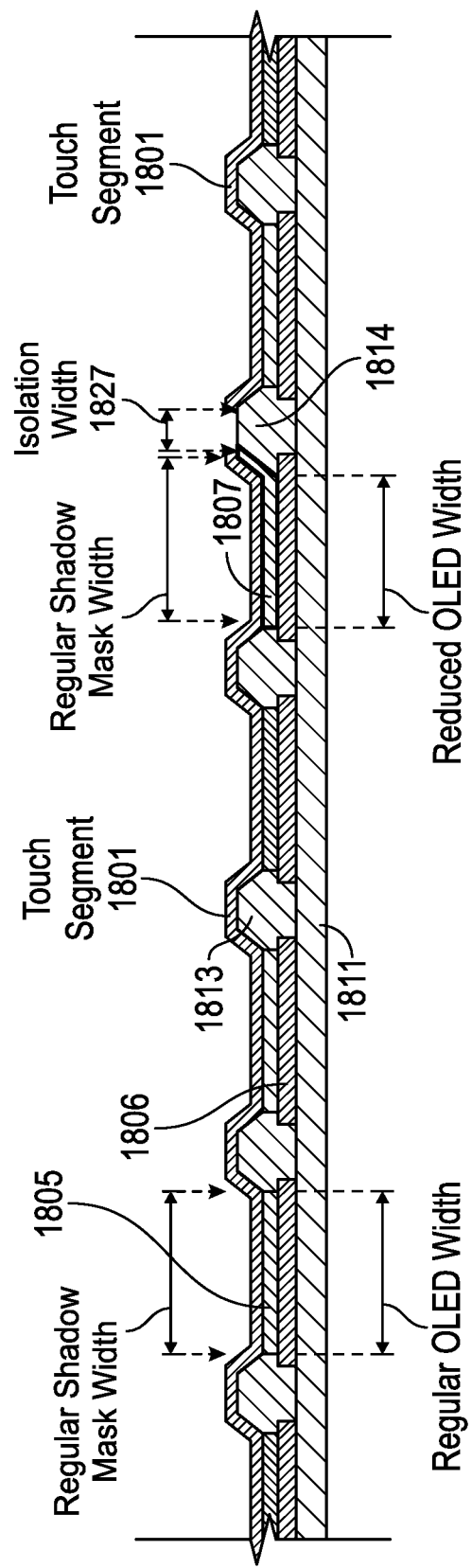
FIG. 18D-1
FIG. 18D-2

IN-CELL TOUCH FOR LED

CROSS-REFERENCE TO RELATED APPLICATIONS

This application is a continuation of U.S. patent application Ser. No. 15/148,798 (now U.S. Publication No. 2016-0253034), filed May 6, 2016, which is a continuation of U.S. patent application Ser. No. 13/766,376 (now U.S. Pat. No. 9,336,723), filed Feb. 13, 2013, the entire disclosure of which is incorporated herein by reference for all purposes.

FIELD OF THE DISCLOSURE

This relates generally to touch sensing, and more specifically to integrating touch circuitry into a Light-Emitting Diode (LED) pixel stackup.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a Light-Emitting Diode (LED) display (for example, an Organic Light-Emitting Diode display (OLED) display) that can be positioned partially or fully behind the panel so that the touch-sensitive surface can cover at least a portion of the viewable area of the display device. OLED displays are becoming more widespread with advances in OLED technology.

Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing fields used to detect touch can extend beyond the surface of the display, and objects approaching the surface may be detected near the surface without actually touching the surface.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on LED or OLED displays to form a touch screen (on-cell touch), as described above. However, integrating touch circuitry into an LED or OLED display pixel stackup (i.e., the stacked material layers forming the LED or OLED display pixels) can be desired (in-cell touch).

SUMMARY OF THE DISCLOSURE

The following description includes examples of integrating touch circuitry into an LED display pixel stackup of a touch screen device. The touch screen can include a transistor layer, an LED layer and a first layer that can be configured to operate as an LED cathode during a display phase and as touch circuitry during a touch sensing phase. The transistor layer can be at least partially utilized for transitioning between the display phase and the touch sensing phase. Furthermore, the touch screen can be fabricated in such a way as to reduce or eliminate damage to the LED layer during fabrication.

BRIEF DESCRIPTION OF THE DRAWINGS

FIGS. 9A-9D illustrate further exemplary AMOLED pixel circuit configurations and operations for turning on and off an OLED element during touch sensing and display phases of the touch screen of this disclosure.

FIGS. 11A and 11B-1 through 11B-5 illustrate an exemplary process for patterning the cathode layer according to examples of the disclosure.

FIGS. 12A and 12B-1 through 12B-5 illustrate another exemplary process for patterning the cathode layer according to examples of the disclosure.

FIGS. 13A and 13B-1 through 13B-6 illustrate another exemplary process for patterning the cathode layer according to examples of the disclosure.

FIGS. 15A and 15B-1 through 15B-6 illustrate an exemplary process for forming a drive line connection over OLED layers according to examples of the disclosure.

FIGS. 16A-1 through 16A-3 and 16B-1 through 16B-3 illustrate an exemplary process for performing shadow mask deposition of the cathode layer according to examples of this disclosure.

FIGS. 17A-1 through 17A-2 and 17B-1 through 17B-3 illustrate an exemplary process for performing laser ablation to form drive and sense segments according to examples of the disclosure.

FIGS. 18A through 18C and 18D-1 through 18D-3 illustrate an exemplary process for modifying the distance between adjacent OLED emission layers according to examples of the disclosure.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Many types of input devices are presently available for performing operations in a computing system. Touch screens, in particular, are becoming increasingly popular because of their ease and versatility of operation as well as their declining price. Touch screens can include a touch sensor panel, which can be a clear panel with a touch-sensitive surface, and a display device such as a Light-Emitting Diode (LED) display (for example, an Organic Light-Emitting Diode display (OLED) display) that can be positioned partially or fully behind the panel so that the touch-sensitive surface can cover at least a portion of the viewable area of the display device. OLED displays are becoming more widespread with advances in OLED technology.

Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing fields used to detect touch can extend beyond the surface of the display, and objects approaching the surface may be detected near the surface without actually touching the surface.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on LED or OLED displays to form a touch screen (on-cell touch), as described above. However, integrating touch circuitry into an LED or OLED display pixel stackup (i.e., the stacked material layers forming the LED or OLED display pixels) can be desired (in-cell touch).

Figure 1C:
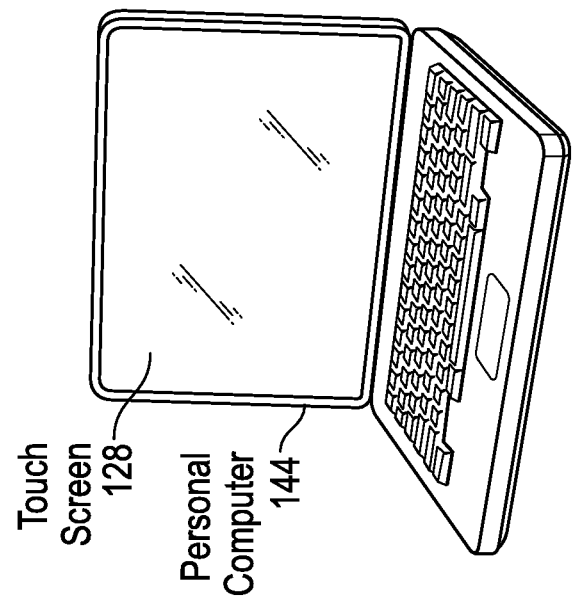
FIG. 1C illustrates an example personal computer that includes a touch screen.
Figure 1B:
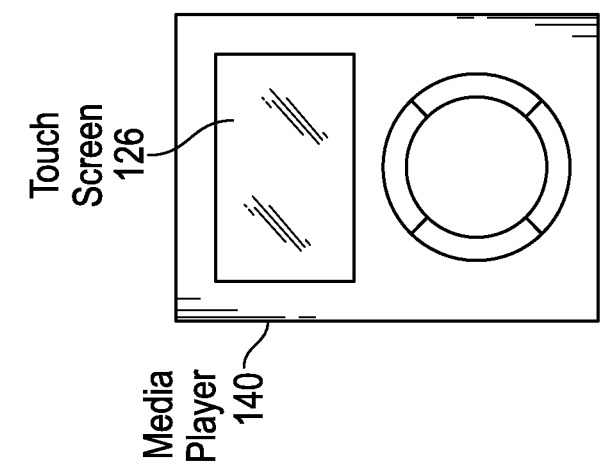
FIG. 1B illustrates an example digital media player that includes a touch screen.
Figure 1A:
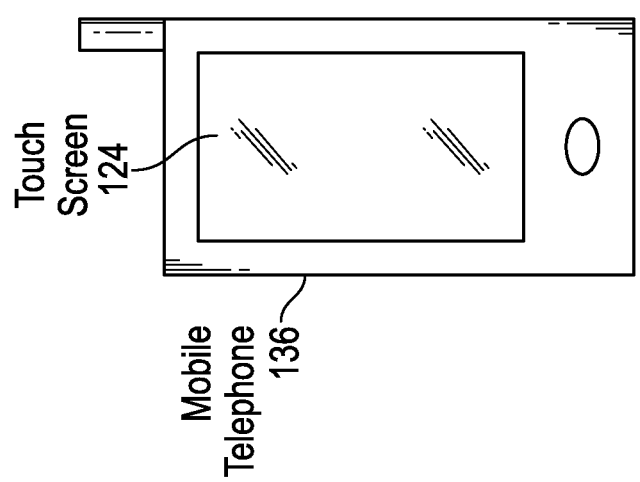
FIG. 1A illustrates an example mobile telephone that includes a touch screen.

FIGS. 1A-1C show example systems in which a touch screen according to examples of the disclosure may be implemented. FIG. 1A illustrates an example mobile telephone 136 that includes a touch screen 124. FIG. 1B illustrates an example digital media player 140 that includes a touch screen 126. FIG. 1C illustrates an example personal computer 144 that includes a touch screen 128. Although not shown in the figures, the personal computer 144 can also be a tablet computer or a desktop computer with a touch-sensitive display. Touch screens 124, 126, and 128 may be based on, for example, self capacitance or mutual capacitance, or another touch sensing technology. For example, in a self capacitance based touch system, an individual electrode with a self-capacitance to ground can be used to form a touch pixel (touch node) for detecting touch. As an object approaches the touch pixel, an additional capacitance to ground can be formed between the object and the touch pixel. The additional capacitance to ground can result in a net increase in the self-capacitance seen by the touch pixel. This increase in self-capacitance can be detected and measured by a touch sensing system to determine the positions of multiple objects when they touch the touch screen. A mutual capacitance based touch system can include, for example, drive regions and sense regions, such as drive lines and sense lines. For example, drive lines can be formed in rows while sense lines can be formed in columns (e.g., orthogonal). Touch pixels (touch nodes) can be formed at the intersections or adjacencies (in single layer configurations) of the rows and columns. During operation, the rows can be stimulated with an AC waveform and a mutual capacitance can be formed between the row and the column of the touch pixel. As an object approaches the touch pixel, some of the charge being coupled between the row and column of the touch pixel can instead be coupled onto the object. This reduction in charge coupling across the touch pixel can result in a net decrease in the mutual capacitance between the row and the column and a reduction in the AC waveform being coupled across the touch pixel. This reduction in the charge-coupled AC waveform can be detected and measured by the touch sensing system to determine the positions of multiple objects when they touch the touch screen. In some examples, a touch screen can be multi-touch, single touch, projection scan, full-imaging multi-touch, or any capacitive touch.

Figure 2:
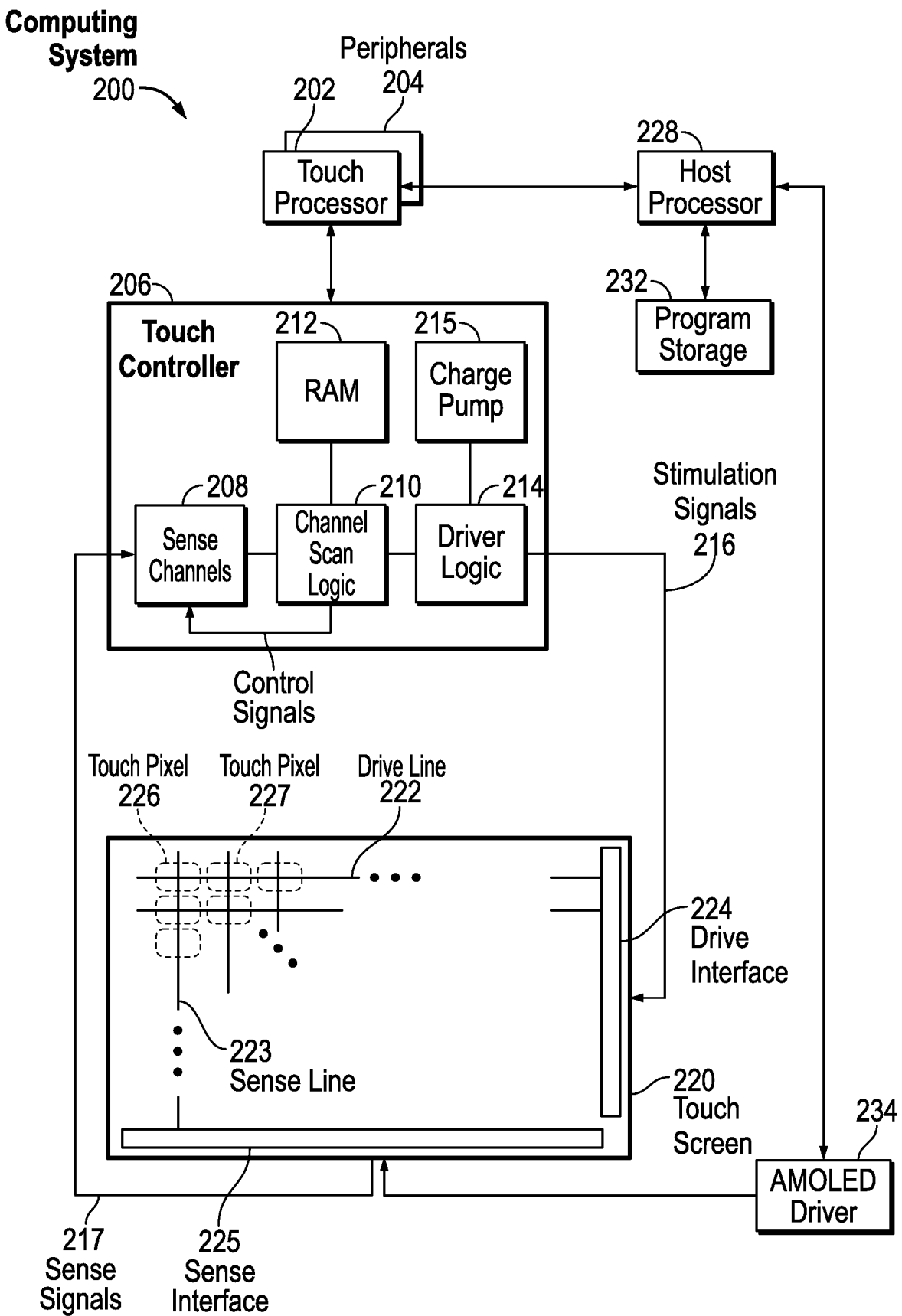
FIG. 2 is a block diagram of an example computing system that illustrates one implementation of an example touch screen according to examples of the disclosure.

FIG. 2 is a block diagram of an example computing system 200 that illustrates one implementation of an example touch screen 220 according to examples of the disclosure. Computing system 200 could be included in, for example, mobile telephone 136, digital media player 140, personal computer 144, or any mobile or non-mobile computing device that includes a touch screen. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC).

Computing system 200 can also include a host processor 228 for receiving outputs from touch processor 202 and performing actions based on the outputs. For example, host processor 228 can be connected to program storage 232 and a display controller, such as an Active-Matrix Organic Light-Emitting Diode (AMOLED) driver 234. It is understood that although the examples of the disclosure are described with reference to AMOLED displays, the scope of the disclosure is not so limited and can extend to other types of LED displays such as Passive-Matrix Organic Light-Emitting Diode (PMOLED) displays.

Host processor 228 can use AMOLED driver 234 to generate an image on touch screen 220, such as an image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 (also referred to as an event detection and demodulation circuit) in touch controller 206. In this way, drive lines and sense lines can be part of the touch sensing circuitry that can interact to form capacitive sensing nodes, which can be thought of as touch picture elements (touch pixels), such as touch pixels 226 and 227. This way of understanding can be particularly useful when touch screen 220 is viewed as capturing an "image" of touch. In other words, after touch controller 206 has determined whether a touch has been detected at each touch pixel in the touch screen, the pattern of touch pixels in the touch screen at which a touch occurred can be thought of as an "image" of touch (e.g., a pattern of fingers touching the touch screen).

Figure 3A:
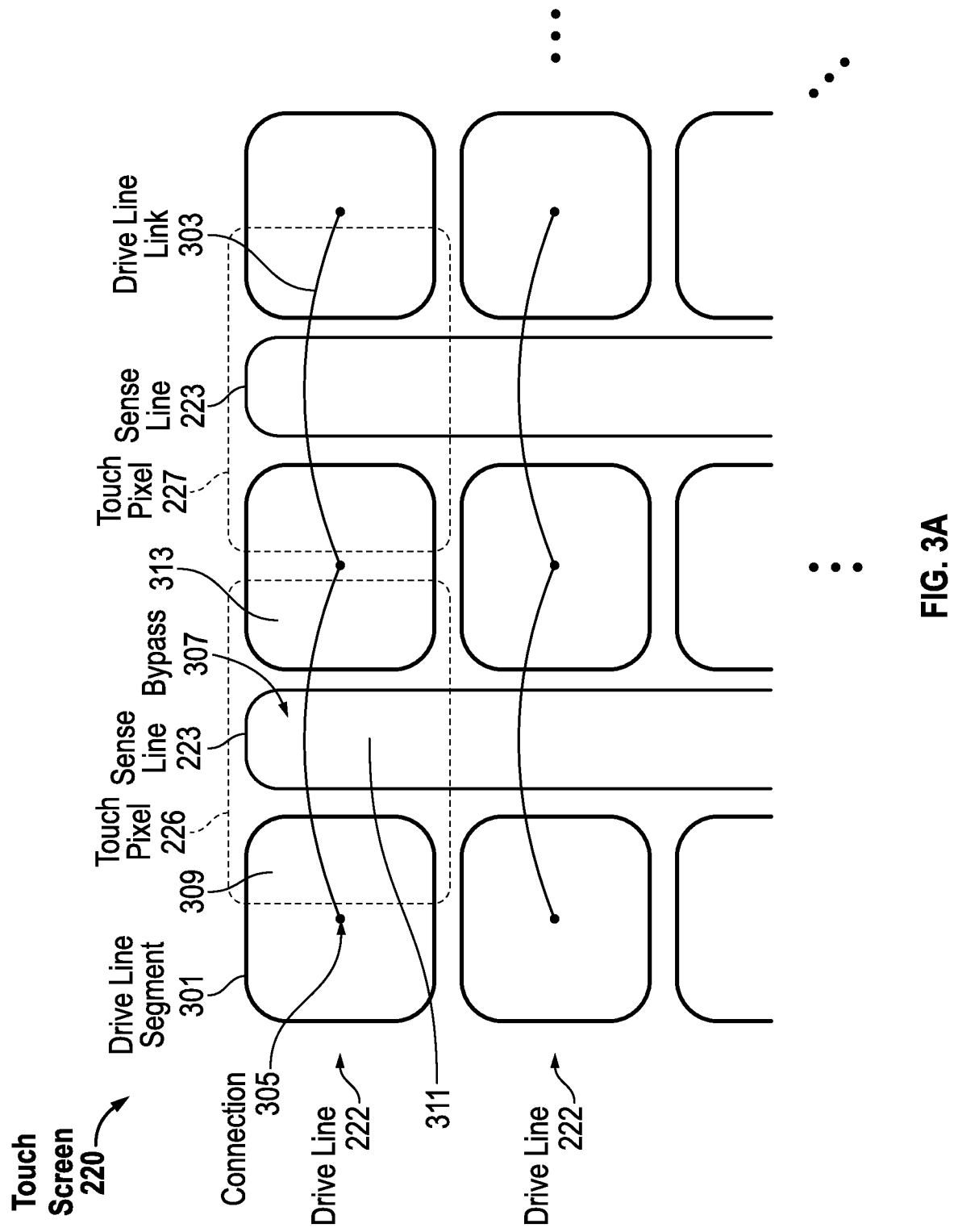
FIG. 3A is a more detailed view of a touch screen showing an example configuration of drive lines and sense lines according to examples of the disclosure.

In some examples, touch screen 220 can be an integrated touch screen in which touch sensing circuit elements of the touch sensing system can be integrated into the display pixel stackups of a display. An example integrated touch screen in which examples of the disclosure can be implemented will now be described with reference to FIGS. 3-6. FIG. 3A is a more detailed view of touch screen 220 showing an example configuration of drive lines 222 and sense lines 223 according to examples of the disclosure. As shown in FIG. 3A, each drive line 222 can be formed of one or more drive line segments 301 that can be electrically connected by drive line links 303 at connections 305. Drive line links 303 are not electrically connected to sense lines 223, rather, the drive line links can bypass the sense lines through bypasses 307. Drive lines 222 and sense lines 223 can interact capacitively to form touch pixels such as touch pixels 226 and 227. Drive lines 222 (i.e., drive line segments 301 and corresponding drive line links 303) and sense lines 223 can be formed of electrical circuit elements in touch screen 220. In the example configuration of FIG. 3A, each of touch pixels 226 and 227 can include a portion of one drive line segment 301, a portion of a sense line 223, and a portion of another drive line segment. For example, touch pixel 226 can include a right-half portion 309 of a drive line segment 301 on one side of a portion 311 of a sense line 223, and a left-half portion 313 of a drive line segment on the opposite side of portion 311 of the sense line.

Figure 3B:
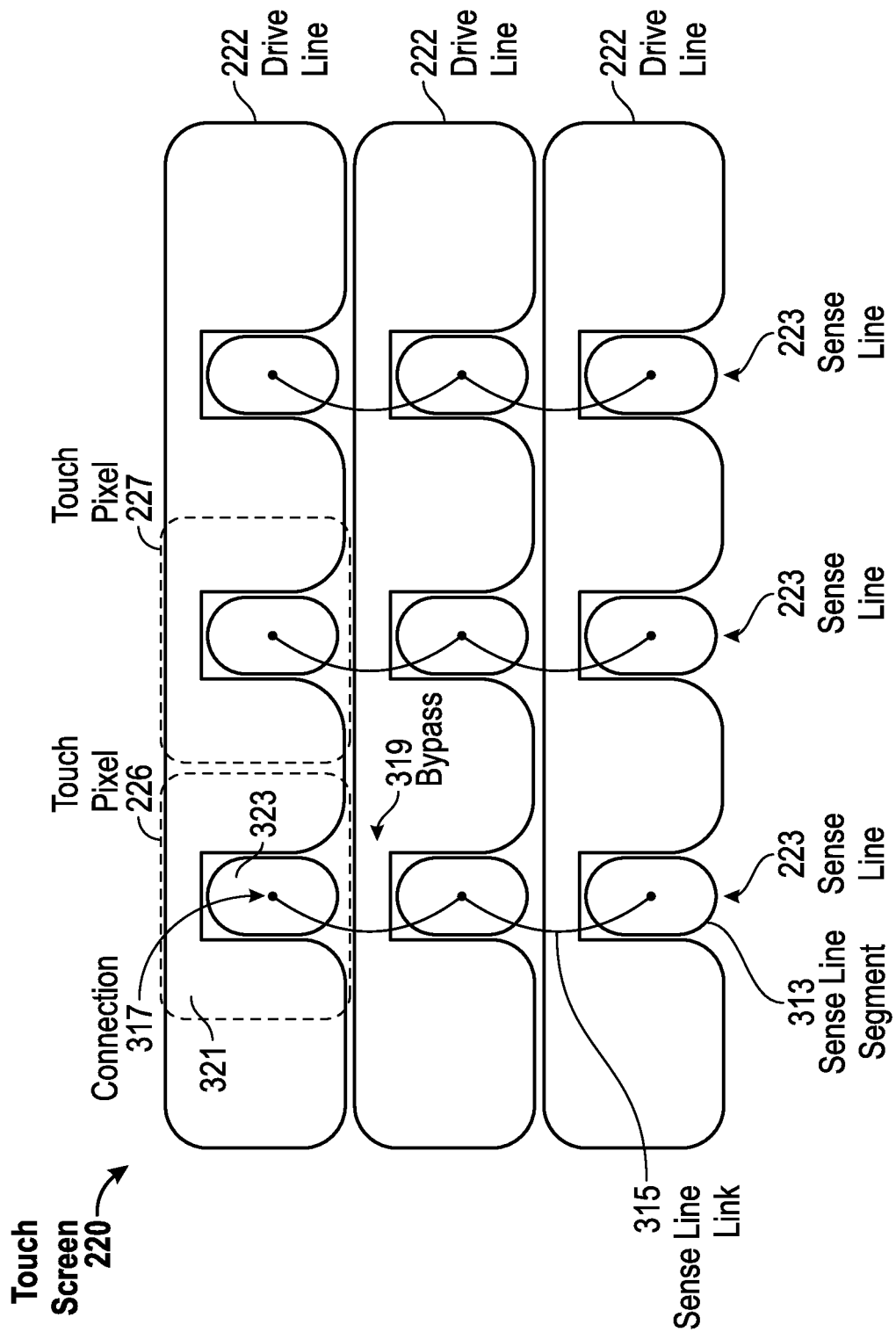
FIG. 3B is a more detailed view of a touch screen showing another example configuration of drive lines and sense lines according to examples of the disclosure.

FIG. 3B is a more detailed view of touch screen 220 showing another example configuration of drive lines 222 and sense lines 223 according to examples of the disclosure. As shown in FIG. 3B, each sense line 223 can be formed of one or more sense line segments 313 that can be electrically connected by sense line links 315 at connections 317. Sense line links 315 are not electrically connected to drive lines 222, rather, the sense line links can bypass the drive lines through bypasses 319. Drive lines 222 and sense lines 223 can interact capacitively to form touch pixels such as touch pixels 226 and 227. Drive lines 222 and sense lines 223 (i.e., sense line segments 315 and corresponding sense line links 315) can be formed of electrical circuit elements in touch screen 220. In the example of FIG. 3B, each of touch pixels 226 and 227 can include a portion of a drive line 222 and a sense line segment 313. For example, touch pixel 226 can include a portion 321 of a drive line 222 and sense line segment 323. For ease of description, the examples of the disclosure will be described using the example configuration of FIG. 3A, although it is understood that the examples of the disclosure are not limited to such a configuration.

Figure 4:
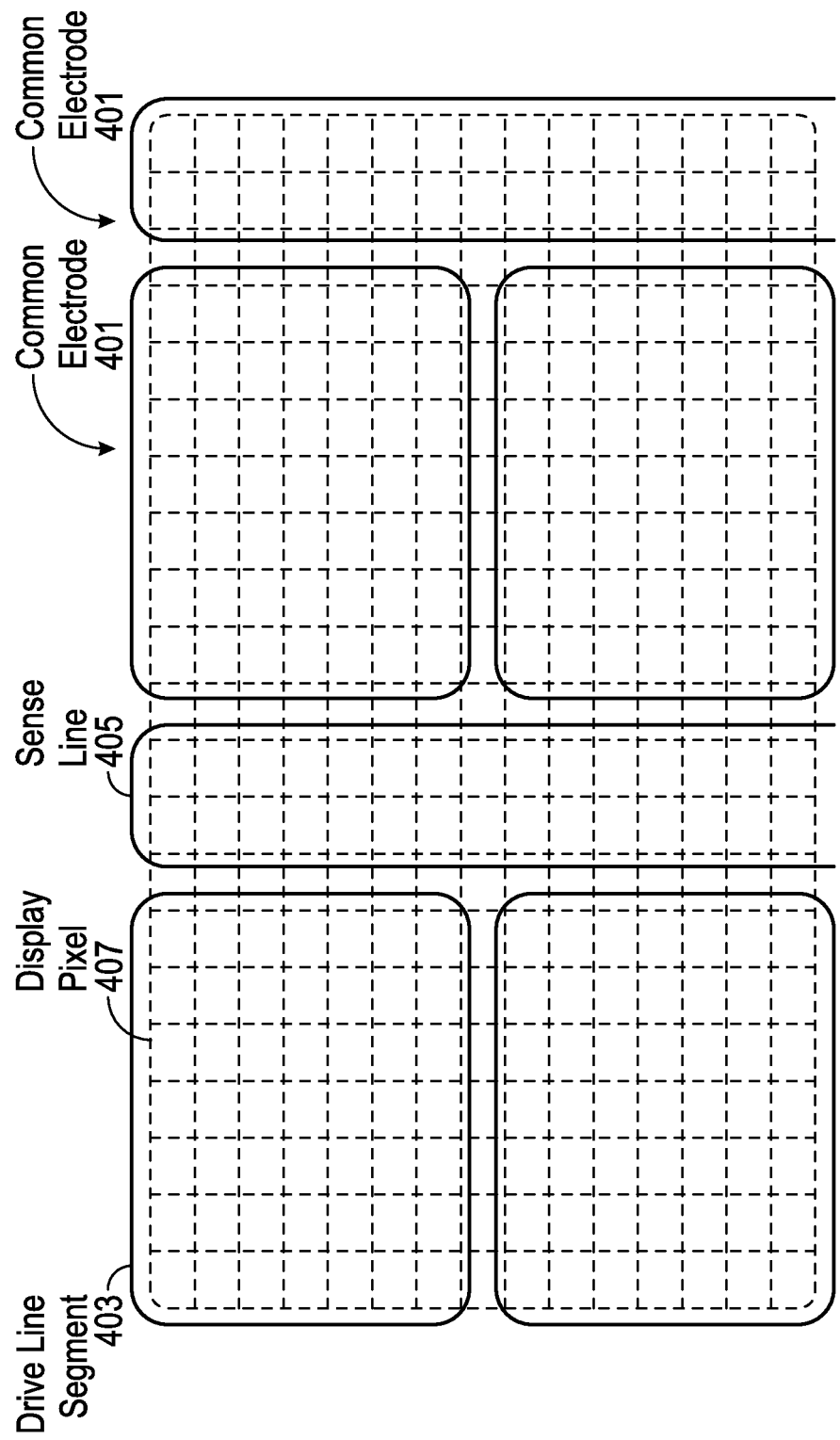
FIG. 4 illustrates an example configuration in which common electrodes can form portions of the touch sensing circuitry of a touch sensing system.

The circuit elements in touch screen 220 can include, for example, elements that can exist in AMOLED displays, as described above. It is noted that circuit elements are not limited to whole circuit components, such as a whole capacitor, a whole transistor, etc., but can include portions of circuitry, such as only one of the two plates of a parallel plate capacitor. FIG. 4 illustrates an example configuration in which common electrodes 401 can form portions of the touch sensing circuitry of a touch sensing system. Each display pixel 407 can include a portion of a common electrode 401, which is a circuit element of the display system circuitry in the pixel stackup (i.e., the stacked material layers forming the display pixels) of the display pixels of some types of AMOLED displays that can operate as part of the display system to display an image.

In the example shown in FIG. 4, each common electrode 401 can serve as a multi-function circuit element that can operate as display circuitry of the display system of touch screen 220 and can also operate as touch sensing circuitry of the touch sensing system. In this example, each common electrode 401 can operate as a common electrode of the display circuitry of the touch screen 220, and can also operate together when grouped with other common electrodes as touch sensing circuitry of the touch screen. For example, a common electrode 401 can operate as a capacitive part of a drive line (i.e., a drive line segment 403) or as a capacitive sense line 405 of the touch sensing circuitry during the touch sensing phase. Other circuit elements of touch screen 220 can form part of the touch sensing circuitry by, for example, switching electrical connections, etc. In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some examples, some of the circuit elements in the display pixel stackups can be multi-function circuit elements and other circuit elements may be single-function circuit elements. In other examples, all of the circuit elements of the display pixel stackups may be single-function circuit elements.

In addition, although examples herein may describe the display circuitry as operating during a display phase, and describe the touch sensing circuitry as operating during a touch sensing phase, it should be understood that a display phase and a touch sensing phase may be operated at the same time, e.g., partially or completely overlap, or the display phase and touch sensing phase may operate at different times. Also, although examples herein describe certain circuit elements as being multi-function and other circuit elements as being single-function, it should be understood that the circuit elements are not limited to the particular functionality in other examples. In other words, a circuit element that is described in one example herein as a single-function circuit element may be configured as a multi-function circuit element in other examples, and vice versa.

Multi-function circuit elements of display pixels of the touch screen can operate in both the display phase and the touch sensing phase. For example, during a touch sensing phase, common electrodes 401 can form touch signal lines, such as drive regions and sense regions. In some examples circuit elements can be grouped to form a continuous touch signal line of one type and a segmented touch signal line of another type. For example, FIG. 4 shows one example in which drive line segments 403 and sense lines 405 correspond to drive line segments 301 and sense lines 223 of touch screen 220. Other configurations are possible in other examples; for example, common electrodes 401 could be provided such that drive lines are each formed of a continuous drive region and sense lines are each formed of a plurality of sense region segments linked together through connections that bypass a drive region, as illustrated in the example of FIG. 3B.

The drive regions in the examples of FIGS. 3A and 4 are shown as rectangular regions including a plurality of display pixels, and the sense regions of FIGS. 3A, 3B, and 4 are shown as rectangular regions including a plurality of display pixels extending the vertical length of the AMOLED display. In some examples, a touch pixel of the configuration of FIG. 4 can include, for example, a 64×64 area of display pixels. However, the drive and sense regions are not limited to the shapes, orientations, and positions shown, but can include any suitable configurations according to examples of the disclosure. It is to be understood that the display pixels included in the touch pixels are not limited to those described above, but can be any suitable size or shape to permit touch capabilities according to examples of the disclosure.

Figure 5:
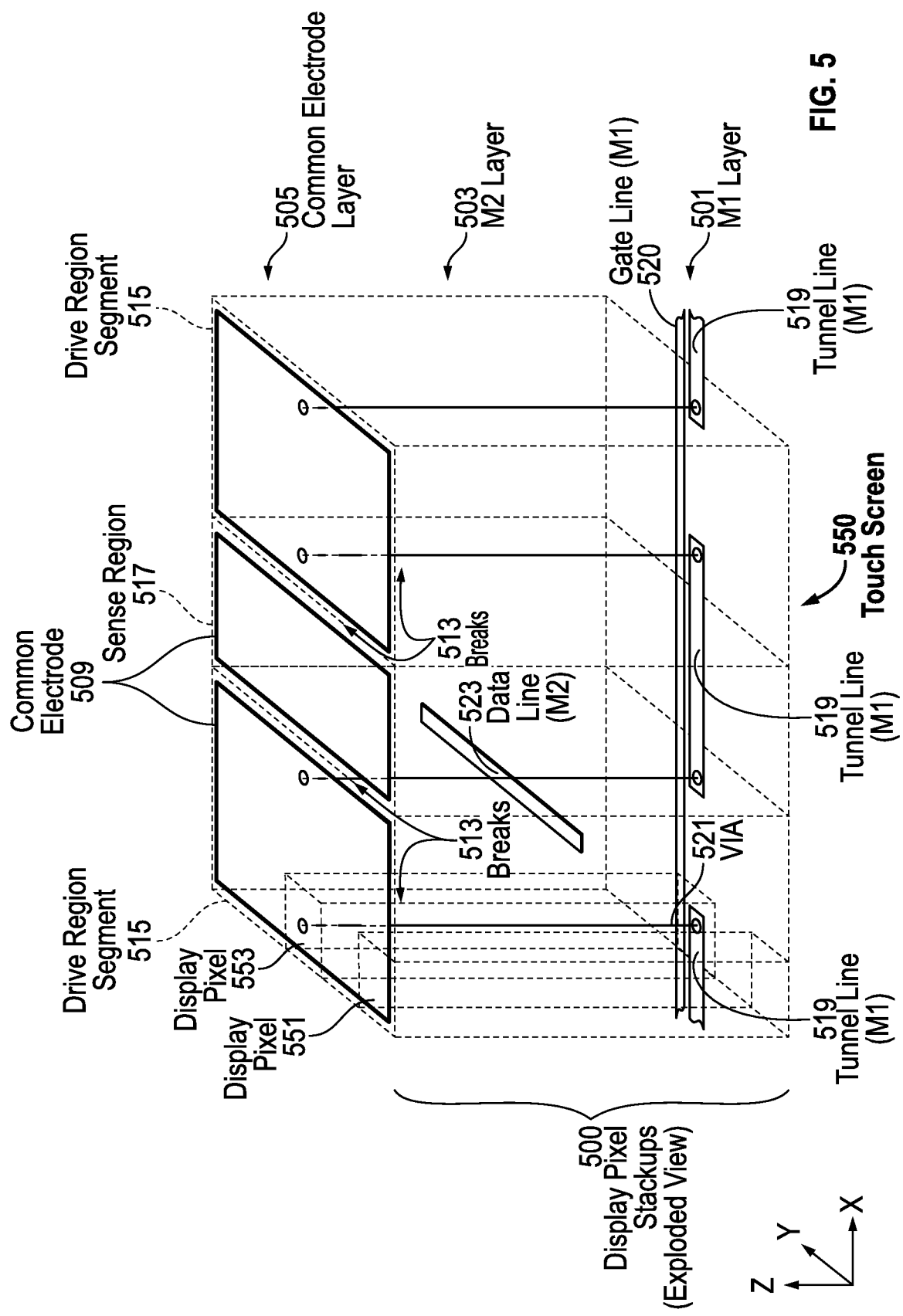
FIG. 5 is a three-dimensional illustration of an exploded view (expanded in the z-direction) of example display pixel stackups showing some of the elements within the pixel stackups of an example integrated touch screen.

FIG. 5 is a three-dimensional illustration of an exploded view (expanded in the z-direction) of example display pixel stackups 500 showing some of the elements within the pixel stackups of an example integrated touch screen 550. Stackups 500 can include a configuration of conductive lines that can be used to link drive region segments to form drive lines.

Stackups 500 can include elements in a first metal (M1) layer 501, a second metal (M2) layer 503, and a common electrode layer 505. Each display pixel can include a portion of a common electrode 509, such as common electrodes 401 in FIG. 4, that is formed in common electrode layer 505. In some display pixels, breaks 513 can be included in the common electrodes 509 to separate different segments of common electrodes to form drive region segments 515 and a sense region 517, such as drive line segments 403 and sense line 405, respectively. Breaks 513 can include breaks in the x-direction that can separate drive region segments 515 from sense region 517, and breaks in the y-direction that can separate one drive region segment 515 from another drive region segment. M1 layer 501 can include tunnel lines 519 that can electrically connect together drive region segments 515 through connections, such as conductive vias 521, which can electrically connect tunnel line 519 to the common electrode in drive region segment display pixels. Tunnel line 519 can run through the display pixels in sense region 517 with no connections to the common electrode 509 in the sense region, i.e., no vias 521 in the sense region. The M1 layer can also include gate lines 520. M2 layer 503 can include data lines 523. Only one gate line 520 and one data line 523 are shown for the sake of clarity; however, a touch screen can include a gate line running through each horizontal row of display pixels and multiple data lines running through each vertical row of display pixels, for example, one data line for each red, green, blue (RGB) color sub-pixel in each pixel in a vertical row of an RGB AMOLED display integrated touch screen. Although M1 layer 501 is shown to be below M2 layer 503, which is shown to be below common electrode layer 505, it is understood that the ordering of these layers in the z-direction, as well as the ordering of the elements in each of these layers, can differ from what is shown in FIG. 5. For example, the elements in M1 layer 501 (e.g., tunnel line 519 and gate line 520) can be in M2 layer instead, or can be distributed amongst different metal layers.

Structures such as tunnel lines 519 and conductive vias 521 can operate as a touch sensing circuitry of a touch sensing system to detect touch during a touch sensing phase of the touch screen 550. Structures such as data lines 523, along with other pixel stackup elements such as transistors, pixel electrodes, common voltage lines, data lines, etc. (not shown), can operate as display circuitry of a display system to display an image on the touch screen 550 during a display phase. Structures such as common electrodes 509 can operate as multifunction circuit elements that can operate as part of both the touch sensing system and the display system.

For example, in operation during a touch sensing phase, gate lines 520 can be held to a fixed voltage while stimulation signals can be transmitted through a row of drive region segments 515 connected by tunnel lines 519 and conductive vias 521 to form electric fields between the stimulated drive region segments and sense region 517 to create touch pixels, such as touch pixel 226 in FIG. 2. In this way, the row of connected-together drive region segments 515 can operate as a drive line, such as drive line 222, and sense region 517 can operate as a sense line, such as sense line 223. When an object such as a finger approaches or touches a touch pixel, the object can affect the electric fields extending between the drive region segments 515 and the sense region 517, thereby reducing the amount of charge capacitively coupled to the sense region. This reduction in charge can be sensed by a sense channel of a touch sensing controller connected to the touch screen 550, such as touch controller 206 shown in FIG. 2, and stored in a memory along with similar information of other touch pixels to create an "image" of touch.

Figure 6:
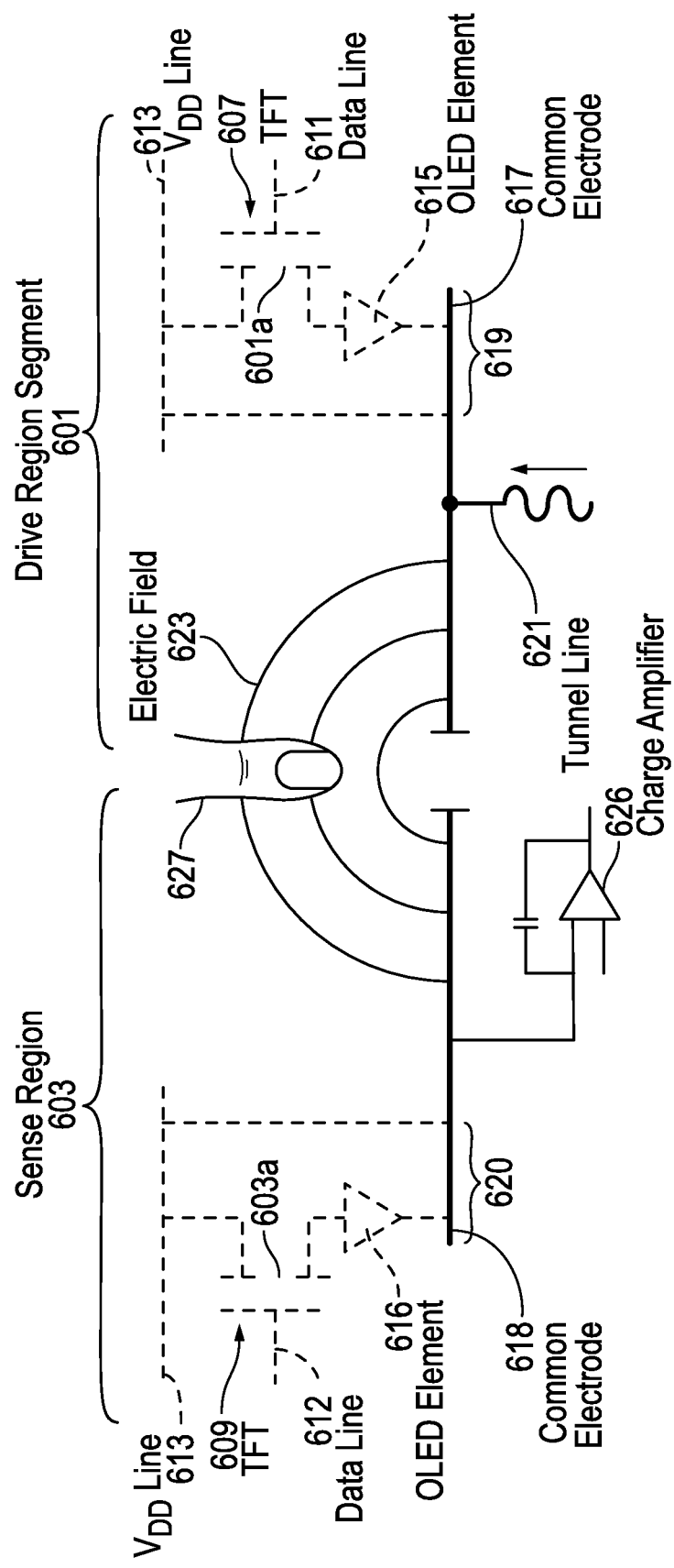
FIG. 6 shows partial circuit diagrams of some of the touch sensing circuitry within display pixels in a drive region segment and a sense region of an example touch screen according to examples of the disclosure.

A touch sensing operation according to examples of the disclosure will be described with reference to FIG. 6. FIG. 6 shows partial circuit diagrams of some of the touch sensing circuitry within display pixels in a drive region segment 601 and a sense region 603 of an example touch screen according to examples of the disclosure. For the sake of clarity, only one drive region segment is shown. Also for the sake of clarity, FIG. 6 includes circuit elements illustrated with dashed lines to signify some circuit elements operate primarily as part of the display circuitry and not the touch sensing circuitry. In addition, a touch sensing operation is described primarily in terms of a single display pixel 601a of drive region segment 601 and a single display pixel 603a of sense region 603. However, it is understood that other display pixels in drive region segment 601 can include the same touch sensing circuitry as described below for display pixel 601a, and the other display pixels in sense region 603 can include the same touch sensing circuitry as described below for display pixel 603a. Thus, the description of the operation of display pixel 601a and display pixel 603a can be considered as a description of the operation of drive region segment 601 and sense region 603, respectively.

Referring to FIG. 6, drive region segment 601 can include a plurality of display pixels including display pixel 601a. Display pixel 601a can include a transistor such as thin film transistor (TFT) 607, a data line 611, a $V_{DD}$ line 613, an LED element such as OLED element 615, and a portion 619 of common electrode 617. Sense region 603 can include a plurality of display pixels including display pixel 603a. Display pixel 603a can include a transistor such as TFT 609, a data line 612, an LED element such as OLED element 616, and a portion 620 of common electrode 618. TFT 609 can be connected to the same $V_{DD}$ line 613 as TFT 607.

During a touch sensing phase, OLED elements 615 and 616 can be maintained in an off state, the specifics of which will be described later. Drive signals can be applied to common electrode 617 through a tunnel line 621. The drive signals can generate an electric field 623 between common electrode 617 of drive region segment 601 and common electrode 618 of sense region 603, which can be connected to a sense amplifier, such as a charge amplifier 626. Electrical charge can be injected into common electrode 618 of sense region 603, and charge amplifier 626 can convert the injected charge into a voltage that can be measured. The amount of charge injected, and consequently the measured voltage, can depend on the proximity of a touch object, such as a finger 627, to the drive 601 and sense 603 regions. In this way, the measured voltage can provide an indication of touch on or near the touch screen.

Figure 7A:
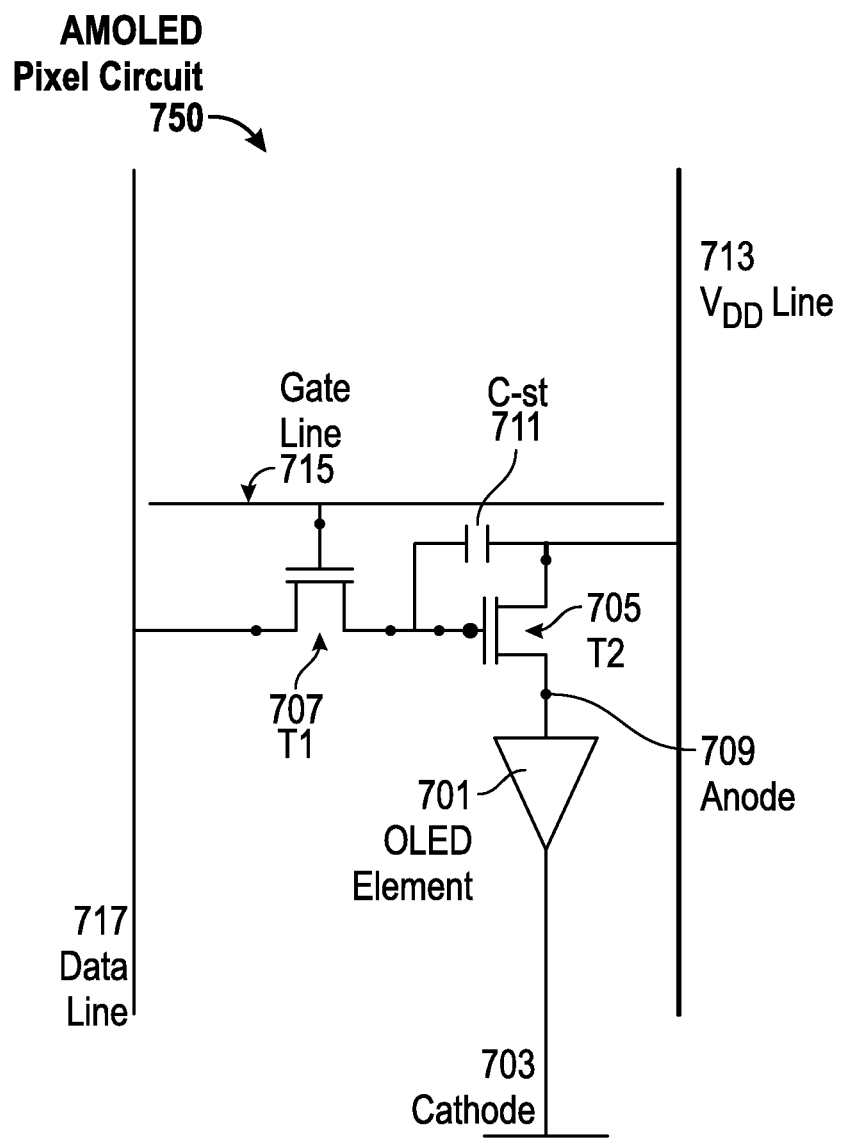
FIG. 7A illustrates an exemplary AMOLED pixel circuit that can be used in a regular top emission OLED display.

The operation of part of the display circuitry of the AMOLED touch screen during a display phase according to examples of the disclosure will be described with reference to FIGS. 7A-7C. FIG. 7A illustrates an exemplary AMOLED pixel circuit 750 that can be used in a regular top emission OLED display. The specifics of top emission and bottom emission OLEDs will be described later. The pixel circuit 750 can include an OLED element 701 having two terminals (a cathode 703 terminal and an anode 709 terminal), a p-type transistor such as TFT T2 705, and an n-type transistor such as TFT T1 707. The cathode 703 terminal of OLED element 701 can be electrically connected to cathode. Cathode 703 can be the signal line common to a plurality of pixel circuits in the touch screen, and can correspond to common electrode 401 or 509, for example. The anode 709 terminal of OLED element 701 can be electrically connected to anode. OLED element 701 can be connected to cathode 703 and anode 709 in such a way as to allow current to flow through OLED element when the voltage at anode is higher than the voltage at cathode (i.e., OLED element is on, or "forward biased"). OLED element 701 can emit light when it is on. When the voltage at anode 709 is lower than the voltage at cathode 703, substantially no current can flow through OLED element 701 (i.e., OLED element is off, or "reverse biased"). OLED element 701 can emit substantially no light when it is off.

Anode 709 can be electrically connected to the drain terminal of T2 705. The gate and source terminals of T2 705 can be capacitively coupled by way of capacitor $C_{st}$ 711, where one terminal of $C_{st}$ can be electrically connected to the gate terminal of T2 and the other terminal of $C_{st}$ can be electrically connected to the source terminal of T2. The source terminal of T2 705 can further be electrically connected to $V_{DD}$ 713. The gate terminal of T2 705 can further be electrically connected to the drain terminal of T1 707. The gate terminal of T1 can be electrically connected to gate line 715, and the source terminal of T1 can be electrically connected to data line 717.

Figure 7B:
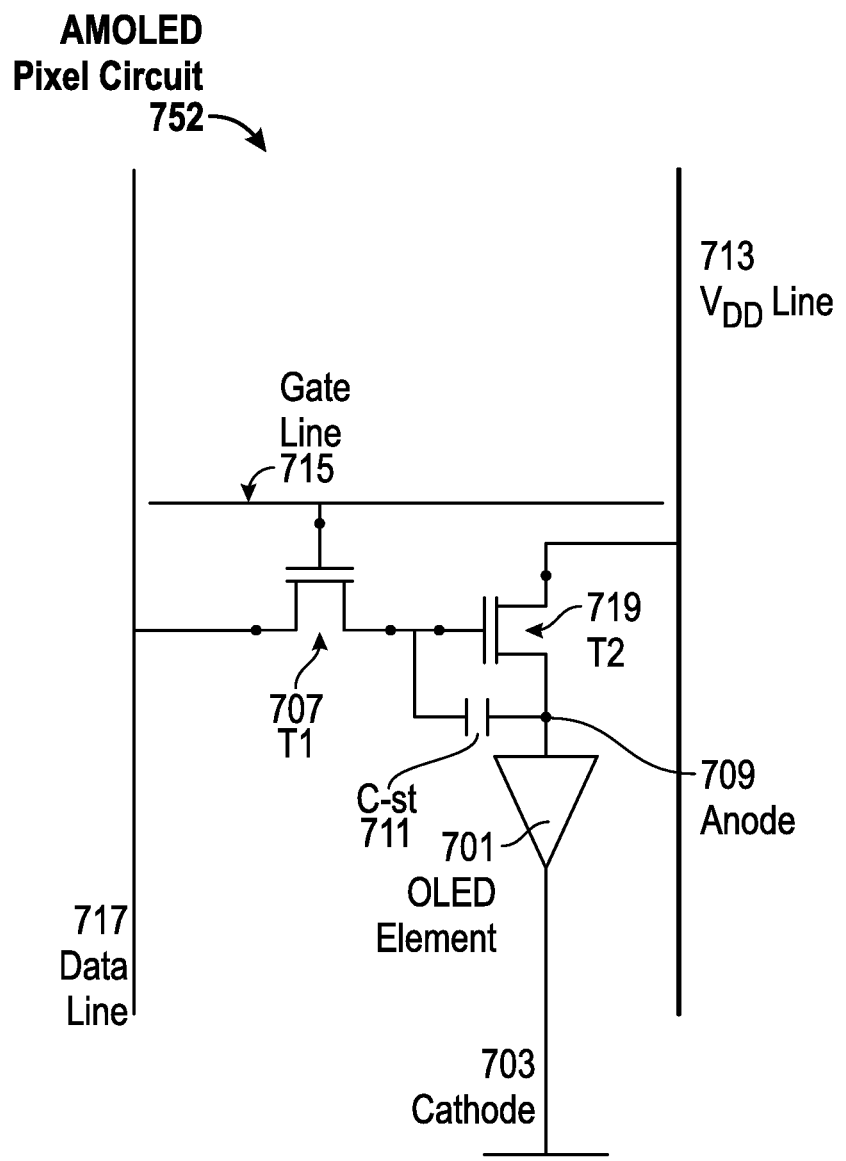
FIG. 7B illustrates another exemplary AMOLED pixel circuit that can be used in a regular top emission OLED display.

FIG. 7B illustrates another exemplary AMOLED pixel circuit 752 that can be used in a regular top emission OLED display. In FIG. 7B, T2 719 can be an n-type TFT instead of a p-type TFT as in FIG. 7A. Therefore, the source terminal of T2 719 can be electrically connected to anode 709, and the drain terminal of T2 can be electrically connected to $V_{DD}$ 713. The gate and source terminals of T2 719 can continue to be capacitively coupled by way of capacitor $C_{st}$ 711. The remaining elements of pixel circuit 752 can be the same as that of pixel circuit 750 in FIG. 7A.

Figure 7C:
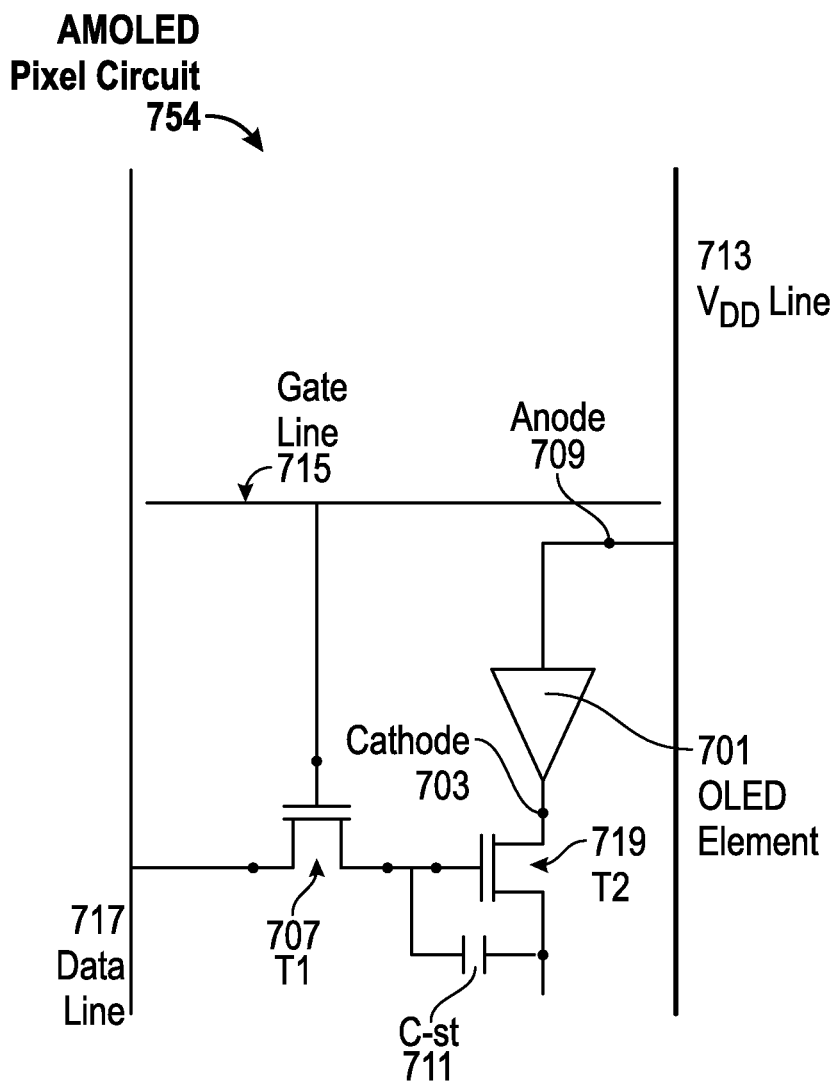
FIG. 7C illustrates an exemplary AMOLED pixel circuit that can be used in an inverted OLED display.

FIG. 7C illustrates an exemplary AMOLED pixel circuit 754 that can be used in an inverted OLED display. In the case of an inverted OLED display, the anode 709, and not the cathode 703, can be the common electrode, and the anode can be above the OLED element 701. The configuration of T2 719, $C_{st}$ 711, T1 707, and the other circuit elements can be the same as that in FIG. 7B. However, the cathode 703 terminal of OLED element 701 can be electrically connected to the drain terminal of T2 719, and the anode 709 terminal of OLED element can be electrically connected to $V_{DD}$ 713.

Referring to FIG. 7A, during a display phase of the touch screen according to the examples of the disclosure, OLED element 701 can be forward biased (and can thus have current flowing through it), and can be emitting light. To allow for current to flow through OLED element 701, the voltage at gate line 715 can be sufficiently high to turn on T1 707 (i.e., the gate to source voltage of T1 can be sufficiently high to turn on T1). When T1 707 is on, T1 can act substantially as a short-circuit and can cause the voltage at data line 717 to be substantially mirrored at the gate terminal of T2 705. The voltage at data line 717, and thus the voltage at the gate terminal of T2 705, can be sufficiently low to turn on T2 705 (i.e., the gate to source voltage of T2 can be sufficiently low to turn on T2). When T2 705 is on, T2 can act substantially as a short-circuit and can cause the voltage at $V_{DD}$ 713 to be substantially mirrored at anode 709. For OLED element 701 to be forward biased, the voltage at anode 709, and thus the voltage at $V_{DD}$ 713, can be higher than the voltage at cathode 703. When this occurs, OLED element 701 can be forward biased, can have current flowing through it, and can be emitting light. Although this description has been provided with respect to the circuit of FIG. 7A, it is understood that the operation of the circuits of FIGS. 7B and 7C is substantially similar to the operation of the circuit of FIG. 7A. Further, for the sake of clarity, the examples below will be provided with respect to the structure of the circuit of FIG. 7A; however, it is understood that the examples may be adapted to be used with the circuits of FIGS. 7B and 7C. For example, whereas the voltage at the gate terminal of a p-type TFT can be sufficiently low to turn on the p-type TFT, the opposite can be true for an n-type TFT; that is, the voltage at the gate terminal of an n-type TFT can be sufficiently high to turn on the n-type TFT. This modification can be extended to the circuits of FIGS. 7B and 7C to allow for proper operation.

To facilitate the operation of the AMOLED touch screen according to examples of the disclosure, portions of the display circuitry of the touch screen can be turned off during a touch sensing phase of the touch screen, and can be turned on during a display phase of the touch screen. Exemplary turn-off operations will be described with reference to FIGS. 8 and 9A-9C. Although FIGS. 8 and 9A-9C are provided with display circuits that utilize a p-type TFT, as shown in FIG. 7A, it is understood that the circuits of FIGS. 7B and 7C can be similarly utilized in the structures of FIGS. 8 and 9A-9C.

Figure 8A:
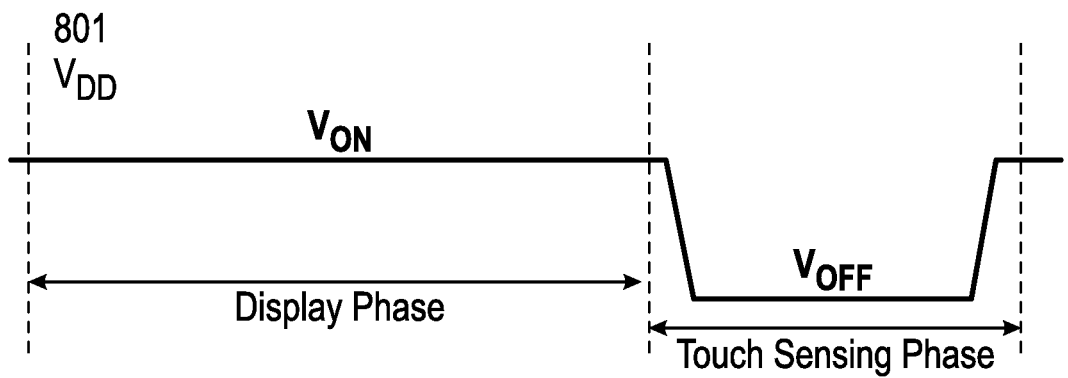
FIGS. 8A and 8B illustrate an exemplary AMOLED pixel circuit configuration and operation for turning on and off an OLED element during touch sensing and display phases of the touch screen of the disclosure.
Figure 8B:
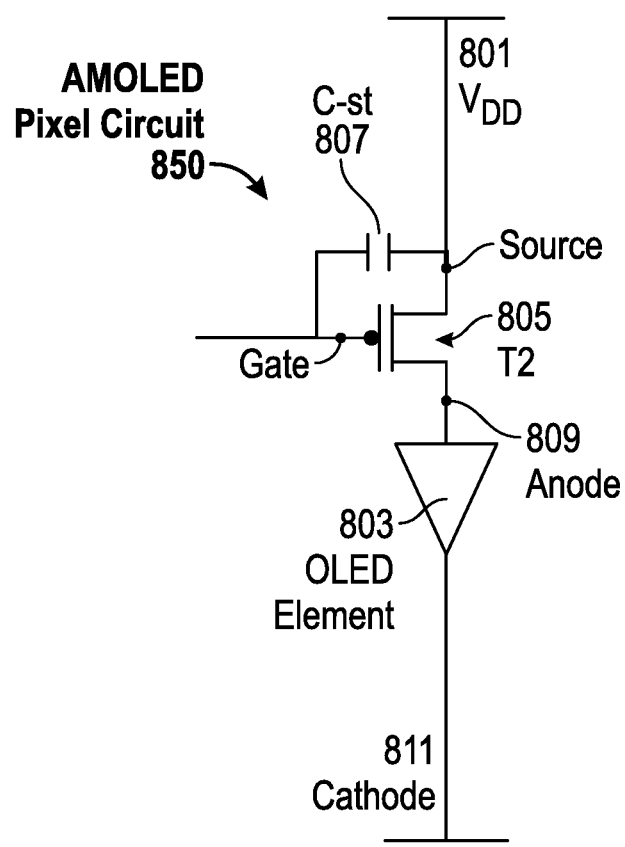

FIGS. 8A and 8B illustrate an exemplary AMOLED pixel circuit 850 configuration and operation for turning on and off an OLED element during touch sensing and display phases of the touch screen of the disclosure. The circuit configuration of FIGS. 8A and 8B is that of FIG. 7A, and a partial circuit diagram of the circuit of FIG. 7A is provided in FIG. 8B. FIG. 8A illustrates the voltage at $V_{DD}$ 801 during a transition from a pixel circuit ON phase to a pixel circuit OFF phase. During the pixel circuit ON phase, the voltage at $V_{DD}$ 801 can be $V_{ON}$. $V_{ON}$ can be sufficiently high, as described with reference to FIG. 7A, such that OLED element 803 can be forward biased. All of the other voltages of the circuit can be set such that the circuit operates as described with reference to FIG. 7A.

To transition to a touch sensing phase in which OLED element 803 can be off, the voltage at gate line 711 (not shown in FIG. 8B) of FIG. 7A can be sufficiently low to turn off T1 707 (not shown in FIG. 8B). This can result in the voltage at the gate terminal of T2 805 to be floating. Because the gate terminal of T2 805 can be capacitively coupled to the source terminal of T2 by way of $C_{st}$ 807, the difference between the gate and source voltages of T2 can remain substantially constant as long as the gate of T2 is floating (i.e., $C_{st}$ can substantially maintain the gate to source voltage of T2). Therefore, T2 805 can remain on irrespective of the voltage at $V_{DD}$ 801.

Because T2 805 can remain on irrespective of the voltage at $V_{DD}$ 801, the voltage at $V_{DD}$ can be lowered from $V_{ON}$ to $V_{OFF}$ while maintaining T2 in an on state. Because T2 805 can remain on, it can behave substantially like a short-circuit, and therefore the voltage at $V_{DD}$ 801 can be substantially mirrored at anode 809. If $V_{OFF}$ is less than the voltage at cathode 811, OLED element 803 can be reverse biased, as described previously. As such, OLED element 803 can be off, and can emit substantially no light, thus turning off pixel circuit 850.

During a touch sensing phase, when pixel circuit 850 is off, cathode 811 can be utilized as part of the touch sensing circuitry (i.e., as part of common electrode 617), as described with reference to FIG. 6. The voltage at $V_{DD}$ 801 during the touch sensing phase ($V_{OFF}$) can be sufficiently low such that through the range of voltages that can exist at cathode 811 during the touch sensing phase, OLED element 803 can remain reverse biased, and thus off. For example, if the voltage at cathode 811 during the touch sensing phase can vary from −5V to +5V, $V_{OFF}$ can be less than −5V to ensure that OLED element 803 can remain reverse biased. To transition from an off state back to an on state, the steps described above can be reversed such that display phase operation can resume.

Figure 9C:
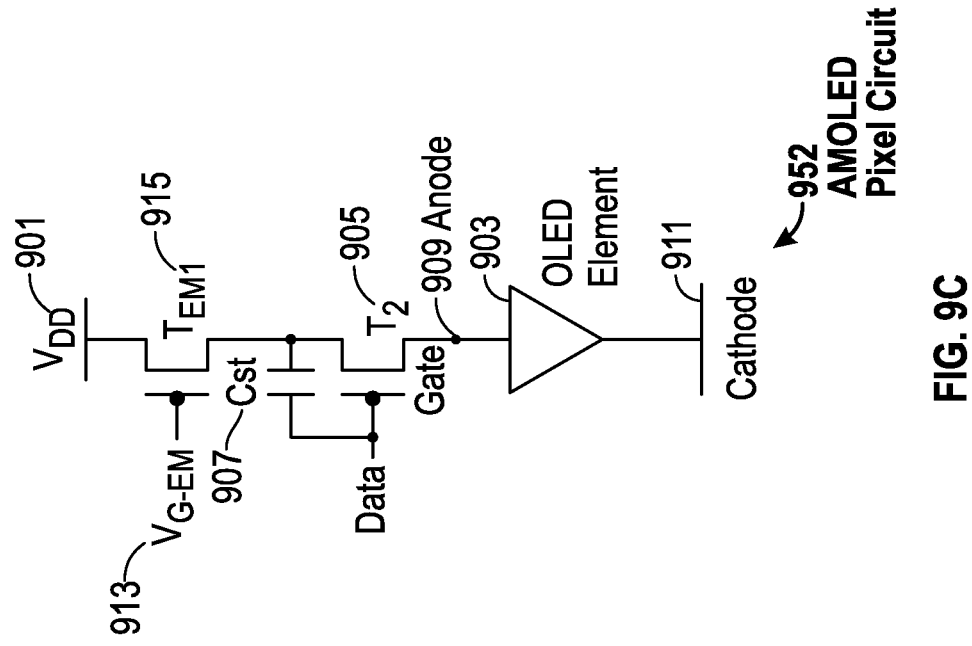
Figure 9B:
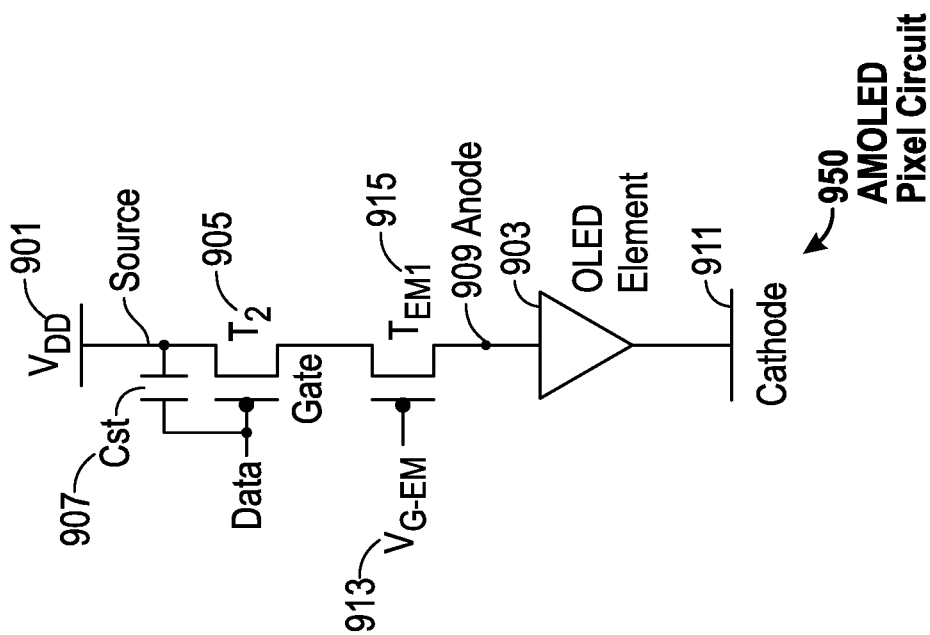

FIGS. 9A-9D illustrate further exemplary AMOLED pixel circuit configurations and operations for turning on and off an OLED element during touch sensing and display phases of the touch screen of this disclosure. The AMOLED pixel circuit 950 of FIG. 9B is that of FIG. 7A, except that an additional p-type TFT $T_{EM1}$ 915 can be electrically connected in series with T2 905 and OLED element 903, positioned between T2 and OLED element. During a display phase of the touch screen, the voltage at the gate terminal of $T_{EM1}$ 915 ($V_{G-EM}$ 913) can be sufficiently low such that $T_{EM1}$ can be on. When on, $T_{EM1}$ 915 can act substantially as a short-circuit and may not substantially affect the current flowing through OLED element 903. The remaining elements of the pixel circuit 950 can operate as described with reference to FIG. 7A. Turning OLED element 903 off (i.e., stopping current flow through OLED element) during a touch sensing phase of the touch screen can be accomplished by setting the voltage at $V_{G-EM}$ 913 to be sufficiently high such that $T_{EM1}$ 915 can be off. When off, $T_{EM1}$ 915 can act substantially as an open-circuit, thus substantially preventing current flow through OLED element 903. This, in turn, can result in OLED element 903 turning off. In this way, the voltage at $V_{DD}$ 901 need not be regulated as described with reference to FIG. 8 to turn off the pixel circuit 950. FIG. 9A illustrates the voltage at $V_{G-EM}$ 913 during a display phase and a touch sensing phase of the touch screen.

Figure 9D:
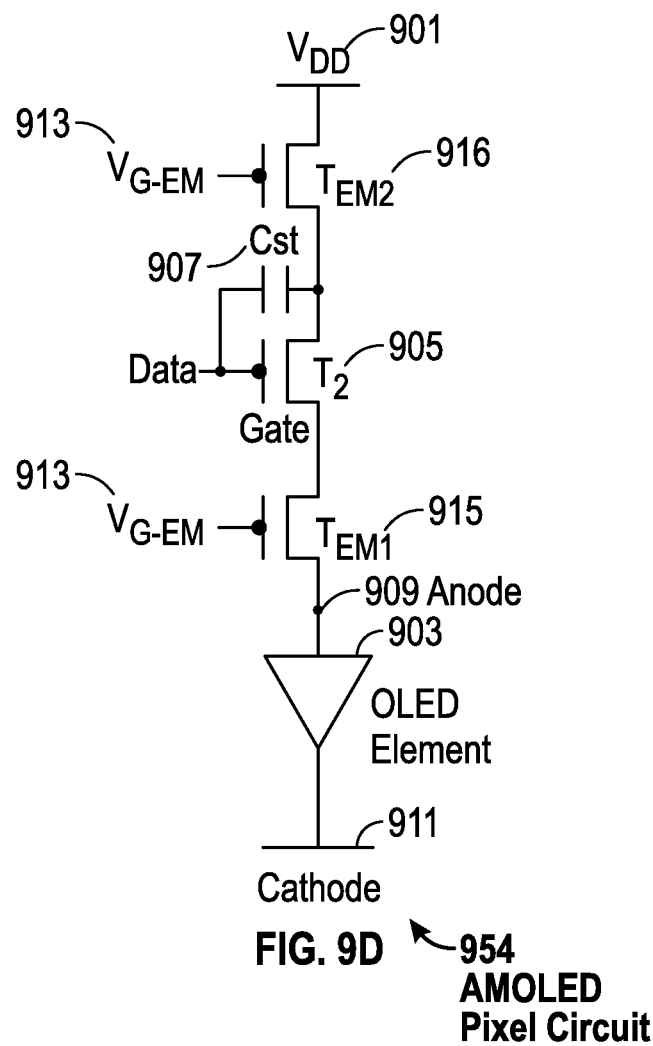

FIGS. 9C and 9D illustrate alternative configurations of the pixel circuit of FIG. 9B, but can operate in substantially the same manner. In FIG. 9C, $T_{EM1}$ 915 can be positioned between $V_{DD}$ 901 and T2 905, instead of between T2 and OLED element 903; however, the pixel circuit 952 of FIG. 9C can otherwise operate in the same manner as the circuit of FIG. 9B. FIG. 9D illustrates a pixel circuit 954 that has two p-type TFTs electrically connected in series with T2 905: $T_{EM1}$ 915 and $T_{EM2}$ 916. $T_{EM1}$ 915 can be positioned between T2 905 and OLED element 903, and $T_{EM2}$ 916 can be positioned between T2 and $V_{DD}$ 901. During a touch sensing phase of the touch screen, $T_{EM1}$ 915 and $T_{EM2}$ 916 can be turned off in the manner described above with reference to FIG. 9B. During a display phase of the touch screen, $T_{EM1}$ 915 and $T_{EM2}$ 916 can be turned on in the manner described above with reference to FIG. 9B.

Although $T_{EM1}$ 915 and $T_{EM2}$ 916 have been described as being p-type transistors such as TFTs, it is understood that either or both can instead be n-type TFTs, in which case the voltages required to turn them on and off would be the reverse of what was described above. That is to say, if $T_{EM1}$ 915 were an n-type TFT, the voltage needed at $V_{G-EM}$ 913 to turn on $T_{EM1}$ would be high, and the voltage needed at $V_{G-EM}$ to turn off $T_{EM1}$ would be low. The appropriate changes to the operation described above can be made to allow for the proper operation of the pixel circuits described.

The examples of this disclosure can be implemented in many types of LED displays, including both top emission OLED displays and bottom emission OLED displays. In bottom emission OLED displays, the transistors such as TFTs, metal routing, capacitors and OLED layers can share area on the substrate glass. Because the OLED layers can share space with the TFTs, the metal routing, and the capacitors, the remaining area for use by the OLED layers can be limited. This can result in small-area OLED layers, which can require high driving current densities to generate sufficient OLED light emission. In top emission OLED displays, the OLED layers can be formed on top of the TFT layers, which can provide the OLED layers with fewer area restrictions as compared with bottom emission OLED displays. Thus, lower driving current densities can be required to generate sufficient OLED light emission.

Figure 10:
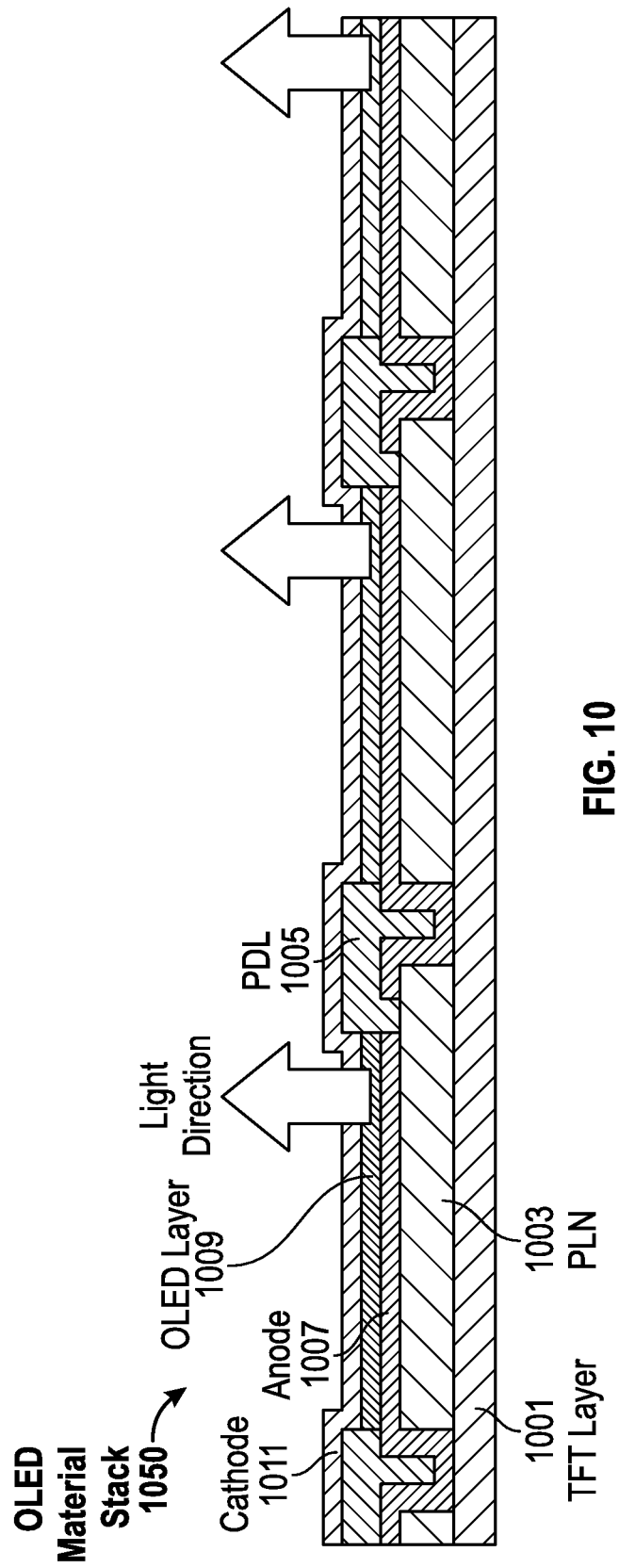
FIG. 10 illustrates an exemplary top emission OLED material stack according to examples of the disclosure.

FIG. 10 illustrates an exemplary top emission OLED material stack 1050 according to examples of the disclosure. TFT layer 1001 can include various circuit elements of the pixel circuits of FIG. 7, 8 or 9, including T2 905, $T_{EM1}$ 915 or $T_{EM2}$ 916. PLN 1003 can be a planarization layer for electrically isolating the circuit elements of TFT layer 1001 from the layers above, and for providing a substantially flat layer for facilitating the fabrication of the layers above it. Anode 1007 can provide an electrical connection between the circuit elements of TFT layer 1001 and OLED layer 1009. Anode 1007 can correspond to anode 709, 809, and/or 909. OLED layer 1009 can correspond to OLED element 616, 701, 803 and/or 903. PDL 1005 can be a layer for electrically isolating adjacent anodes 1007 and OLED layers 1009. Finally, cathode 1011 can provide an electrical connection to OLED layers 1009, and can correspond to cathode 703, 811 and/or 911, for example. Anode 1007 and cathode 1011 can be formed of conductive materials; for example, cathode can be formed of many different types of transparent conductive materials, such as Indium Tin Oxide (ITO) or Indium Zinc Oxide (IZO). During a display phase of the touch screen, when current is flowing from TFT layer 1001, through anode 1007 and OLED layer 1009, to cathode 1011, OLED layer can be on, and can emit light through cathode to display an image on the touch screen.

To facilitate the operation of the examples of this disclosure, it can be desired that the cathode 1011 of FIG. 10 be patterned such that, during a touch sensing phase, cathode can operate as distinct drive and sense segments, and during a display phase, cathode can operate as a common electrode for the pixel circuits of the touch screen. Therefore, it can be necessary to electrically isolate portions of cathode 1011 to form segments such as drive line segment 301 and sense line 223 as shown in FIG. 3A, while also providing for electrical connections, such as drive links 303, between adjacent drive line segments to form drive lines 222. However, OLED layer 1009 underneath cathode 1011 can be sensitive to processing steps taken subsequent to the forming of cathode, which can make it difficult to pattern cathode as described above. FIGS. 11-17 illustrate various ways to provide the structure of the above-described cathode.

Unless otherwise noted, the opening of vias or the removal of material in the exemplary processes of the disclosure can be accomplished by a combination of photolithography and etching. Photolithography can be used to define the desired etch pattern on the surface of the material to be patterned, and the etching of the material in accordance with the desired etch pattern can remove the desired portions of the material. The etching of the material can be performed by utilizing any appropriate etch process, including but not limited to dry etching or wet etching. Further, unless otherwise noted, the deposition or formation of material can be accomplished by any appropriate deposition process, including but not limited to physical vapor deposition (PVD), chemical vapor deposition (CVD), electrochemical deposition (ECD), molecular beam epitaxy (MBE), or atomic layer deposition (ALD).

Figure 11A:
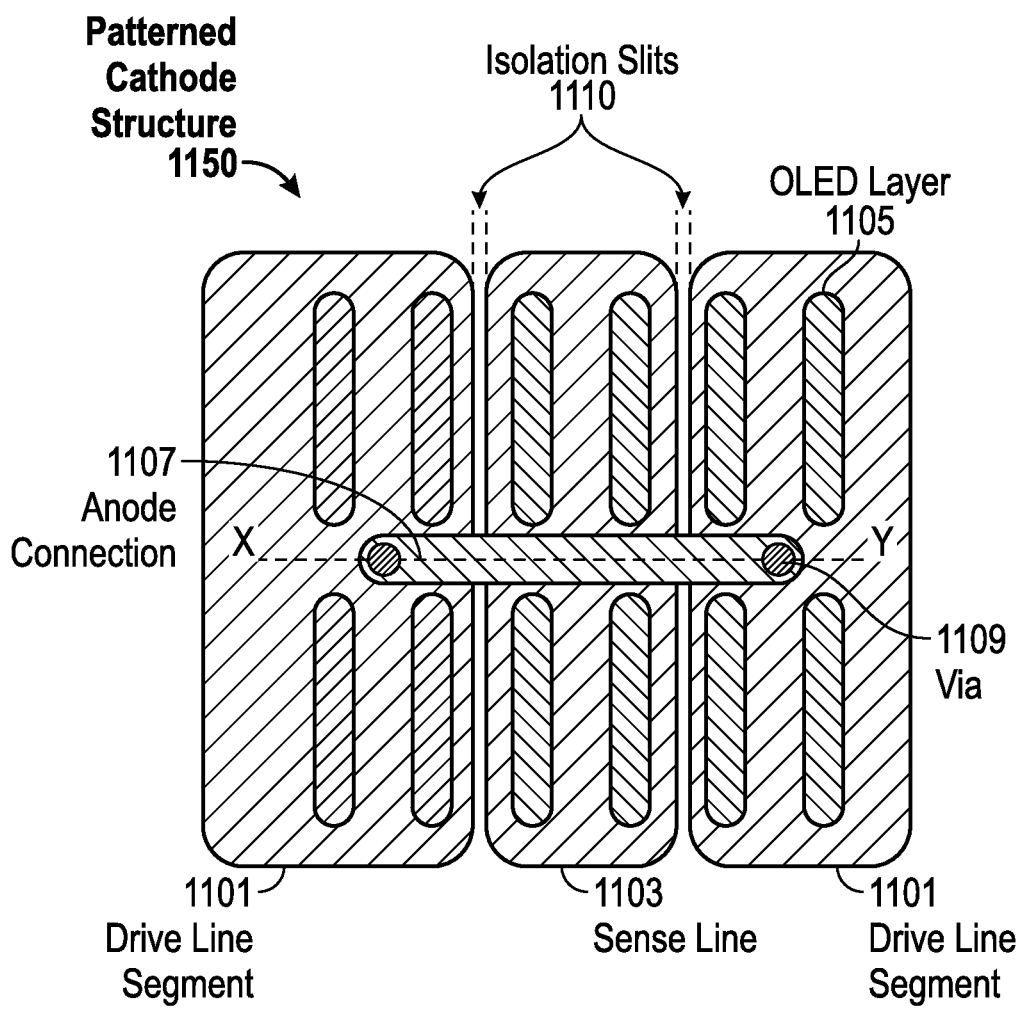

FIGS. 11A and 11B illustrate an exemplary process for patterning the cathode layer according to examples of the disclosure. FIG. 11A shows a top-view of a patterned cathode structure 1150 in accordance with examples of the disclosure. Drive line segments 1101 can be on either side of sense line 1103, and can be electrically isolated from sense line by isolation slits 1110. Both drive line segments 1101 and sense line 1103 can be formed of cathode 1011 of FIG. 10. OLED layers 1105 can be underneath drive line segments 1101 and sense line 1103, and can correspond to OLED layers 1009 of FIG. 10. Drive line segments 1101 can be electrically connected to each other by way of anode connection 1107. Anode connection 1107 can be formed of anode 1007 of FIG. 10, and can be positioned in between adjacent OLED layers 1105 so as to not overlap any OLED layers. Anode connection 1107 can be electrically connected to drive line segments 1101 by way of vias 1109. The process steps for fabricating the patterned cathode structure 1150 of FIG. 11A will be described with reference to FIG. 11B, which illustrates a cross-sectional view of cross-section X-Y at each process step.

Figure 13A:
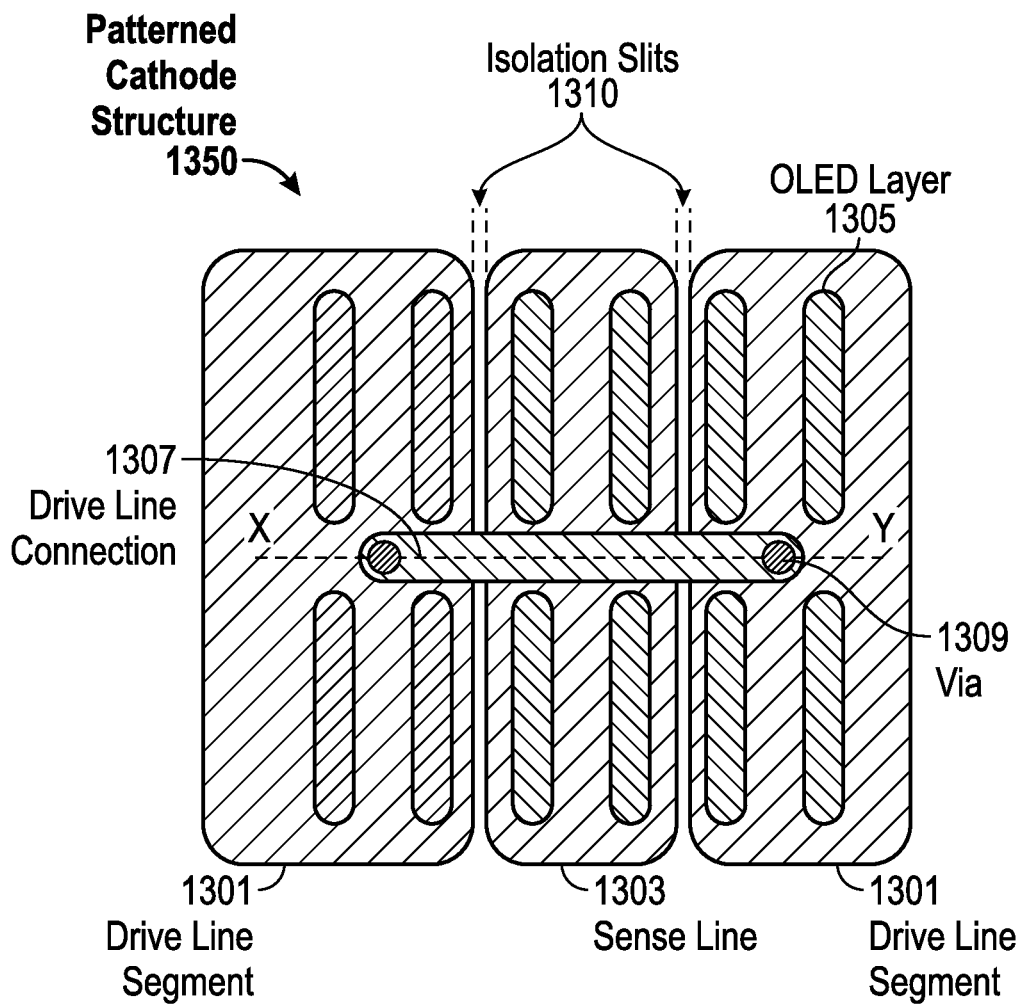
Figures 1, 13B:
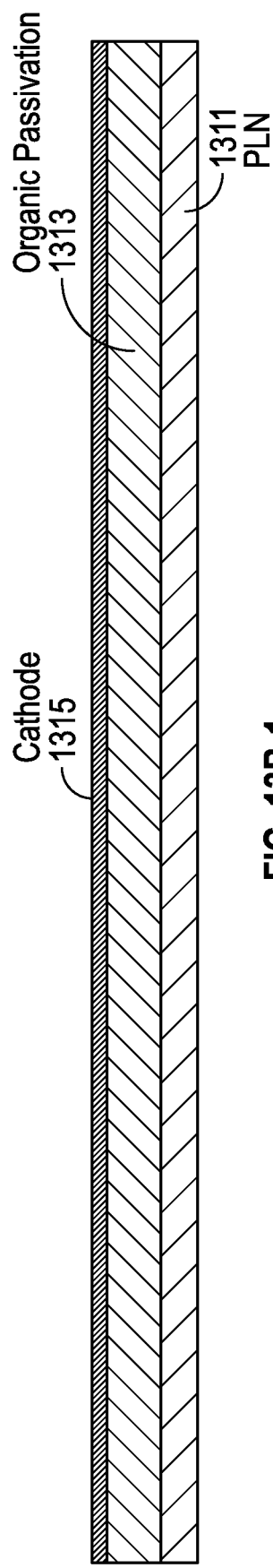
Figures 2, 13B:
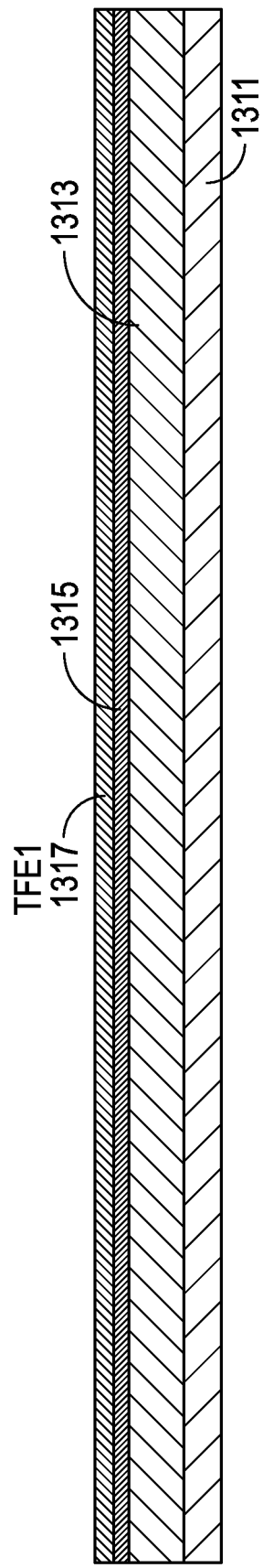
Figures 5, 13B:
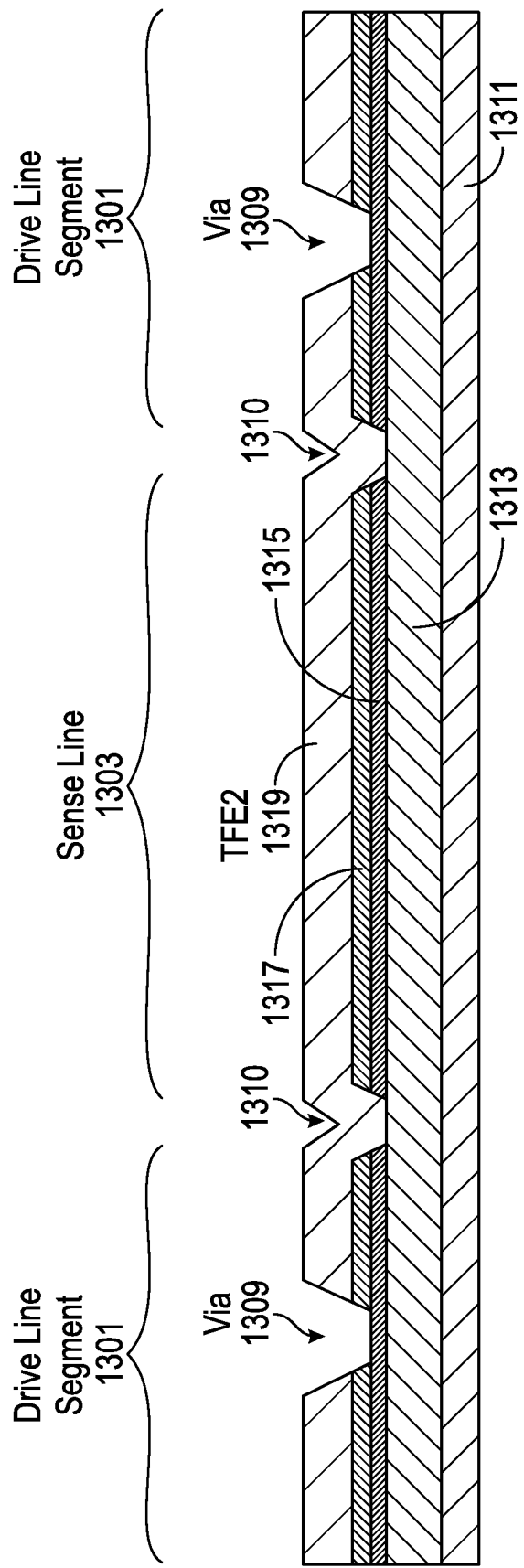
Figures 6, 13B:
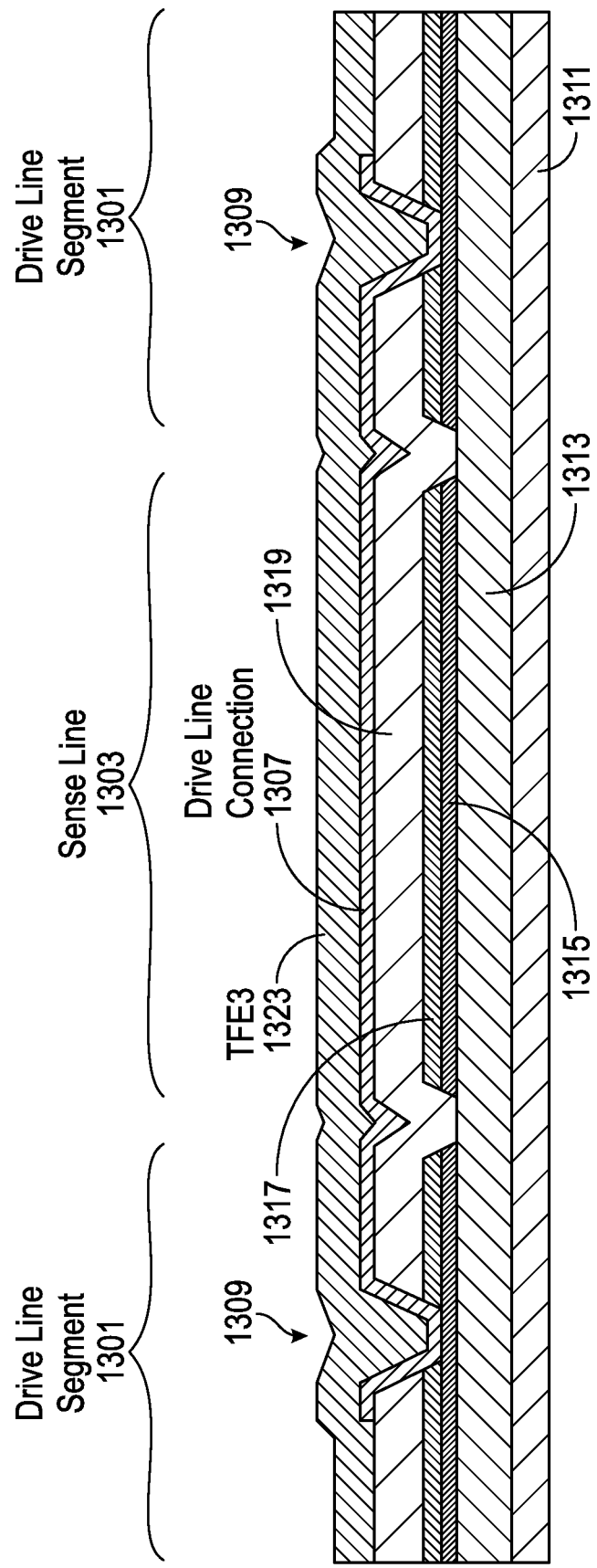

FIG. 11B-1 illustrates the first step of the example process. Anode connection 1107 can be formed on PLN 1111. Anode connection 1107 can be formed at the same time, and of the same material, as anode 1007 of FIG. 10, but can be electrically isolated from anode 1007 and can be in a different area of the touch screen (namely, not overlapping OLED layers 1105). Organic passivation 1113 can be formed on anode connection 1107, and vias 1109 can be opened to allow for connection to anode connection 1107. OLED layers 1105 can be formed in other areas of the touch screen (as shown in FIG. 11A, not shown in FIG. 11B). Finally, cathode 1115 can be blanket deposited in vias 1109 and over organic passivation 1113.

FIG. 11B-2 illustrates the next step of the example process. A thin film encapsulation layer TFE1 1117 can be formed on cathode 1115. Thin film encapsulation layers like TFE1 1117, with good barrier properties, can protect OLED layers 1105 that are below them from subsequent process steps, such as photolithography and etching. Here, TFE1 1117 can protect OLED layers 1105 from the next steps in the process.

Figures 1, 16A:
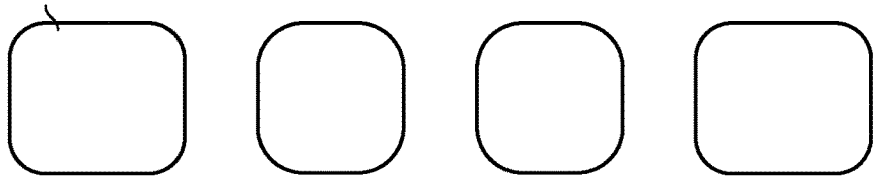
Figures 2, 16A:
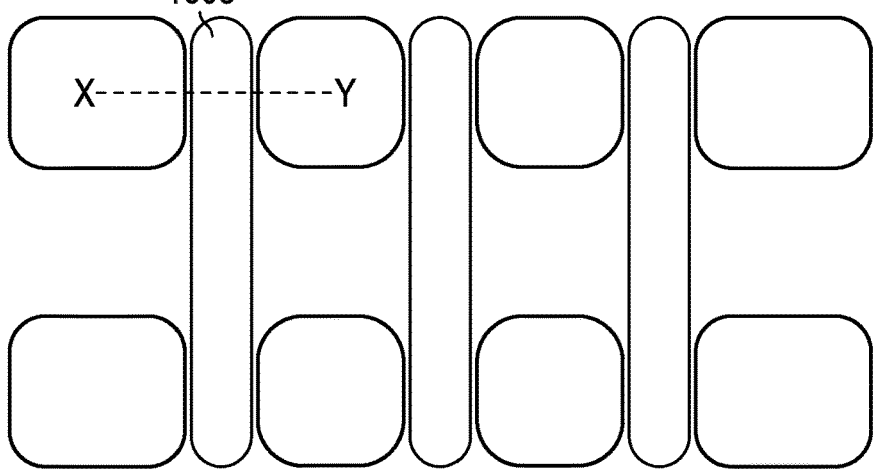
Figures 3, 16A:
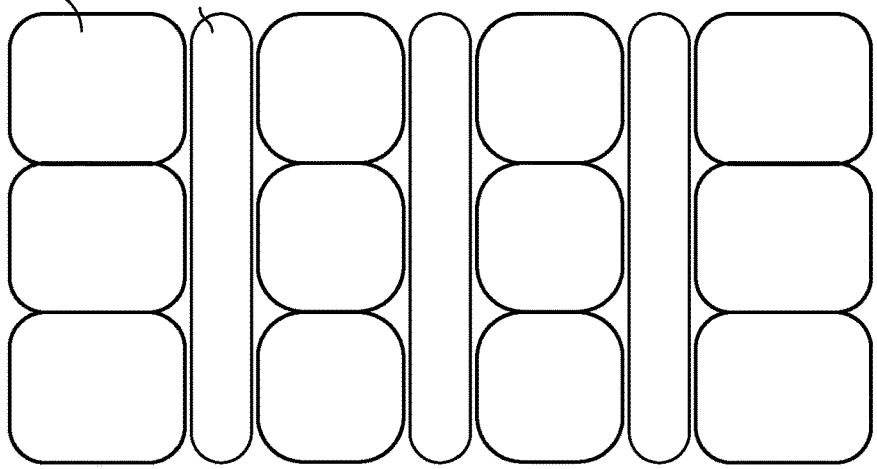

FIG. 11B-3 illustrates the next step of the example process. TFE1 1117 can be etched to partially open isolation slits 1110. OLED layers 1105 in other areas of the touch screen can be protected from the etching of TFE1 1117 at isolation slits 1110 because of the coverage of TFE1 in those areas.

FIG. 11B-4 illustrates the next step of the example process. Cathode 1115 can be etched to complete the opening of isolation slits 1110. With the etching of cathode 1115 in this step, drive line segments 1101 and sense line 1103 can be defined, and drive line segments 1101 can be electrically isolated from sense line 1103 because of the removal of conductive cathode material between drive line segments and sense line. As described above, OLED layers 1105 in other areas of the touch screen can be protected from the etching of cathode 1115 at isolation slits 1110 because the coverage of TFE1 1117 in those areas can protect OLED layers.

FIG. 11B-5 illustrates the final step of the example process. Thin film encapsulation layer TFE2 1119 can be blanket deposited as a final protective layer over the material stack. As shown, drive line segments 1101 can be electrically connected to each other through vias 1109 and anode connection 1107. Drive line segments 1101 can be electrically isolated from sense line 1103 by isolation slits 1110. By way of the above-described process, the fabrication of the drive and sense line structure of FIG. 3A, over OLED layers, can be accomplished.

Although the steps of the above process have been presented in a particular order, it is understood that the ordering of the process steps can be modified, where appropriate. Such modification can also be done for the processes presented in the remainder of the disclosure.

Figure 12A:
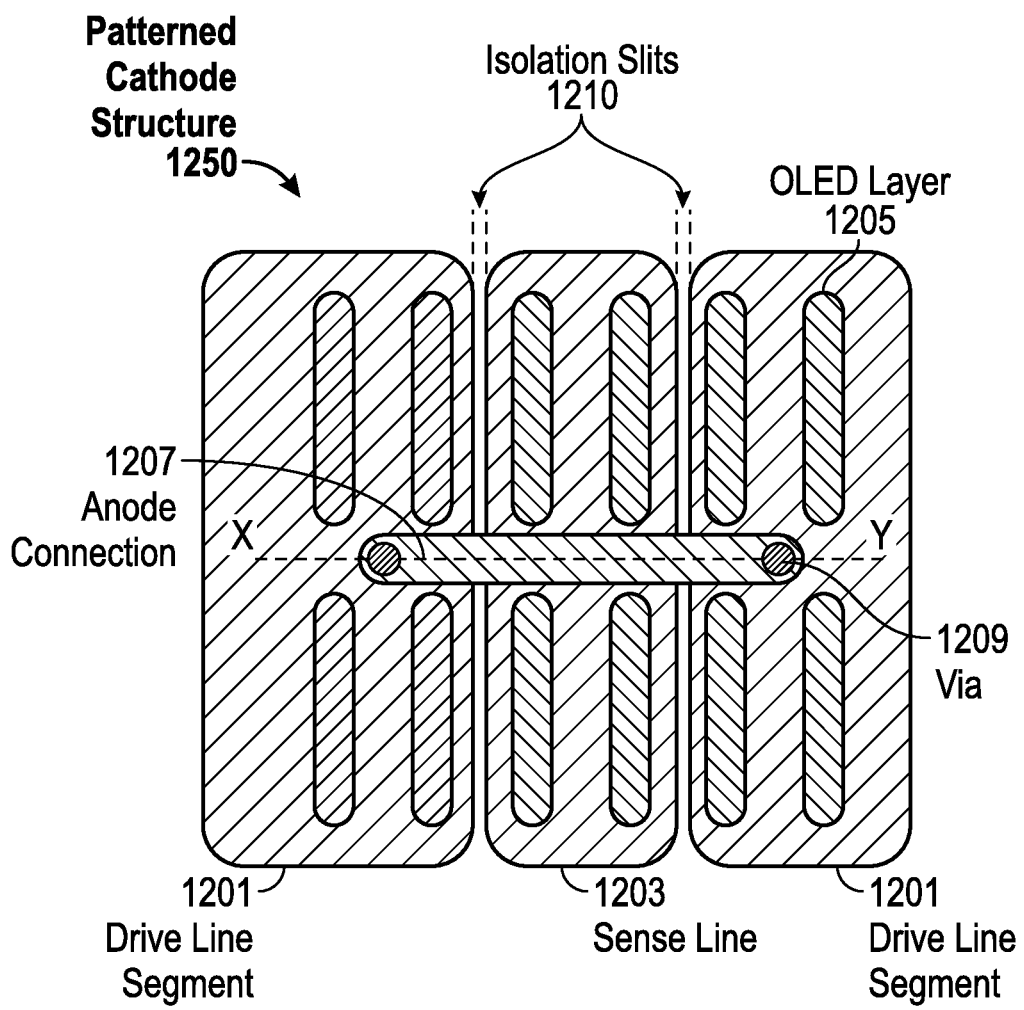
Figures 4, 12B:
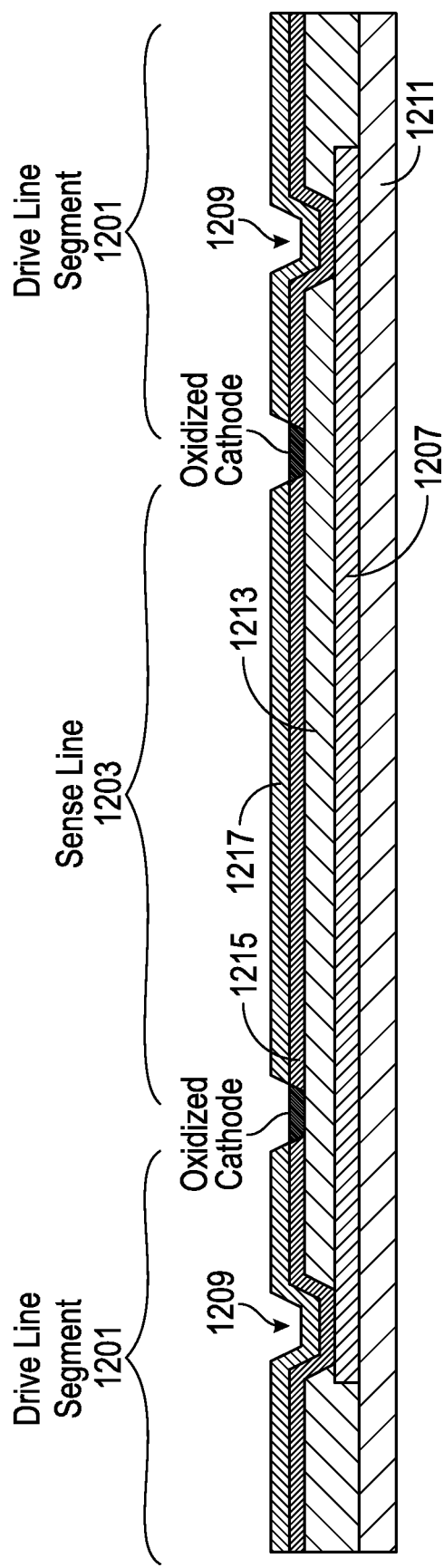

FIGS. 12A and 12B illustrate another exemplary process for patterning the cathode layer according to examples of the disclosure. FIG. 12A shows the same top-view of a patterned cathode structure 1250 as shown in FIG. 11A. The process steps of FIG. 12B can be the same as those of FIG. 11B, except that in FIG. 12B-4, cathode 1215 can be oxidized, instead of etched, at isolation slits 1210. Oxidization of an electrically conductive material such as cathode 1215 can reduce the conductivity of the material to substantially to that of an electrical insulator. Therefore, oxidization of cathode 1215 at isolation slits 1210 can electrically isolate adjacent portions of cathode, and can thus form drive line segments 1201 and sense line 1203. In all other respects, the process of FIG. 12 can be the same as the process of FIG. 11.

FIGS. 13A and 13B illustrate another exemplary process for patterning the cathode layer according to examples of the disclosure. Instead of electrically connecting adjacent drive line segments 1301 by way of an electrical connection formed underneath the cathode 1315 of the touch screen, adjacent drive line segments can be electrically connected by way of an electrical connection formed over the cathode of the touch screen. FIG. 13A shows the same top-view of a patterned cathode structure 1350 as shown in FIG. 11A. FIB. 13B shows the process steps that can be performed to form the patterned cathode structure 1350 of FIG. 13A at cross-section X-Y.

FIG. 13B-1 illustrates the first step of the example process. Organic passivation 1313 can be formed on PLN 1311. OLED layers 1305 can be formed in other areas of the touch screen (as shown in FIG. 13A, not shown in FIG. 13B). Finally, cathode 1315 can be blanket deposited to cover organic passivation 1313.

FIG. 13B-2 illustrates the next step of the example process. Thin film encapsulation layer TFE1 1317 can be deposited over cathode 1315. TFE1 1317 can protect OLED layers 1305 from the next steps in the process.

FIG. 13B-3 illustrates the next step of the example process. TFE1 1317 can be etched to partially open isolation slits 1310. OLED layers 1305 in other areas of the touch screen can be protected from the etching of TFE1 1317 because the coverage of TFE1 in those areas can protect OLED layers.

FIG. 13B-4 illustrates the next step of the example process. Cathode 1315 can be etched to complete the opening of isolation slits 1310. With the etching of cathode 1315 in this step, drive line segments 1301 and sense line 1303 can be defined, and drive line segments can be electrically isolated from the sense line because of the removal of conductive cathode material between drive line segments and the sense line. As described above, OLED layers 1305 in other areas of the touch screen can be protected from the etching of cathode 1315 because the coverage of TFE1 1317 in those areas can protect OLED layers.

FIG. 13B-5 illustrates the next step of the example process. Thin film encapsulation layer TFE2 1319 can be deposited, and vias 1309 can be etched in TFE1 1317 and TFE2 to allow for electrical connection to cathode 1315.

FIG. 13B-6 illustrates the last step of the example process. Drive line connection 1307 can be formed inside vias 1309 and across TFE2 1319. Drive line connection 1307 can be formed of ITO or IZO, for example. Finally, thin film layer TFE3 1323 can be deposited over the material stack. As shown, drive line segments 1301 can be electrically connected to each other through vias 1309 and drive line connection 1307. Drive line segments 1301 can be electrically isolated from sense line 1303 by isolation slits 1310. By way of the above-described process, the fabrication of the drive and sense line structure of FIG. 3A, over OLED layers, can be accomplished.

Figure 14A:
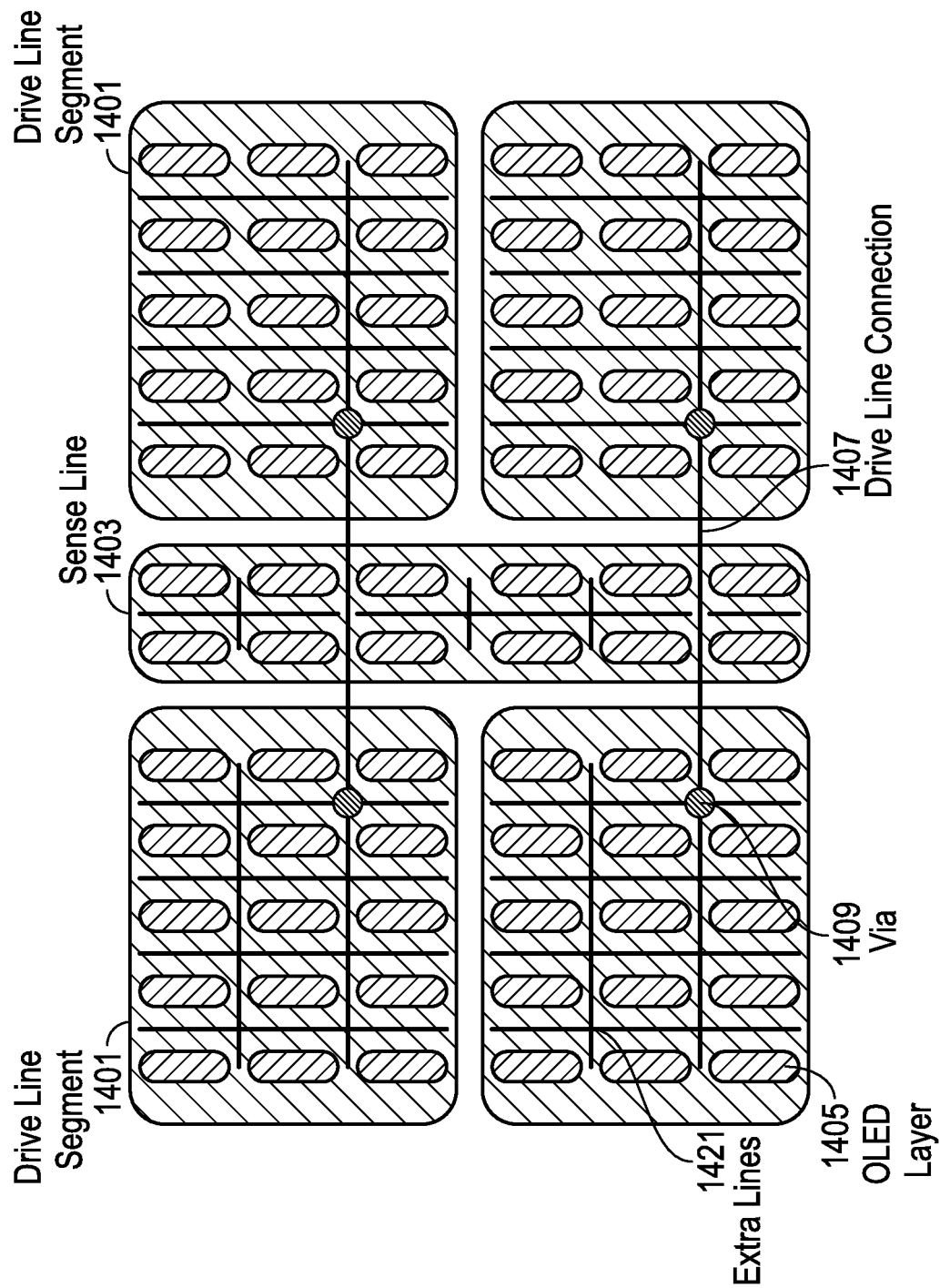
FIGS. 14A and 14B illustrate an exemplary way of lowering the sheet resistance of the cathode layer according to examples of the disclosure.
Figure 14B:
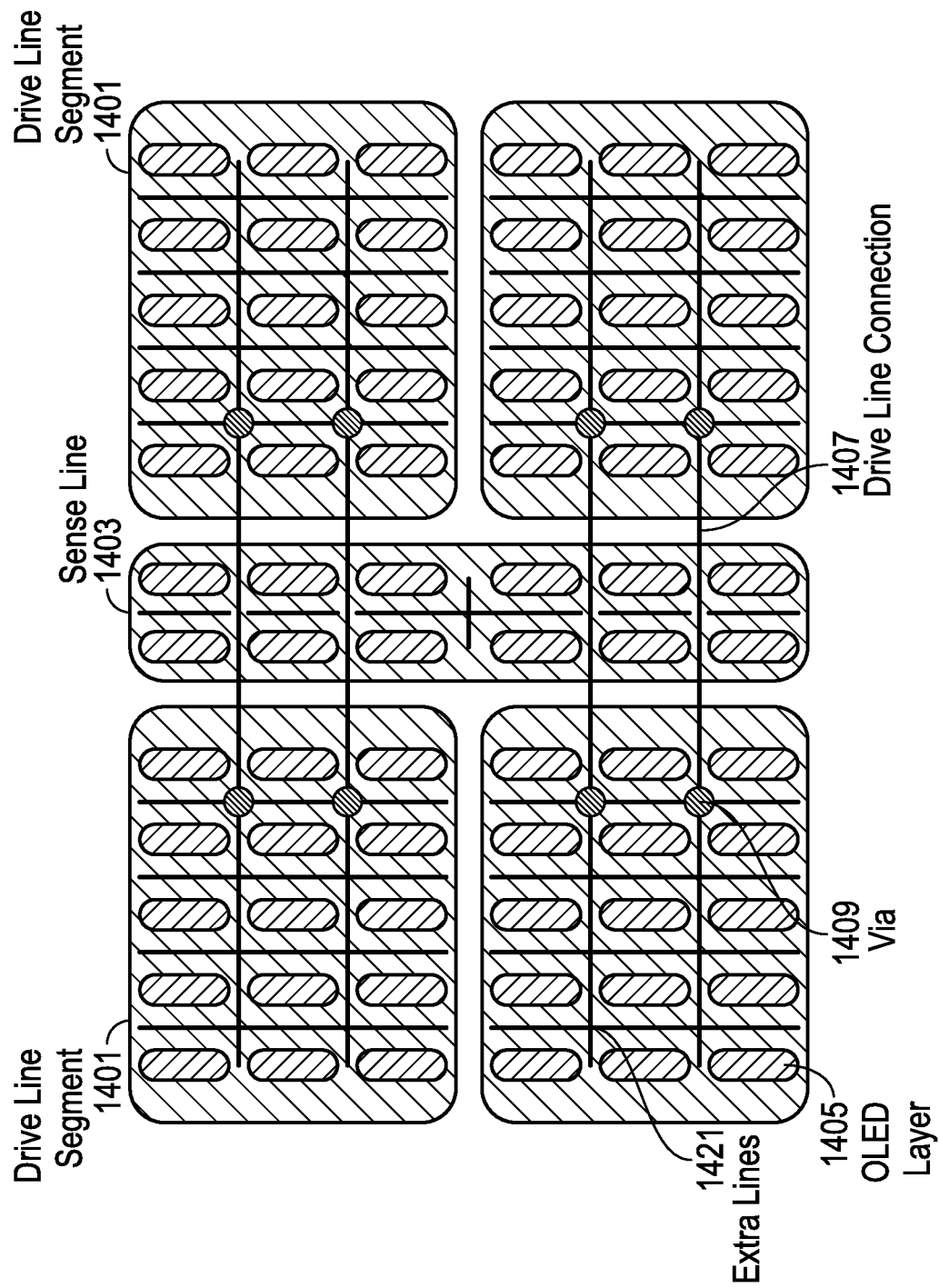

Because the cathode layer (or the anode layer in the case of inverted OLED displays) of the touch screen of this disclosure can be formed over LED layers such as OLED layers, it can be preferable for the cathode layer (or the anode layer) to be transparent. Thus, it can be necessary to make the cathode layer thin. This, in turn, can cause the sheet resistance of the cathode layer to be high. High resistance coupled with the various capacitances inherent in the OLED material stack can result in increased voltage delay in drive lines, for example. Therefore, reducing the sheet resistance of the cathode layer can be desired. FIGS. 14A and 14B illustrate an exemplary way of lowering the sheet resistance of the cathode layer according to examples of the disclosure. FIGS. 14A and 14B show a top-view of the drive and sense line structure of FIG. 3A over OLED layers 1405. Drive line connections 1407 can correspond to anode connections 1107 or 1207, or drive line connection 1307. Extra lines 1421 can be formed as a mesh-like structure across drive line segments 1401 and sense line 1403, and can be formed in between OLED layers 1405 so as not to obstruct the light emitted from OLED layers. Extra lines 1421 can be electrically connected to the cathode layer by way of vias 1409. Because extra lines 1421 can be formed between OLED layers 1405, extra lines need not be as transparent as the cathode layer that can form drive line segments 1401 and sense line 1403. Therefore, extra lines 1421 can be thicker than the cathode layer, or can be formed of a different, lower resistance, material than the cathode layer, or both. The effective sheet resistance of the cathode layer can therefore be reduced without affecting the transparency of the cathode layer (i.e., drive line segments 1401 and sense line 1403).

Figures 5, 12B:
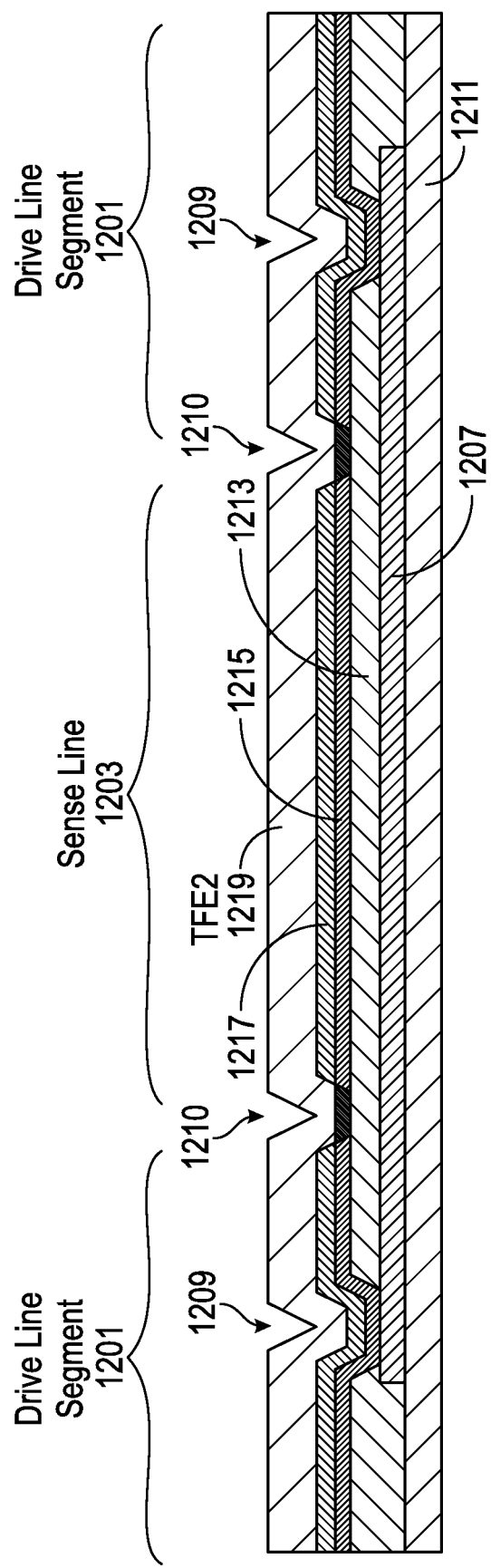

Using the processes of FIG. 11, 12, or 13, extra lines 1421 can be formed of the same material and at the same time as anode connections 1107 or 1207, or drive line connection 1307. FIG. 14A shows an example with a single drive line connection 1407 between adjacent drive line segments 1401. FIG. 14B shows an example with two drive line connections 1407 between adjacent drive line segments 1401. More drive line connections 1407 can be used in accordance with the examples of the disclosure.

Figure 15A:
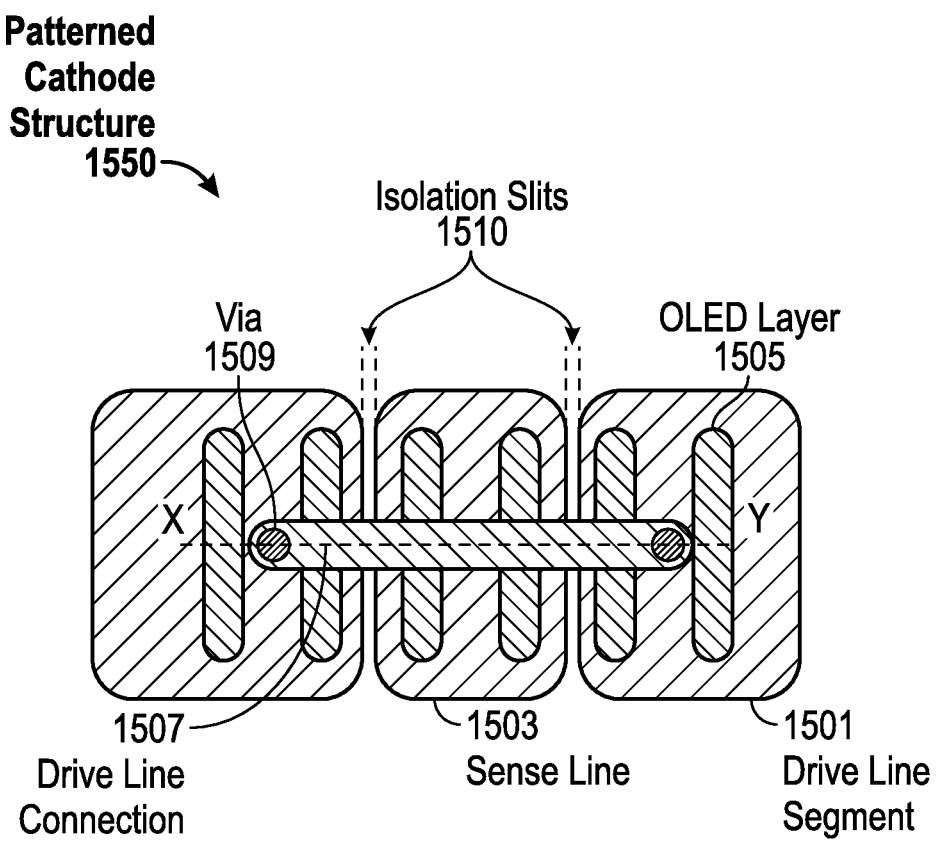
Figures 4, 15B:
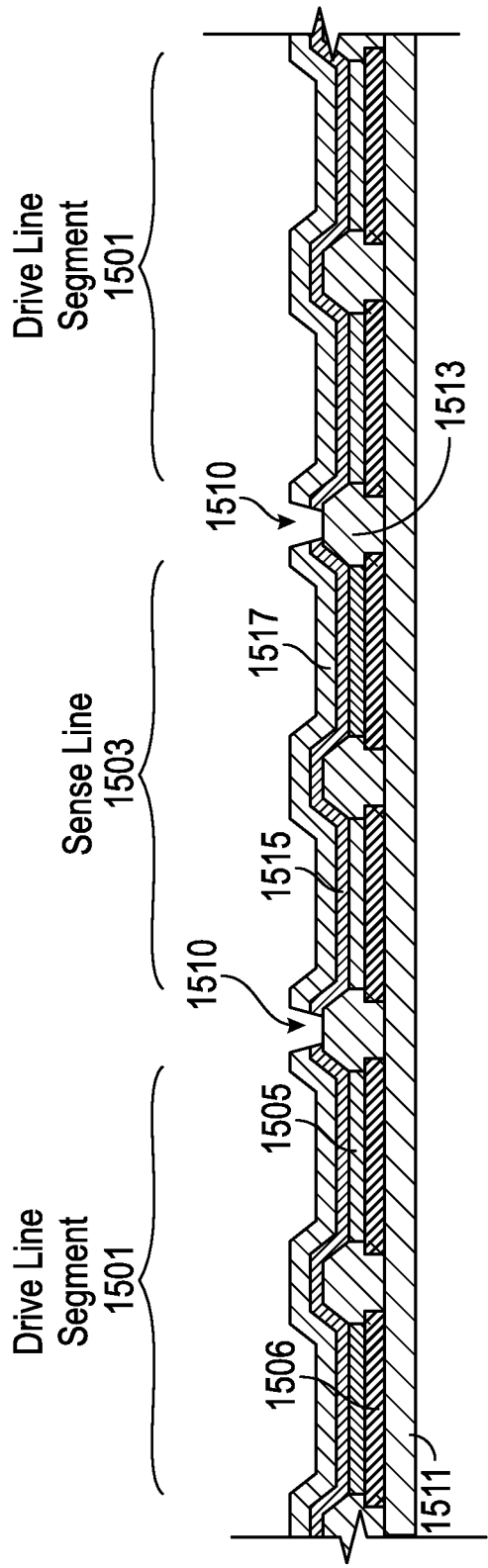
Figures 5, 15B:
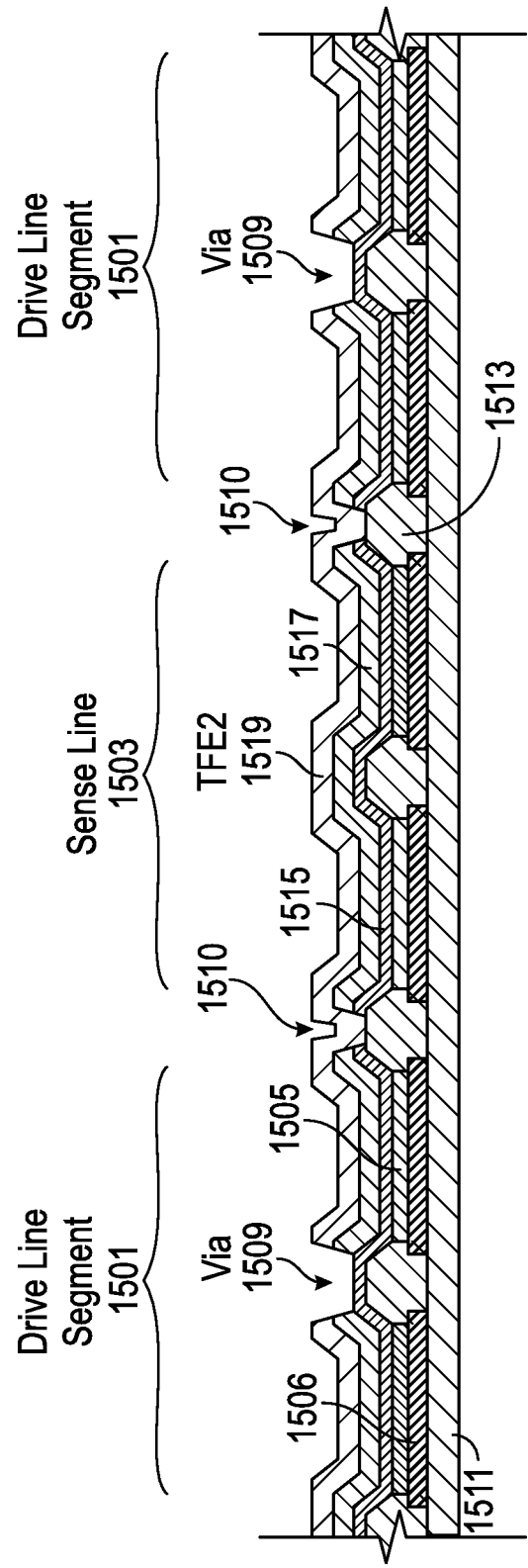
Figures 6, 15B:
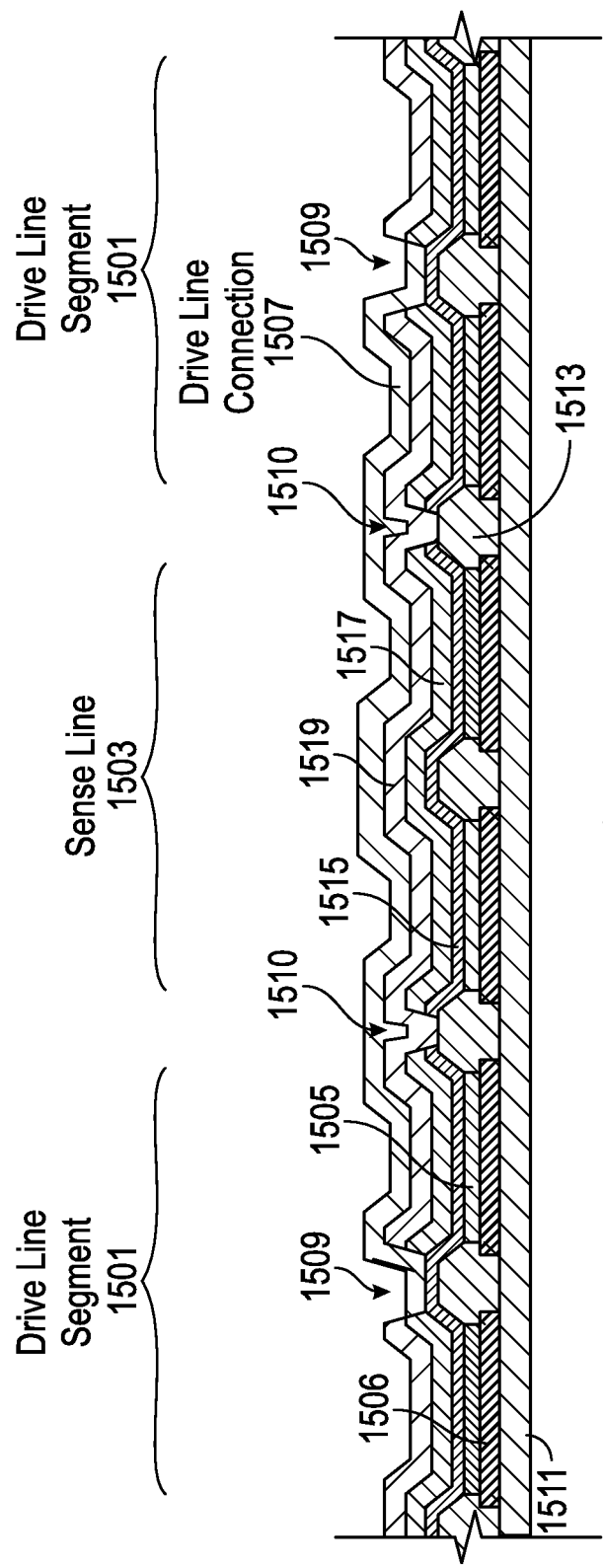

Sometimes, it can be preferable or necessary to connect adjacent drive line segments by way of drive line connections that overlap the LED layers of the touch screen. This can be the case, for example, in high density AMOLED displays where there is minimal space between adjacent OLED layers. FIGS. 15A and 15B illustrate an exemplary process for forming a drive line connection over OLED layers according to examples of the disclosure. FIG. 15A shows a top-view of a patterned cathode structure 1550 in accordance with the examples of this disclosure. Drive line segments 1501 can be on either side of sense line 1503, and can be electrically isolated from sense line by isolation slits 1510. Both drive line segments 1501 and sense line 1503 can be formed of cathode 1011 of FIG. 10. OLED layers 1505 can be underneath drive line segments 1501 and sense line 1503, and can correspond to OLED layers 1009 of FIG. 10. Drive line segments 1501 can be electrically connected to each other by way of drive line connection 1507. Drive line connection 1507 can partially overlap OLED layers 1505, and it can therefore be preferable for drive line connection 1507 to be substantially transparent. Drive line connection 1507 can be formed of ITO or IZO, for example. Drive line connection 1507 can be electrically connected to drive line segments 1501 by way of vias 1509. The process steps for fabricating the patterned cathode structure 1550 of FIG. 15A will be described with reference to FIG. 15B, which illustrates a cross-sectional view of cross-section X-Y at each process step.

FIG. 15B-1 illustrates the first step of the example process. Anodes 1506 can be formed on PLN 1511. Anodes 1506 can correspond to anodes 1007 in FIG. 10. OLED layers 1505 can be formed on anodes 1506. OLED layers can correspond to OLED layers 1009 in FIG. 10. Anode 1506 and OLED layer 1505 stacks can be electrically isolated from each other by organic passivation 1513. Organic passivation can correspond to PDL 1005 in FIG. 10. Cathode 1515 can be blanket deposited over the material stack, and can correspond to cathode 1011 in FIG. 10.

FIG. 15B-2 illustrates the next step of the example process. A thin film encapsulation layer TFE1 1517 can be formed on cathode 1515. TFE1 1517 can protect OLED layers 1505 from the next steps in the process.

FIG. 15B-3 illustrates the next step of the example process. TFE1 1517 can be etched to partially open isolation slits 1510. OLED layers 1505 can be protected from the etching of TFE1 1517 at isolation slits 1510 because the coverage of TFE1 over OLED layers can protect OLED layers.

FIG. 15B-4 illustrates the next step of the example process. Cathode 1515 can be etched to complete the opening of isolation slits 1510. With the etching of cathode 1515 in this step, drive line segments 1501 and sense line 1503 can be defined. Drive line segments 1501 can be electrically isolated from sense line 1503 by organic passivation 1513 and because of the removal of conductive cathode 1515 material between drive line segments and sense line. As described above, OLED layers 1505 can be protected from the etching of cathode 1515 because the coverage of TFE1 1517 over OLED layers can protect OLED layers.

FIG. 15B-5 illustrates the next step of the example process. Thin film encapsulation layer TFE2 1519 can be deposited, and vias 1509 can be etched in TFE1 1517 and TFE2 to allow for electrical connection to cathode 1515.

FIG. 15B-6 illustrates the last step of the example process. Drive line connection 1507 can be formed inside vias 1509 and across TFE2 1519. As shown, drive line segments 1501 can be electrically connected to each other through vias 1509 and drive line connection 1507. Drive line segments 1501 can be electrically isolated from sense line 1503 by isolation slits 1510 and organic passivation 1513. By way of the above-described process, the fabrication of the drive and sense line structure of FIG. 3A, over OLED layers, can be accomplished.

Figures 1, 16B:
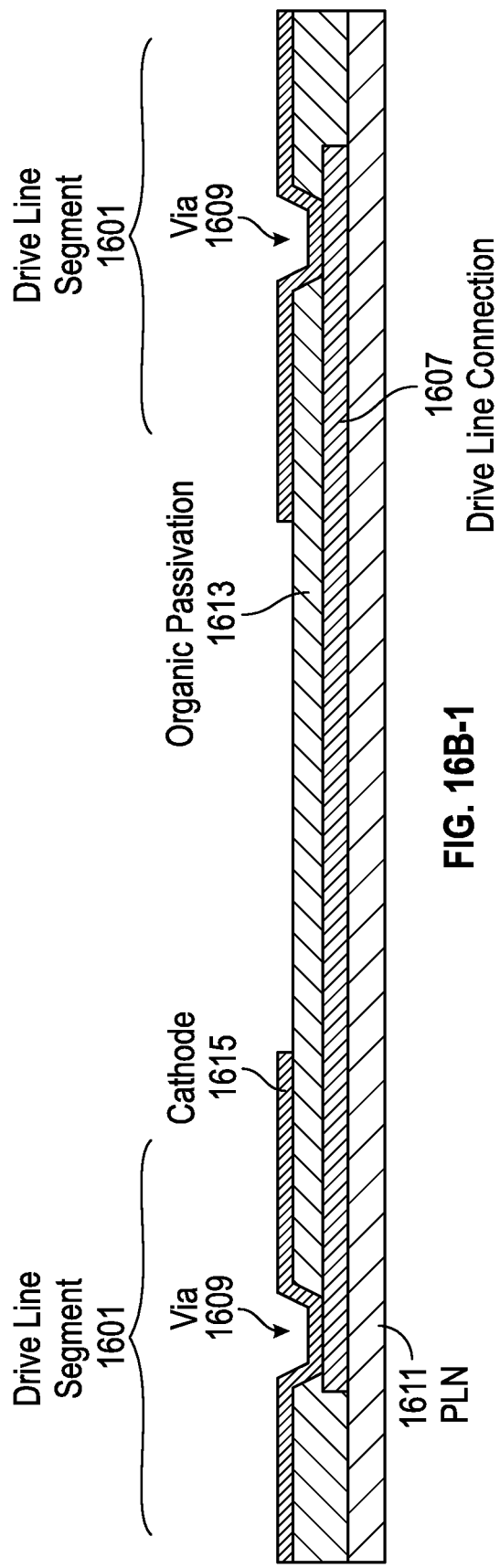
Figures 2, 16B:
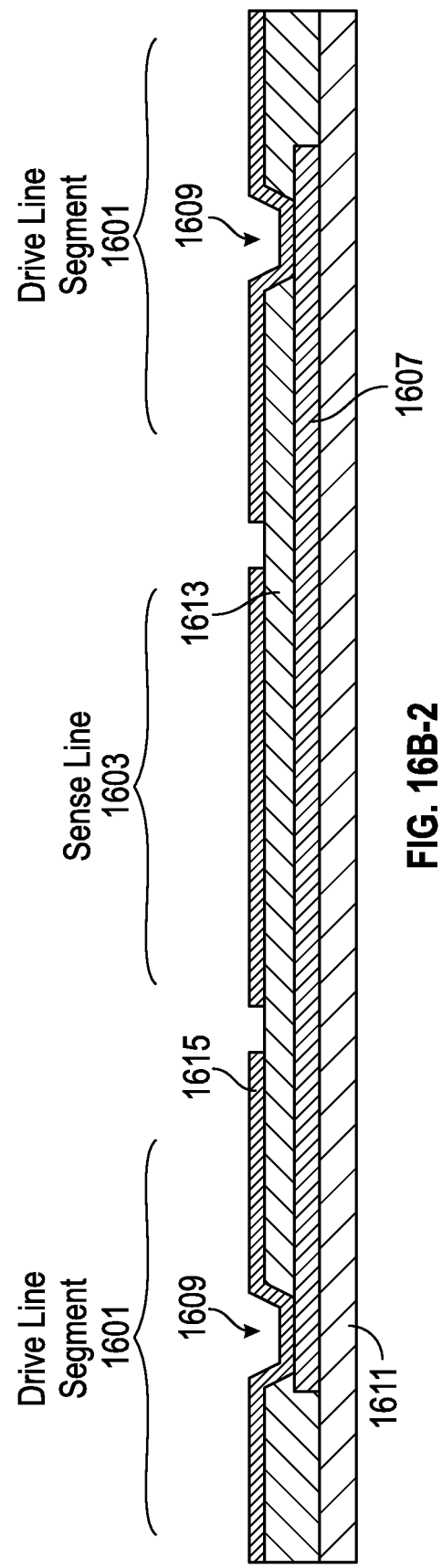
Figures 3, 16B:
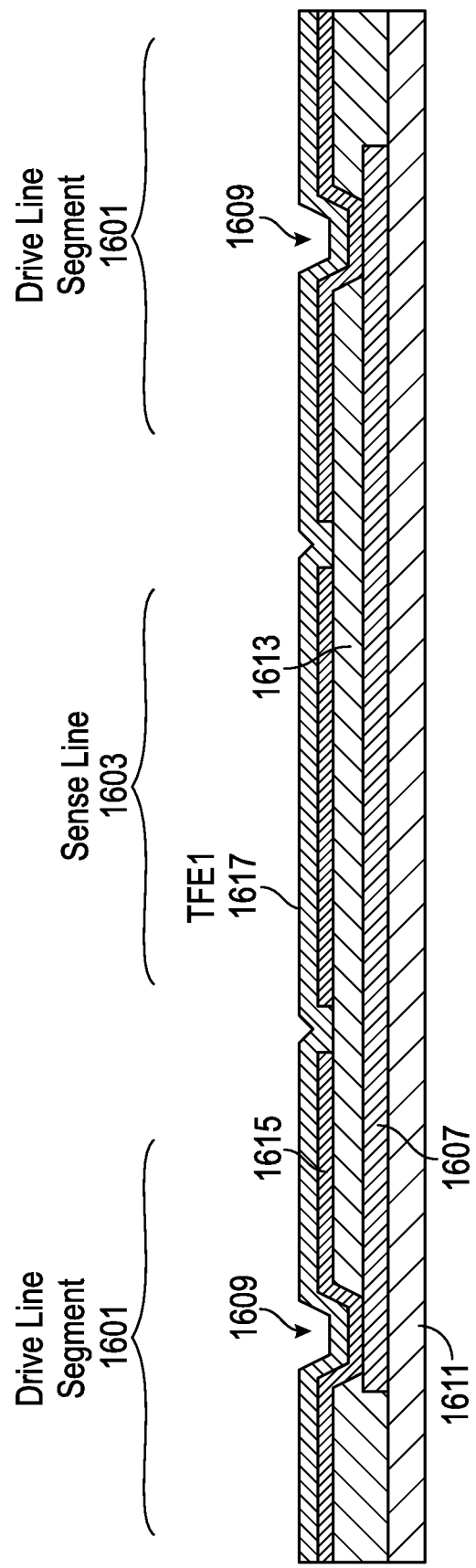

Instead of blanket depositing the cathode layer, and then subsequently etching it to provide isolation for the drive and sense segments of the examples of this disclosure, the cathode layer can be deposited by way of a shadow mask. FIGS. 16A and 16B illustrate an exemplary process for performing shadow mask deposition of the cathode layer according to examples of this disclosure. FIG. 16A shows a top-view of the process of depositing a cathode layer, corresponding to drive line segments 1601 and sense lines 1603, by using a shadow mask. A shadow mask allows for selective deposition of a material on a surface by way of a physical mask placed between the source of the material being deposited and the surface onto which the material is being deposited. Areas in the mask with holes or openings allow for the material to pass through and deposit on the surface. Areas in the mask without holes or openings prevent the material from passing through, and therefore no material is deposited at the corresponding area on the surface. FIG. 16A shows the deposition of drive line segments 1601 and sense lines 1603 using three shadow masks. More or fewer shadow masks can be used in accordance with this example. Further, it is understood that while the drive and sense line structure of FIG. 3A is illustrated, the drive and sense line structure of FIG. 3B can be similarly formed.

FIG. 16A-1 illustrates the first step of the example process. Alternate rows of drive line segments 1601 can be deposited by way of a shadow mask having openings corresponding to the positioning of drive line segments on the surface of the touch screen. FIG. 16A-2 illustrates the next step of the example process. Sense lines 1603 can be deposited by way of a shadow mask as described above. FIG. 16A-3 illustrates the last step of the example process. The remaining alternate rows of drive line segments 1601 can be deposited by way of a shadow mask as described above. Finally, a thin film encapsulation layer can be blanket deposited (not shown in FIG. 16A) over drive line segments 1601 and sense line 1603 to encapsulate the material stack. As described throughout this disclosure, it can be necessary to electrically connected adjacent drive line segments 1601 by way of drive line connections 1607 to form drive lines, such as drive lines 222 of FIG. 3A. In this example, drive line connections 1607 can be formed prior to shadow mask deposition of drive line segments 1601 and sense line 1603. FIG. 16B illustrates a cross-sectional view of cross-section X-Y during the process steps of FIG. 16A to better show drive line connections 1607.

FIG. 16B-1 illustrates the first step of the example process. Drive line connection 1607 can be formed on PLN 1611. Drive line connection 1607 can correspond to anode connections 1107 or 1207, for example. Organic passivation 1613 can be formed on drive line connection 1607 and PLN 1611, and can be etched at vias 1609 to allow for electrical connection to drive line connection. OLED layers 1605 (not shown in FIG. 16B) can be formed in other areas of the touch screen. Drive line segment 1601 portion of cathode 1615 can be deposited by shadow mask. It is noted that no need exists to further etch cathode 1615 to form drive line segment 1601 portion of cathode because shadow mask deposition can allow for pre-patterned deposition of cathode.

FIG. 16B-2 illustrates the next step of the example process. Sense line 1603 portion of cathode 1615 can be deposited by shadow mask. Sense line 1603 and drive line segments 1601 can be electrically isolated from each other because no electrical connection can exist between them, whether in cathode 1615 or by drive line connection 1607. It is noted that no need exists to further etch cathode 1615 to form sense line segment 1603 portion of cathode for the reasons described above.

FIG. 16B-3 illustrates the last step of the example process. A thin film encapsulation layer TFE1 1617 can be formed on drive line segment 1601 and sense line 1603 portions of cathode 1615. By way of the above-described process, the fabrication of the drive and sense line structure of FIG. 3A, over OLED layers, can be accomplished. Further, the shadow mask deposition process of FIG. 16 allows for no photolithography or etching process steps after the formation of OLED layers 1605, which can help to prevent damage to OLED layers on the touch screen.

Figures 1, 17A:
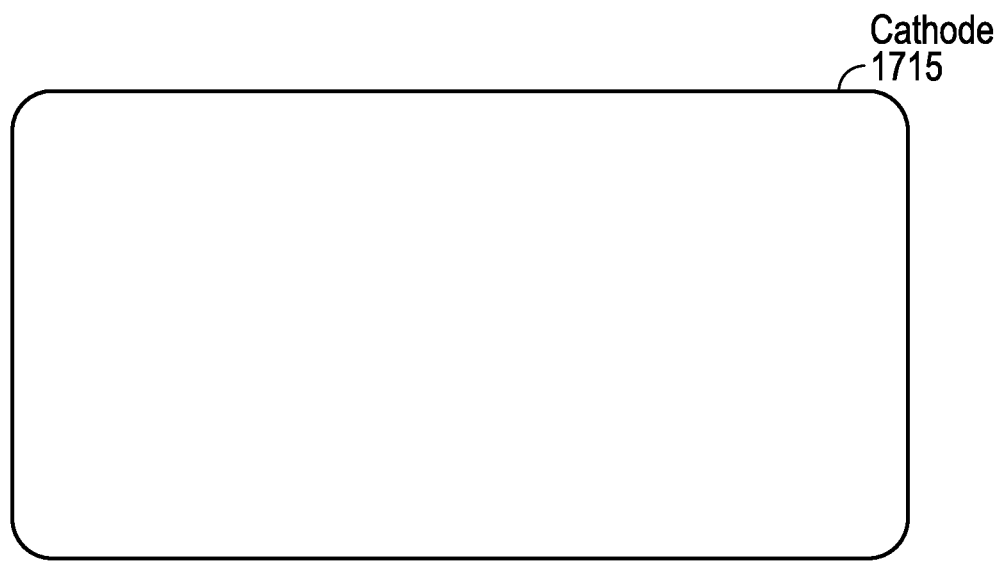
Figures 2, 17A:
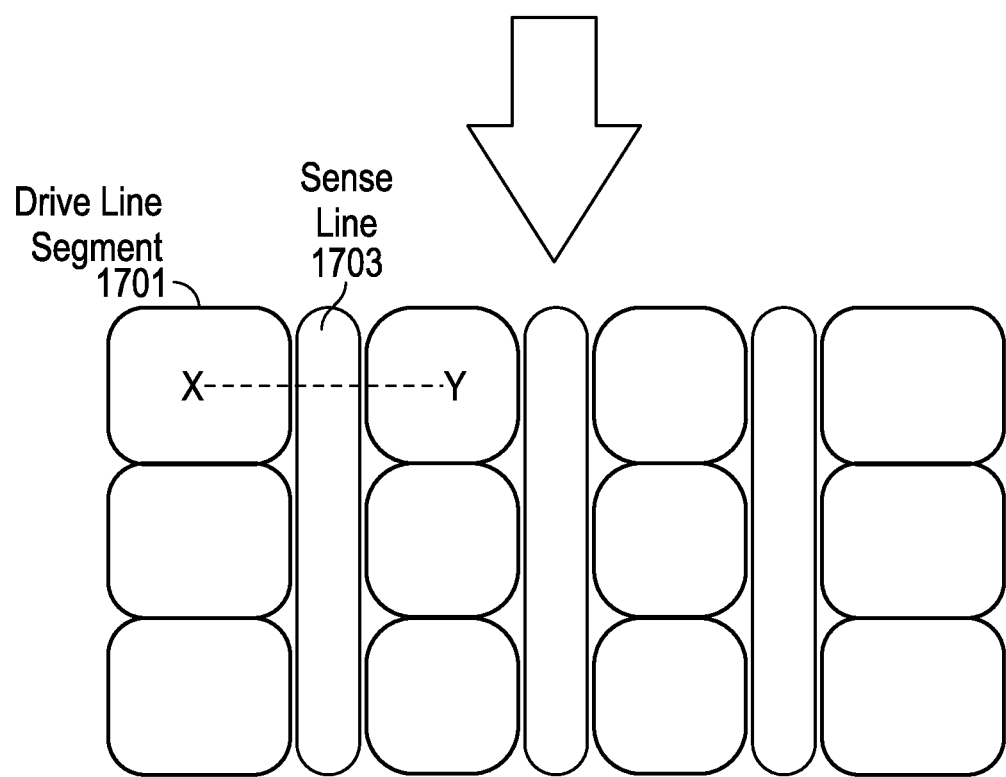
Figures 1, 17B:
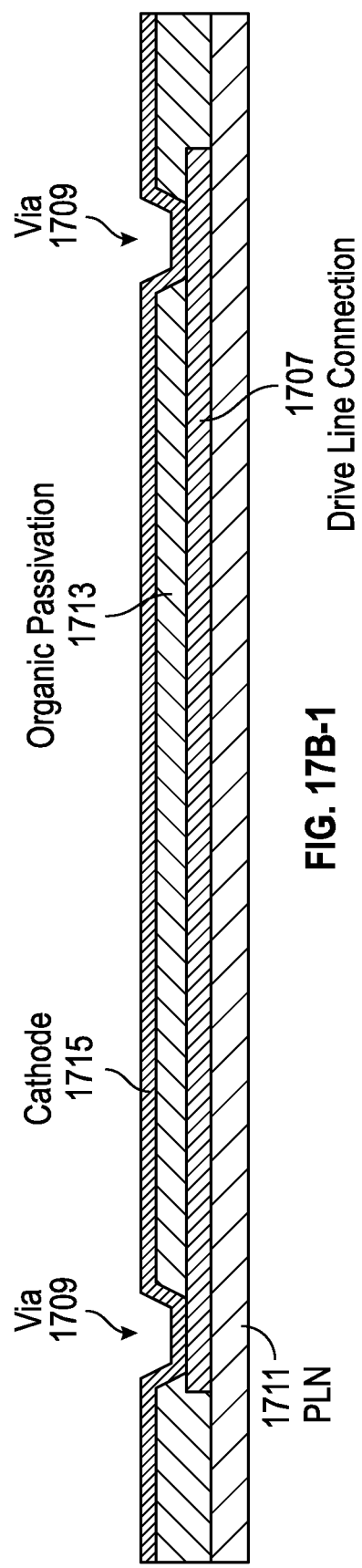
Figures 2, 17B:
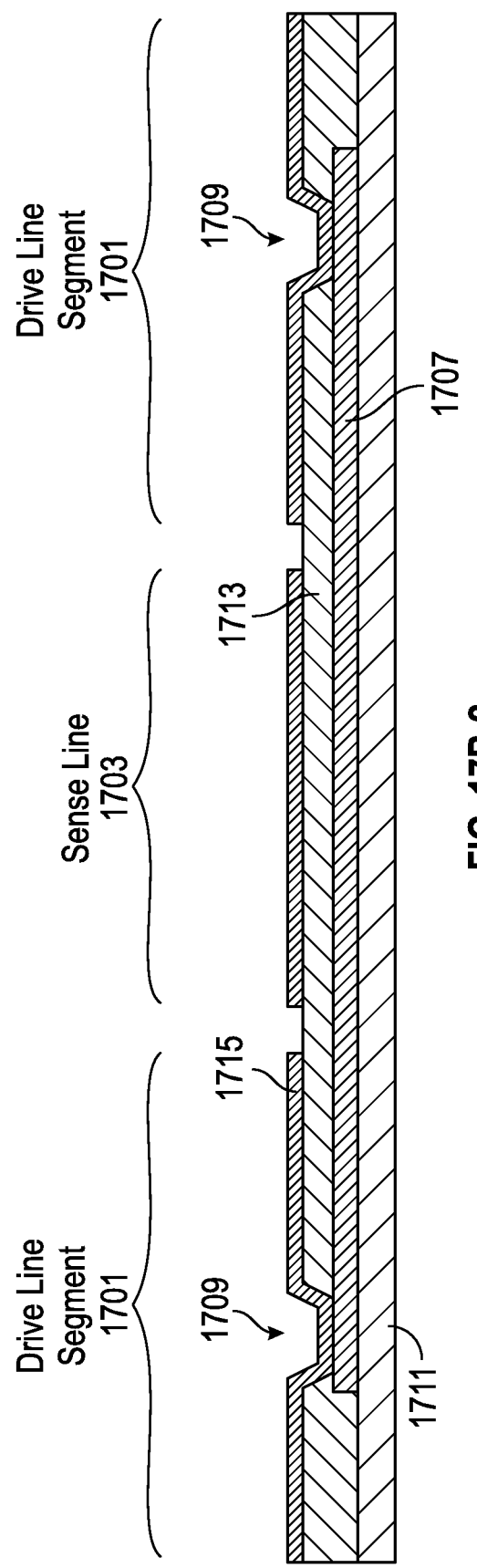
Figures 3, 17B:
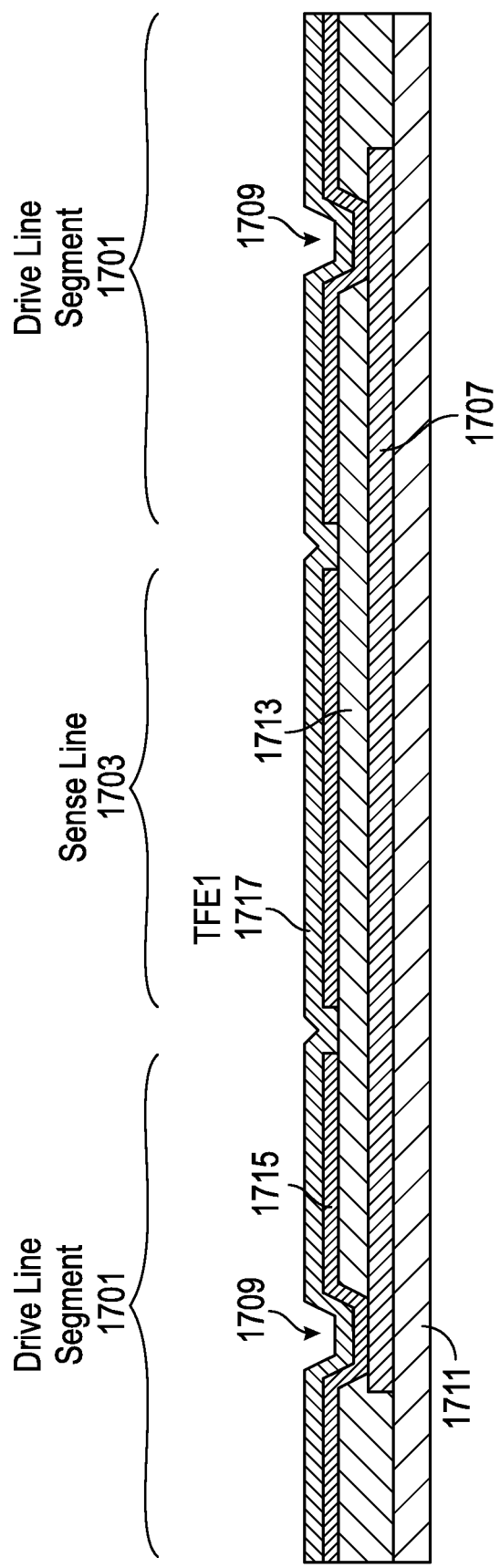

Alternatively to shadow mask deposition, laser ablation can be performed to form the drive and sense segments of the examples of this disclosure. FIGS. 17A and 17B illustrate an exemplary process for performing laser ablation to form drive and sense segments according to examples of the disclosure. FIG. 17A shows a top-view of a process for defining drive line segments 1701 and sense lines 1703 on the surface of the touch screen. FIG. 17A-1 illustrates the first step of the example process. Cathode 1715 can be blanket deposited over the surface of the touch screen. FIG. 17A-2 illustrates the second step of the process. Cathode 1715 can be laser patterned to scribe out portions of cathode 1715 to form drive line segments 1701 and sense lines 1703 such that substantially no cathode material exists between drive line segments and sense lines. Finally, a thin film encapsulation layer can be blanket deposited (not shown in FIG. 17A) over drive line segments 1701 and sense lines 1703 to encapsulate the material stack. As described throughout this disclosure, it can be necessary to electrically connect adjacent drive line segments 1701 by way of drive line connections 1707 to form drive lines, such as drive lines 222 of FIG. 3A. In this example, drive line connections 1707 can be formed prior to the deposition, and the laser ablation, of cathode 1715 to form drive line segments 1701 and sense lines 1703. FIG. 17B illustrates a cross-sectional view of cross-section X-Y during the process steps of FIG. 17A to better show drive line connections 1707.

FIG. 17B-1 illustrates the first step of the example process. Drive line connection 1707 can be formed on PLN 1711. Drive line connection 1707 can correspond to anode connections 1107 or 1207, for example. Organic passivation 1713 can be formed on drive line connection 1707 and PLN 1711, and can be etched at vias 1709 to allow for electrical connection to drive line connection. OLED layers 1705 (not shown in FIG. 17B) can be formed in other areas of the touch screen. Cathode 1715 can be blanket deposited over the material stack.

FIG. 17B-2 illustrates the next step of the example process. Cathode 1715 can be laser patterned to form drive line segment 1701 and sense line 1703 portions of cathode. Drive line segments 1701 and sense line 1703 can be electrically isolated from each other because no electrical connection can exist between them, whether in cathode 1715 or by drive line connection 1707. Further, the laser energy used during the laser patterning can be regulated to avoid damage to the material stack below cathode 1715, including organic passivation 1713.

FIG. 17B-3 illustrates the last step of the example process. A thin film encapsulation layer TFE1 1717 can be formed on drive line segment 1701 and sense line 1703 portions of cathode 1715. By way of the above-described process, the fabrication of the drive and sense line structure of FIG. 3A, over OLED layers, can be accomplished.

Because the drive line segments and sense lines of the examples of the disclosure can operate as a cathode for a pixel circuit during a display phase of the touch screen, it can be beneficial to ensure that the drive line segments and the sense lines properly cover the LED emission layers, such as OLED emission layers, in the touch screen. Therefore, in any of the fabrication procedures described above, it can be preferable to modify the distance between adjacent OLED emission layers to ensure proper cathode layer coverage of the OLED emission layers. FIGS. 18A-18D illustrate an exemplary process for modifying the distance between adjacent OLED emission layers according to examples of the disclosure.

Figure 18A:
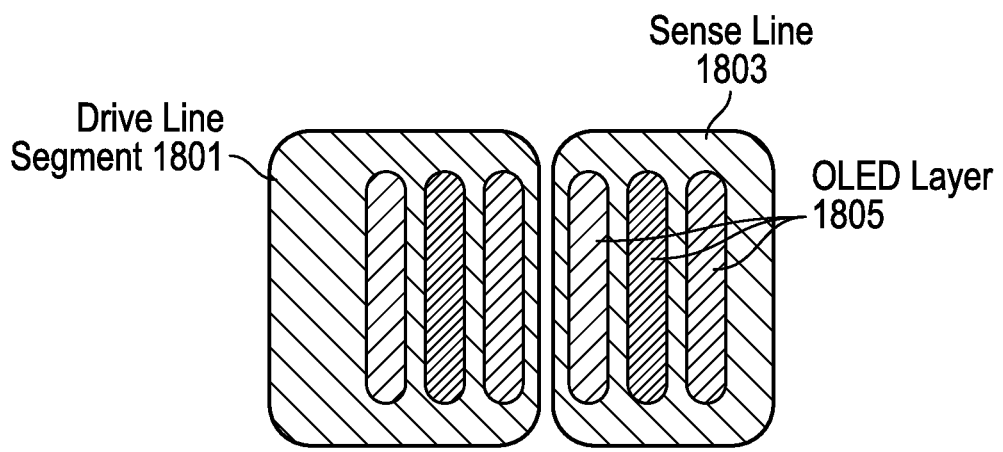
Figure 18B:
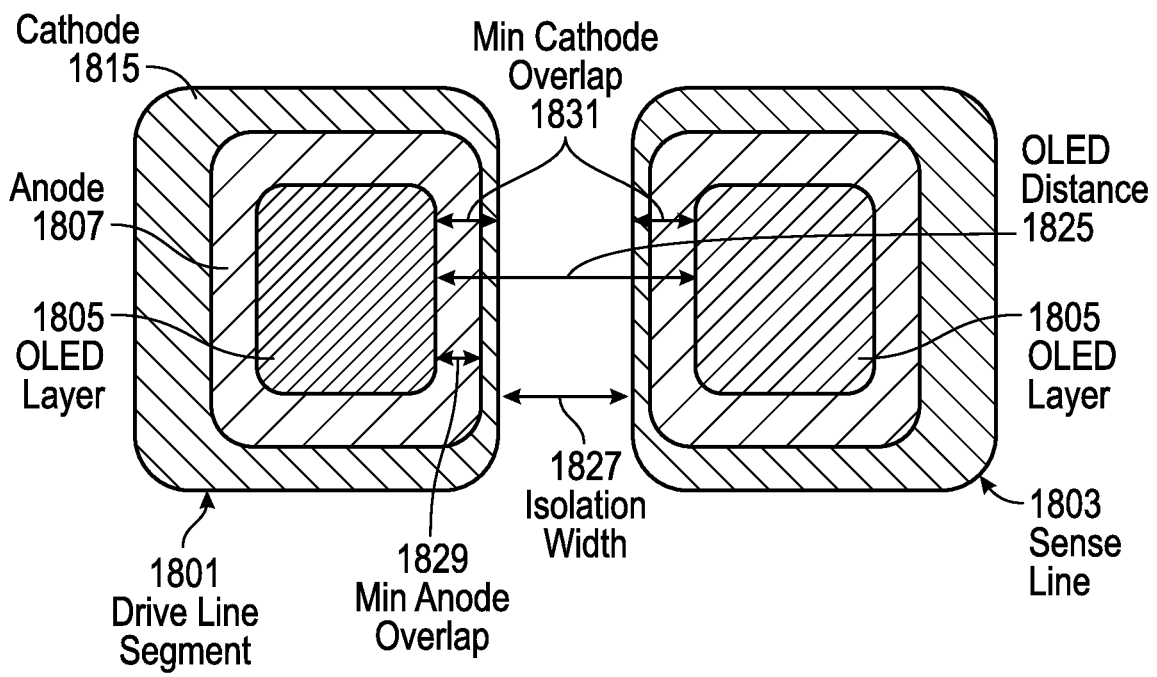

FIGS. 18A and 18B illustrate why OLED emission layer distance modification can be necessary. FIG. 18A shows a top-view of a portion of a touch screen according to examples of the disclosure. Drive line segment 1801 can be adjacent to sense line 1803. OLED layers 1805 can be covered by drive line segment 1801 and sense line 1803, which can act as a cathode for OLED layers during a display phase of the touch screen.

FIG. 18B shows a zoomed-in view of the area between drive line segment 1801 and sense line 1803. Drive line segment 1801 can be formed over OLED layer 1805, which can be formed over anode 1807. Sense line 1803 can be formed over OLED layer 1805, which can be formed over anode 1807. OLED distance 1825 can be the distance between adjacent OLED layers 1805. Isolation width 1827 can be the distance between adjacent portions of cathode 1815, i.e., the distance between drive line segment 1801 and sense line 1803. Minimum anode overlap 1829 can be the minimum distance that the edge of anode 1807 needs to extend over the edge of OLED layer 1805 for desired OLED operation. Minimum cathode overlap 1831 can be the minimum distance that the edge of cathode 1815 needs to extend over the edge of OLED layer 1805 for desired OLED operation. If the fabrication steps of forming drive line segment 1801 and sense line 1803 provide no additional constraints to those provided above, then isolation width 1827 can be reduced to almost zero, and OLED distance 1825 can be slightly larger than twice minimum cathode overlap 1831. OLED distance 1825 cannot be reduced to exactly twice minimum cathode overlap 1831 because it is desired that drive line segment 1801 and sense line 1803 be electrically isolated from each other for proper touch screen operation; reducing OLED distance to twice minimum cathode overlap would mean that isolation width would be zero, which would mean that drive line segment 1801 and sense line 1803 would be touching, and thus not electrically isolated from each other.

Sometimes the process for fabricating drive line segment 1801 and sense line 1803 can provide a constraint as to how close drive line segment and sense line can be formed. That is to say, the fabrication process utilized might provide for a minimum distance between drive line segment 1801 and sense line 1803 that is greater than the minimum distance described above. For example, photolithography and etching can have a minimum resolution limit, or shadow mask deposition can have a minimum mask aperture limit. In cases such as these, it can desirable to adjust the spacing of adjacent OLED layers 1805 only at the edges of drive line segment 1801 and sense line 1803 so that the spacing of OLED layers in other areas of the touch screen, and thus the general OLED aperture (i.e., the spacing between OLED pixels), can be left unchanged.

Figure 18C:
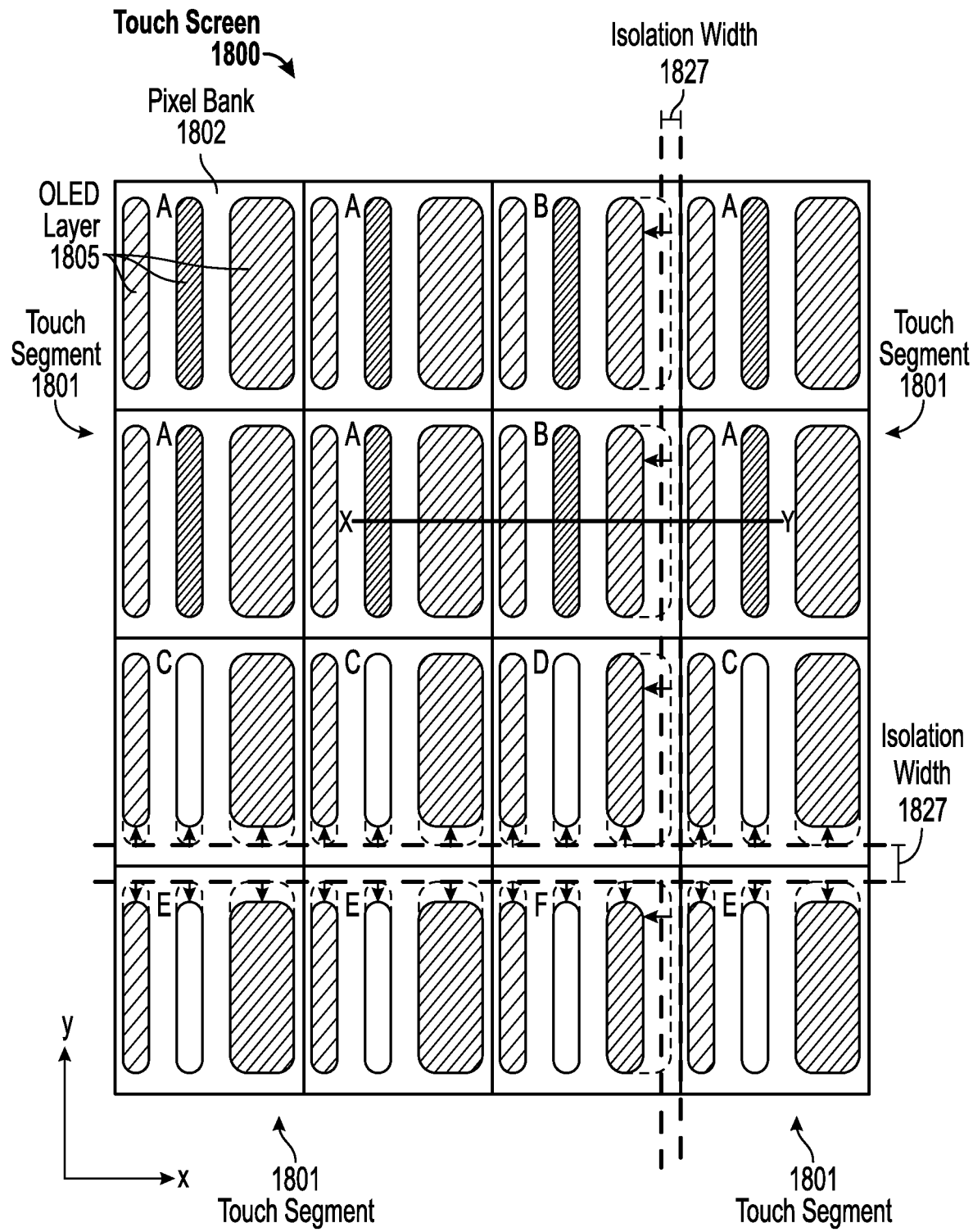

FIG. 18C illustrates one way to reduce the spacing of OLED layers at the edges of touch segments (i.e., drive line segments and sense lines). The touch screen 1800 can include a plurality of OLED pixel banks 1802. Each pixel bank can include a plurality of OLED layers 1805; in this example, it could be three: one OLED layer each for red light, green light, and blue light. The touch screen can also include a plurality of touch segments 1801 overlaying the pixel banks 1802. The touch segments 1801 can correspond to drive line segments 301 and sense lines 223 of FIG. 3A, for example. Touch segments 1801 can be separated from each other by isolation width 1827. To accommodate the minimum necessary isolation width 1827, as described above, the dimensions of OLED layers 1805 adjacent to touch segment 1801 boundaries can be modified. For example, the right-most OLED layer 1805 in a pixel bank 1802 B can have its size reduced in the x-direction to accommodate the minimum required isolation width 1827, as shown. The dimensions of all of the OLED layers 1805 in a pixel bank 1802 C can be reduced in the y-direction for the same reason as above. Such modifications can be made to the remaining pixel banks 1802 as needed. However, pixel bank 1802 A need not be modified because pixel bank A, as defined, is not adjacent to a touch segment 1801 boundary. By proceeding with the modifications of the pixel banks 1802 as described above, the general spacing between, and the size of, most OLED layers 1805 on the touch screen 1800 can remain unchanged while allowing for the accommodation of a minimum isolation width 1827 as dictated by process parameters. The process steps for modifying the effective dimensions of certain OLED layers will be described with reference to the cross-sectional view of cross-section X-Y of FIG. 18C.

Figures 3, 18D:
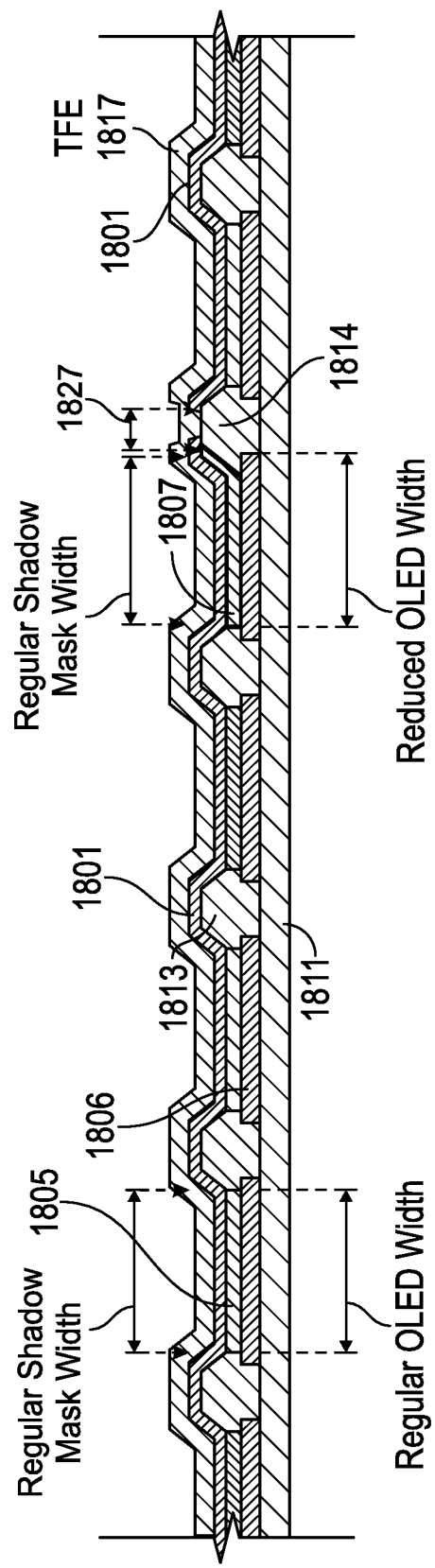

FIG. 18D illustrates a process to reduce the dimensions of touch segment boundary OLED layers without the need to modify the shadow mask used to deposit the OLED layers. FIG. 18D-1 illustrates the first step of the example process. Anodes 1806 can be formed on PLN 1811. Anodes 1806 can correspond to anodes 1007 in FIG. 10, for example. Organic passivation 1813 can be formed between anodes 1806, and can correspond to PDL 1005 in FIG. 10, for example. OLED layers 1805 can be deposited by shadow mask (the concept of shadow mask deposition was described previously). Anode 1806 and OLED layer 1805 stacks can be electrically isolated from each other by organic passivation 1813.

Reduced OLED layer 1807 can be at the boundary of touch segment 1801, and can be deposited with the same shadow mask as OLED layers 1805. However, during the formation of organic passivation 1813, enlarged organic passivation 1814 at the boundary of touch segment 1801 can be formed to extend towards reduced OLED layer 1807. Therefore, during shadow mask deposition of OLED layers 1805, reduced OLED layer 1807 can be partially formed on anode 1806 and enlarged organic passivation 1814. The portion of reduced OLED layer 1807 that is formed on enlarged organic passivation 1814 can correspond to the desired reduction, in the x-direction, of reduced OLED layer.

FIG. 18D-2 illustrates the next step of the example process. Touch segments 1801 can be deposited by shadow mask, and can be isolated from each other by isolation width 1827.

FIG. 18D-3 illustrates the last step of the example process. Thin film encapsulation layer TFE 1817 can be deposited over the material stack. The portion of reduced OLED layer 1807 that is not in contact with anode 1806 may not contribute to the light emitted from reduced OLED layer because it is not in contact with anode. Therefore, touch segment 1801 need not overlap the entirety of reduced OLED layer 1807, but only the portion of reduced OLED layer that is in contact with anode 1806. Accordingly, the effective dimension of reduced OLED layer 1807 can be smaller than that of OLED layers 1805. In the way described above, the dimensions of touch segment boundary OLED layers can be reduced without the need to modify the shadow mask used to deposit the OLED layers.

Although the above process has been described only with reference to modifying the dimensions of LED layers, such as OLED layers, at the boundaries of touch segments, the dimensions of OLED layers adjacent to drive line connections can similarly be modified. For example, more area can be provided for drive line connection 1807 by modifying the dimensions of OLED layers 1805 that are adjacent to drive line connection in the manner described with reference to FIGS. 18C and 18D.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

Therefore, according to the above, some examples of the disclosure are directed to a touch screen comprising a transistor layer, a first layer disposed over the transistor layer and configured to operate as a light-emitting diode (LED) cathode during a display phase and as touch circuitry during a touch sensing phase, and an LED layer disposed between the transistor layer and the first layer. Additionally or alternatively to one or more of the examples disclosed above, in some examples, the LED layer comprises an organic light-emitting diode (OLED) layer. Additionally or alternatively to one or more of the examples disclosed above, in some examples, the transistor layer comprises a first transistor connected to the LED layer, and a power supply line connected to the first transistor. Additionally or alternatively to one or more of the examples disclosed above, in some examples, during the display phase, the power supply line voltage is set to a first voltage, and during the touch sensing phase, the power supply line voltage is set to a second voltage. Additionally or alternatively to one or more of the examples disclosed above, in some examples, the first voltage causes the LED layer to emit light, and the second voltage causes the LED layer to not emit light. Additionally or alternatively to one or more of the examples disclosed above, in some examples, the touch screen further comprises a second transistor connected to the first transistor, and a gate voltage line connected to a gate terminal of the second transistor, wherein during the display phase, the gate voltage line is set to a first voltage, and during the touch sensing phase, the gate voltage line is set to a second voltage. Additionally or alternatively to one or more of the examples disclosed above, in some examples, the first voltage causes the second transistor to turn on, and the second voltage causes the second transistor to turn off. Additionally or alternatively to one or more of the examples disclosed above, in some examples, the first layer comprises a plurality of drive lines and a plurality of sense lines. Additionally or alternatively to one or more of the examples disclosed above, in some examples, a drive line comprises a first drive line segment, and a second drive line segment electrically connected to the first drive line segment by a drive line connection.

Some examples of the disclosure are directed to a method for operating a touch screen comprising operating, during a display phase, a first layer as a cathode of a light-emitting diode (LED) layer, and operating, during a touch sensing phase, the first layer as touch circuitry. Additionally or alternatively to one or more of the examples disclosed above, in some examples, operating the first layer as the cathode of the LED layer comprises operating the first layer as the cathode of an organic light-emitting diode (OLED) layer. Additionally or alternatively to one or more of the examples disclosed above, in some examples, operating the first layer as the cathode of the LED layer comprises setting the voltage of a power supply line connected to a transistor to a first voltage that causes the LED layer to emit light, and operating the first layer as touch circuitry comprises setting the voltage of the power supply line to a second voltage that causes the LED layer to not emit light. Additionally or alternatively to one or more of the examples disclosed above, in some examples, operating the first layer as touch circuitry comprises operating the first layer as a plurality of drive line segments and a plurality of sense lines, and electrically connecting a first drive line segment to a second drive line segment.

Some examples of the disclosure are directed to a method for fabricating a light-emitting diode (LED) touch screen, the method comprising forming a plurality of LED layers, and forming, over the LED layers, a plurality of regions of a first layer configurable to operate as a plurality of LED cathodes during a display phase and as touch circuitry during a touch sensing phase. Additionally or alternatively to one or more of the examples disclosed above, in some examples, forming the plurality of LED layers comprises forming a plurality of organic light-emitting diode (OLED) layers. Additionally or alternatively to one or more of the examples disclosed above, in some examples, forming the plurality of regions of the first layer comprises depositing the first layer over the LED layers, and removing portions of the first layer to form regions of the first layer. Additionally or alternatively to one or more of the examples disclosed above, in some examples, forming the plurality of regions of the first layer comprises depositing the first layer over the LED layers, and oxidizing portions of the first layer to form regions of the first layer. Additionally or alternatively to one or more of the examples disclosed above, in some examples, the method further comprises depositing a second layer over the first layer, and removing portions of the second layer to form regions of the second layer, wherein the second layer protects the LED layer from the removal of portions of the first layer and the second layer. Additionally or alternatively to one or more of the examples disclosed above, in some examples, removing portions of the first layer and the second layer comprises etching portions of the first layer and the second layer. Additionally or alternatively to one or more of the examples disclosed above, in some examples, removing portions of the first layer comprises laser ablating portions of the first layer. Additionally or alternatively to one or more of the examples disclosed above, in some examples, forming the plurality of regions of the first layer comprises depositing the first layer using a shadow mask. Additionally or alternatively to one or more of the examples disclosed above, in some examples, the method further comprises modifying the dimensions of an LED layer at a boundary of one of the plurality of regions of the first layer. Additionally or alternatively to one or more of the examples disclosed above, in some examples, forming the plurality of regions of the first layer comprises forming, of the first layer, a plurality of drive line segments and a plurality of sense lines, and electrically connecting a first drive line segment to a second drive line segment using a drive line connection. Additionally or alternatively to one or more of the examples disclosed above, in some examples, the method further comprises forming the drive line connection over the first layer. Additionally or alternatively to one or more of the examples disclosed above, in some examples, the method further comprises forming the drive line connection under the first layer.

The invention claimed is:

1. A touch screen comprising:
a substrate;
a patterned cathode layer including a plurality of cathode layer segments, including a first cathode layer segment, a second cathode layer segment, and a third cathode layer segment;
a first encapsulation layer having an overlaying portion overlaying one or more of the plurality of cathode layer segments and a portion disposed between adjacent cathode layer segments, the first encapsulation layer including a first via at a location of the first cathode layer segment and a second via at a location of the second cathode layer segment, wherein:
the third cathode layer segment is between the first cathode layer segment and the second cathode layer segment in the patterned cathode layer, and
the third cathode layer segment is electrically isolated from the first cathode layer segment and the second cathode layer segment; and
a conductive connection having an overlaying portion overlaying the first encapsulation layer, a first connection portion connected to the first cathode layer segment, and a second connection portion connected to the second cathode layer segment, wherein:
the patterned cathode layer is between the substrate and the overlaying portion of the first encapsulation layer.

2. The touch screen of claim 1, wherein the third cathode layer segment has a dimension in a first direction that exceeds a dimension of the first cathode layer in the first direction, the first direction intersecting a second direction along which the conductive connection is disposed.

3. The touch screen of claim 1, further comprising an extra conductive line, wherein:
the extra conductive line is connected to the conductive connection, and
the extra conductive line intersects the overlaying portion of the conductive connection.

4. The touch screen of claim 1, further comprising a second encapsulation layer, wherein:
the second encapsulation layer is between the patterned cathode layer and the overlaying portion of the first encapsulation layer, and
the second encapsulation layer is patterned into second encapsulation segments that correspond to the plurality of cathode layer segments.

5. The touch screen of claim 1, further comprising:
an organic light emitting diode (OLED) layer between the patterned cathode layer and the substrate, the OLED layer including a plurality of patterned OLED pixels at locations different from the location of the first via and the location of the second via.

6. The touch screen of claim 5, wherein:
during a touch phase of operation of the touch screen, the patterned cathode layer is used to sense a touch at the touch screen, and
during a display phase of operation of the touch screen, the patterned cathode layer is used to display an image using the plurality of patterned OLED pixels.

7. The touch screen of claim 1, wherein:
the first cathode layer segment and the second cathode layer segment are parts of one of a drive line or a sense line, and the third cathode layer segment is part of the other of the drive line and the sense line.

8. A method for operating a touch screen, the method comprising:
sensing a self-capacitance or a mutual capacitance at a respective cathode layer segment, the respective cathode layer segment included in a plurality of cathode layer segments of a patterned cathode layer of the touch screen, including a first cathode layer segment, a second cathode layer segment, and a third cathode layer segment, wherein the touch screen further comprises:
a substrate;
a first encapsulation layer having an overlaying portion overlaying one or more of the plurality of cathode layer segments and a portion disposed between adjacent cathode layer segments, the first encapsulation layer including a first via at a location of the first cathode layer segment and a second via at a location of the second cathode layer segment, wherein:
the third cathode layer segment is between the first cathode layer segment and the second cathode layer segment on the patterned cathode layer, and
the third cathode layer segment is electrically isolated from the first cathode layer segment and the second cathode layer segment; and
a conductive connection having an overlaying portion overlaying the first encapsulation layer, a first connection portion connected to the first cathode layer segment, and a second connection portion connected to the second cathode layer segment, wherein:
the patterned cathode layer is between the substrate and the overlaying portion of the first encapsulation layer.

9. The method of claim 8, wherein the third cathode layer segment has a dimension in a first direction that exceeds a dimension of the first cathode layer in the first direction, the first direction intersecting a second direction along which the conductive connection is disposed.

10. The method of claim 8, wherein:
the touch screen further comprises an extra conductive line,
the extra conductive line is connected to the conductive connection, and
the extra conductive line intersects the overlaying portion of the conductive connection.

11. The method of claim 8, wherein:
the touch screen further comprises a second encapsulation layer,
the second encapsulation layer is between the patterned cathode layer and the overlaying portion of the first encapsulation layer, and
the second encapsulation layer is patterned into second encapsulation segments that correspond to the plurality of cathode layer segments.

12. The method of claim 8, wherein the touch screen further comprises:
an organic light emitting diode (OLED) layer between the patterned cathode layer and the substrate, the OLED layer including a plurality of patterned OLED pixels at locations different from the location of the first via and the location of the second via.

13. The method of claim 12, wherein:
during a touch phase of operation of the touch screen, the patterned cathode layer is used to sense a touch at the touch screen, and
during a display phase of operation of the touch screen, the patterned cathode layer is used to display an image using the plurality of patterned OLED pixels.

14. The method of claim 8, wherein:
the first cathode layer segment and the second cathode layer segment are parts of one of a drive line or a sense line, and
the third cathode layer segment is part of the other of the drive line and the sense line.

* * * * *